United States Patent
Asami et al.

(10) Patent No.: US 8,772,770 B2
(45) Date of Patent: Jul. 8, 2014

(54) P-TYPE SEMICONDUCTOR MATERIAL AND SEMICONDUCTOR DEVICE

(71) Applicant: Semiconductor Energy Laboratory Co., Ltd., Kanagawa-ken (JP)

(72) Inventors: Yoshinobu Asami, Kanagawa (JP); Riho Kataishi, Kanagawa (JP); Erumu Kikuchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/768,233

(22) Filed: Feb. 15, 2013

(65) Prior Publication Data

US 2013/0214271 A1 Aug. 22, 2013

(30) Foreign Application Priority Data

Feb. 17, 2012 (JP) ................. 2012-032644
Feb. 17, 2012 (JP) ................. 2012-032659
Apr. 13, 2012 (JP) ................. 2012-092002

(51) Int. Cl.
*H01L 29/10* (2006.01)

(52) U.S. Cl.
USPC .............. 257/43; 257/21; 257/40; 257/83; 257/94; 257/98

(58) Field of Classification Search
CPC ............. H01L 25/045; H01L 27/1422; H01L 27/3227; H01L 31/02008; H01L 31/042
See application file for complete search history.

(56) References Cited

U.S. PATENT DOCUMENTS

| | | | |
|---|---|---|---|
| 6,534,704 B2 | 3/2003 | Hashimoto et al. | |
| 7,674,647 B2 | 3/2010 | Arai | |
| 7,674,650 B2 | 3/2010 | Akimoto et al. | |
| 7,759,693 B2 * | 7/2010 | Katoda ........................ | 257/103 |
| 7,871,849 B2 | 1/2011 | Arai | |
| 7,989,694 B2 | 8/2011 | Iwaki | |
| 2005/0284518 A1 | 12/2005 | Yamada et al. | |
| 2007/0277874 A1 | 12/2007 | Dawson-Elli et al. | |
| 2007/0277875 A1 | 12/2007 | Gadkaree et al. | |
| 2009/0139558 A1 | 6/2009 | Yamazaki et al. | |
| 2009/0165854 A1 | 7/2009 | Yamazaki et al. | |
| 2011/0308582 A1 | 12/2011 | Kataishi et al. | |

(Continued)

FOREIGN PATENT DOCUMENTS

| | | |
|---|---|---|
| JP | 4-130671 | 5/1992 |
| JP | 7-130661 | 5/1995 |

(Continued)

OTHER PUBLICATIONS

Franz, S. et al., "Heterojunction Solar Cells of $SnO_2/Si$," Journal of Electronic Materials, vol. 6, No. 2, 1977, pp. 107-123.

(Continued)

*Primary Examiner* — Kyoung Lee
(74) *Attorney, Agent, or Firm* — Husch Blackwell LLP

(57) ABSTRACT

An oxide semiconductor material having p-type conductivity and a semiconductor device using the oxide semiconductor material are provided. The oxide semiconductor material having p-type conductivity can be provided using a molybdenum oxide material containing molybdenum oxide ($MoO_y$, (2<y<3)) having an intermediate composition between molybdenum dioxide and molybdenum trioxide. For example, a semiconductor device is formed using a molybdenum oxide material containing molybdenum trioxide ($MoO_3$) as its main component and $MoO_y$ (2<y<3) at 4% or more.

16 Claims, 33 Drawing Sheets

(56) References Cited

U.S. PATENT DOCUMENTS

| | | |
|---|---|---|
| 2011/0308589 A1 | 12/2011 | Kataishi et al. |
| 2012/0211065 A1 | 8/2012 | Yamazaki et al. |
| 2012/0211067 A1 | 8/2012 | Yamazaki et al. |
| 2012/0211081 A1 | 8/2012 | Yamazaki et al. |
| 2012/0234392 A1 | 9/2012 | Asami et al. |
| 2013/0020568 A1 | 1/2013 | Yamazaki |
| 2013/0056715 A1 | 3/2013 | Asami et al. |

FOREIGN PATENT DOCUMENTS

| | | |
|---|---|---|
| JP | 10-135497 | 5/1998 |
| JP | 2004-214300 | 7/2004 |
| JP | 2004-342678 | 12/2004 |
| JP | 2005-109360 | 4/2005 |
| JP | 2007-96055 | 4/2007 |
| JP | 2007-123861 | 5/2007 |

OTHER PUBLICATIONS

Shewchun, J. et al., "The Operation of the Semiconductor-Insulator-Semiconductor Solar Cell: Experiment," Journal of Applied Physics, vol. 50, No. 4, Apr. 1, 1979, pp. 2832-2839.

Osterwald, C. et al., "Molybdenum Trioxide ($MoO_3$)/Silicon Photodiodes," Applied Physics Letters, vol. 35, No. 10, Nov. 15, 1979, pp. 775-776.

Kanai, K. et al., "Electronic Structure of Anode Interface with Molybdenum Oxide Buffer Layer," Organic Electronics (Elsevier publisher), vol. 11, No. 2, 2010, pp. 188-194.

Park, S. II et al., "Towards a High Efficiency Amorphous Silicon Solar Cell Using Molybdenum Oxide as a Window Layer Instead of Conventional p-type Amorphous Silicon Carbide," Applied Physics Letters, vol. 99, No. 6, Aug. 8, 2011, pp. 063504-01-063504-3.

* cited by examiner

P-TYPE SEMICONDUCTOR MATERIAL AND SEMICONDUCTOR DEVICE

BACKGROUND OF THE INVENTION

1. Field of the Invention

The present invention relates to an object, a method, a method for producing an object, a process, a machine, manufacture, or a composition of matter. In particular, the present invention relates to, for example, a semiconductor device, a display device, a light-emitting device, a driving method thereof, or a manufacturing method thereof. More particularly, the present invention relates to, for example, a semiconductor material and a semiconductor device using the semiconductor material.

In this specification, a "semiconductor device" generally refers to a device which can function by utilizing semiconductor characteristics; a transistor, a diode, a photoelectric conversion device, an electro-optical device, a light-emitting display device, a memory device, an imaging device, a semiconductor circuit, and an electronic device are all included in the category of the semiconductor device.

2. Description of the Related Art

Attention has been focused on a technique for forming a photoelectric conversion device and a transistor using semiconductor thin films. The transistor is applied to a wide range of semiconductor electronic devices such as an integrated circuit (IC) and an image display device (also simply referred to as a display device). A silicon-based semiconductor material is widely known as a material for a semiconductor thin film applicable to a photoelectric conversion device and a transistor. As another material, an oxide semiconductor has attracted attention.

For example, a technique in which a transistor is manufactured using a Zn—O-based oxide or an In—Ga—Zn—O-based oxide as an oxide semiconductor is disclosed (see Patent Documents 1 and 2).

It is known that many oxide semiconductors have n-type conductivity. Examples of oxide semiconductors having n-type conductivity include materials such as ZnO, $In_2O_3$, $SnO_2$, GaO, TeO, $GeO_2$, $WO_3$, and $MoO_3$.

On the other hand, as oxide semiconductors having p-type conductivity, materials such as ZnO, $CuAlO_2$, NiO, and IrO are known.

Further, a photoelectric conversion device that generates power without carbon dioxide emissions and that does not generate any harmful emissions has attracted attention as a countermeasure against global warming. As a typical example of the photoelectric conversion device, a silicon (Si) solar cell which uses single crystal silicon, polycrystalline silicon, or the like has been known, and has been actively researched and developed.

In a solar cell using a silicon substrate, a structure having a p-n homojunction is widely used. Such a structure is formed by diffusion of impurities having a conductivity type opposite to that of the silicon substrate into one surface of the silicon substrate.

On the other hand, in order to improve output voltage in power generation, a structure of a solar cell having a p-n heterojunction in which a wide-gap semiconductor material provided as a window layer and a silicon substrate of a photoelectric conversion layer are combined is known (see Non-Patent Document 1). The p-n heterojunction is formed by formation of a wide-gap semiconductor having a different band gap and conductivity type from those of the silicon substrate on one surface of the silicon substrate.

Further, a structure of a silicon solar cell having a semiconductor-insulator-semiconductor (SIS) structure in which a p-n heterojunction is formed with a thin insulating film provided therebetween is known (see Non-Patent Document 2).

REFERENCE

Patent Documents

[Patent Document 1] Japanese Published Patent Application No. 2007-123861
[Patent Document 2] Japanese Published Patent Application No. 2007-096055

Non-Patent Documents

[Non-Patent Document 1]
C. Osterwald, G. Cheek, and J. B. DuBow, V. R. Pai Vemerker, "Molybdenum Trioxide($MoO_3$)/Silicon Photodiodes", Appl. Phys. Lett., Vol. 35, No. 10, 15 Nov. 1979
[Non-Patent Document 2]
J. Shewchun, J. Dubow, C. W. Wilmsen, R. Singh, D. Burk, J. F. Wager, "The Operation of The Semiconductor-Insulator-Semiconductor Solar Cell: Experiment", J. Appl. Phys., Vol. 50, No. 4, April 1979

SUMMARY OF THE INVENTION

As described above, most of oxide semiconductor materials are materials having n-type conductivity, and there are very few oxide semiconductor materials which are known to have p-type conductivity or both n-type and p-type conductivity. Since oxide semiconductor materials are generally wide-gap semiconductor materials and have optical characteristics and electric characteristics which are different from those of silicon-based semiconductor materials, novel p-type oxide semiconductor materials are required so as to form a semiconductor device utilizing the characteristics of the oxide semiconductor materials.

Further, in the structure of the photoelectric conversion device having a p-n heterojunction, output voltage in power generation can be improved theoretically by combination of a wide-gap semiconductor material provided as a window layer and a silicon substrate of a photoelectric conversion layer. Further, as an optical band gap of the wide-gap semiconductor material provided as a window layer is larger, light absorption loss in the window layer can be reduced; thus, output current in power generation can be high.

However, actually in the case of a heterojunction, because materials with different band gaps are bonded to each other, a potential barrier may be formed on both the conduction band side and the valence band side due to a wide-gap semiconductor. Accordingly, a p-n junction is not formed without a potential barrier in conduction of photocarriers in some cases. In that case, the conduction of photocarriers is blocked by the barrier, so that there is a difficulty in taking the photocarriers out; thus, output current is reduced by contraries. Thus, there is a problem in that the output current in power generation cannot be obtained as high as the theoretical value even in the case where light absorption loss is reduced. Further, it has been difficult to obtain output voltage in power generation as high as the theoretical value because as in terms of manufacturing steps, it has been difficult to form a preferable p-n heterojunction interface and carriers are easily recombined at a junction interface.

Furthermore, in the structure of the photoelectric conversion device having a p-n heterojunction in which a wide-gap semiconductor material and a silicon semiconductor material are combined, the wide-gap semiconductor material having p-type conductivity generally has a larger band gap or a higher work function than the silicon semiconductor material having n-type conductivity; thus, a high potential barrier can be formed on the conduction band side. With this potential barrier, a high built-in potential is obtained and diffusion current or thermal release current due to electrons can be suppressed. On the other hand, a potential barrier for holes is the same as that in a p-n homojunction; thus, the diffusion current due to holes are almost the same as that in the p-n homojunction.

By the control of diode current of diffusion current or thermal release current due to electrons and diffusion current due to holes, open-circuit voltage that is generally high can be obtained if photocurrent is constant, and conversion efficiency can be improved.

Thus, an object of one embodiment of the present invention is to provide an oxide semiconductor material having p-type conductivity. Alternatively, it is an object of the present invention to provide a semiconductor device using the oxide semiconductor material. Further alternatively, it is an object of the present invention to provide a semiconductor device with low light absorption loss in a window layer and favorable carrier extraction of photocurrent. Further alternatively, it is an object of the present invention to provide a semiconductor device which has a favorable p-n heterojunction interface and in which carrier recombination at the p-n heterojunction interface is suppressed. Further alternatively, it is an object of the present invention to provide a semiconductor device in which diode current of diffusion current or thermal release current due to electrons and diffusion current due to holes is suppressed and open-circuit voltage and conversion efficiency are improved.

Note that the description of these objects does not impede the existence of other objects. Note that in one embodiment of the present invention, there is no need to achieve all the objects. Other objects will be apparent from and can be derived from the description of the specification, the drawings, the claims, and the like.

One embodiment of the present invention disclosed in this specification relates to a p-type semiconductor material, and a semiconductor device including the p-type semiconductor material.

One embodiment of the present invention disclosed in this specification is a p-type semiconductor material in which molybdenum trioxide and molybdenum oxide ($MoO_y$, ($2<y<3$)) having an intermediate composition between molybdenum dioxide and molybdenum trioxide and are mixed.

In the p-type semiconductor material, the proportion of molybdenum oxide ($MoO_y$ ($2<y<3$)) having an intermediate composition between molybdenum dioxide and molybdenum trioxide is preferably 4% or more.

One embodiment of the invention disclosed in this specification is a semiconductor device including, between a pair of electrodes, a silicon substrate having n-type conductivity; an oxide semiconductor layer having p-type conductivity over one surface of the silicon substrate; a light-transmitting conductive film on the oxide semiconductor layer; an impurity region having n-type conductivity and having a higher carrier concentration than the silicon substrate, over the other surface of the silicon substrate. The oxide semiconductor layer is a molybdenum oxide film containing molybdenum oxide ($MoO_y$, ($2<y<3$)) having an intermediate composition between molybdenum dioxide and molybdenum trioxide.

An insulating layer having an opening may be formed between the impurity region and one of the electrodes, and the impurity region and the electrode may be in contact with each other in the opening.

Further, a silicon oxide layer may be formed between the silicon substrate and the oxide semiconductor layer.

One embodiment of the invention disclosed in this specification is a semiconductor device including, between a pair of electrodes, a silicon substrate having n-type conductivity; a first silicon semiconductor layer having i-type or p-type conductivity over one surface of the silicon substrate; an oxide semiconductor layer having p-type conductivity over the first silicon semiconductor layer; a light-transmitting conductive film over the oxide semiconductor layer; a second silicon semiconductor layer having i-type or n-type conductivity over the other surface of the silicon substrate; and a third silicon semiconductor layer having n-type conductivity over the second silicon semiconductor layer. The oxide semiconductor layer is a molybdenum oxide film containing molybdenum oxide ($MoO_y$, ($2<y<3$)) having an intermediate composition between molybdenum dioxide and molybdenum trioxide.

It is to be noted that the ordinal numbers such as "first" and "second" in this specification, etc. are assigned in order to avoid confusion among components, but not intended to limit the number or order of the components.

The second silicon semiconductor layer preferably has a lower carrier concentration than the silicon substrate, and the third silicon semiconductor layer preferably has a higher carrier concentration than the silicon substrate.

Further, the oxide semiconductor layer preferably has a higher carrier concentration than the first silicon semiconductor layer.

In the above structure of the semiconductor device, a silicon oxide layer may be formed between the first silicon semiconductor layer and the oxide semiconductor layer.

In the above structure of the semiconductor device, a structure in which the first silicon semiconductor layer is not provided may be used. Further, in the above structure of the semiconductor device, a silicon oxide layer may be formed between the silicon substrate and the oxide semiconductor layer.

Further, the oxide semiconductor layer is preferably a molybdenum oxide film containing molybdenum trioxide.

Furthermore, the oxide semiconductor layer is preferably a molybdenum oxide film in which the proportion of molybdenum oxide ($MoO_y$, ($2<y<3$)) having an intermediate composition between molybdenum dioxide and molybdenum trioxide is 4% or more.

One embodiment of the invention disclosed in this specification is a semiconductor device including a silicon substrate having n-type conductivity; an oxide semiconductor layer having a higher work function than the silicon substrate and having p-type conductivity, over one surface of the silicon substrate; a light-transmitting conductive film over the oxide semiconductor layer; a first electrode over the light-transmitting conductive film; and a second electrode over the other surface of the silicon substrate. The second electrode is formed of a material having a lower work function than the silicon substrate.

One embodiment of the invention disclosed in this specification is a semiconductor device including a silicon substrate having n-type conductivity; an oxide semiconductor layer having a higher work function than the silicon substrate and having p-type conductivity, over one surface of the silicon substrate; a light-transmitting conductive film over the oxide semiconductor layer; a first electrode over the light-transmitting conductive film; a second silicon semiconductor layer having i-type or n-type conductivity over the other surface of the silicon substrate; and a second electrode over the second silicon semiconductor layer. The second electrode is formed of a material having a lower work function than the silicon substrate.

In the semiconductor device in which the second electrode is formed of a material having a lower work function than the silicon substrate, a silicon oxide layer may be formed between the silicon substrate and the oxide semiconductor layer.

In the semiconductor device in which the second electrode is formed of a material having a lower work function than the silicon substrate, an insulating layer having an opening may be formed between the silicon substrate and the second electrode, and the silicon substrate and the second electrode may be in contact with each other in the opening.

One embodiment of the invention disclosed in this specification is a semiconductor device including a silicon substrate having n-type conductivity; a first silicon semiconductor layer having i-type or p-type conductivity over one surface of the silicon substrate; an oxide semiconductor layer having a higher work function than the silicon substrate and having p-type conductivity, over the first silicon semiconductor layer; a light-transmitting conductive film over the oxide semiconductor layer; a first electrode over the light-transmitting conductive film; a second silicon semiconductor layer having i-type or n-type conductivity over the other surface of the silicon substrate; and a second electrode over the second silicon semiconductor layer. The second electrode is formed of a material having a lower work function than the silicon substrate.

A silicon oxide layer may be formed between the first silicon semiconductor layer and the oxide semiconductor layer.

The first silicon semiconductor layer and the second silicon semiconductor layer each preferably have a lower carrier concentration than the silicon substrate.

In the semiconductor device in which the second electrode is formed of a material having a lower work function than the silicon substrate, the oxide semiconductor layer is preferably a molybdenum oxide film including molybdenum oxide ($MoO_y$, ($2<y<3$)) having an intermediate composition between molybdenum dioxide and molybdenum trioxide.

In the semiconductor device in which the second electrode is formed of a material having a lower work function than the silicon substrate, the second electrode is preferably formed of a material whose work function is 4.2 eV or lower.

In the semiconductor device in which the second electrode is formed of a material having a lower work function than the silicon substrate, the second electrode preferably contains one or more materials selected from Mg, MgO, MgAg, MgIn, AlLi, BaO, SrO, CaO, GdB, $YB_6$, $LaB_6$, Y, Hf, Nd, La, Ce, Sm, Ca, and Gd.

Further, the use of the oxide semiconductor layer enables a semiconductor device having optical characteristics and/or electric characteristics which are different from the case of using a silicon-based semiconductor material to be formed.

According to one embodiment of the present invention, an oxide semiconductor material having p-type conductivity can be provided. Alternatively, a semiconductor device using the oxide semiconductor material can be provided. Examples of the semiconductor device include a transistor, a diode, a photoelectric conversion device, an electro-optical device, a light-emitting display device, a memory device, an imaging device, a semiconductor circuit, and an electronic device. Alternatively, a semiconductor device with low light absorption loss in a window layer and favorable carrier extraction of photocurrent can be provided. Further alternatively, a semiconductor device which has a favorable p-n heterojunction interface and in which carrier recombination at the p-n heterojunction interface is suppressed can be provided. Further alternatively, a semiconductor device in which diode current of diffusion current or thermal release current due to electrons and diffusion current due to holes is suppressed and open-circuit voltage and conversion efficiency are improved can be provided.

DETAILED DESCRIPTION OF THE INVENTION

Figure 1:
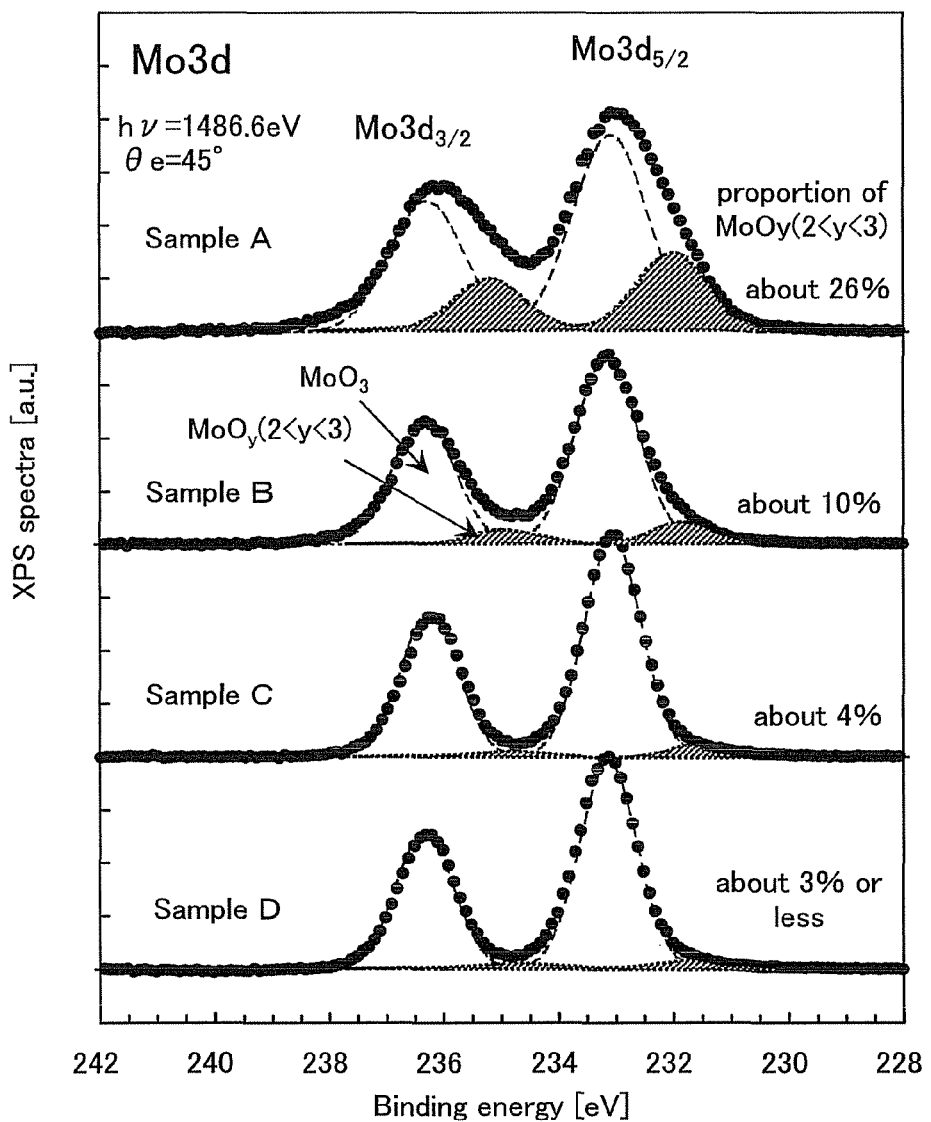
FIG. 1 shows XPS spectra in the vicinity of Mo3d core levels in molybdenum oxide.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. Note that in all drawings used to illustrate the embodiments, portions that are identical or portions having similar functions are denoted by the same reference numerals, and their repetitive description may be omitted.

Embodiment 1

In this embodiment, an oxide semiconductor material that is one embodiment of the disclosed invention is described with reference to FIG. 1, FIG. 2, FIG. 3, and FIG. 5.

As the oxide semiconductor material of one embodiment of the present invention, molybdenum oxide can be used. Molybdenum oxide is preferable since it is stable even in air, has a low hygroscopic property, and is easily treated. Further, oxides of metals that belong to Group 4 to Group 8 of the periodic table can also be used. Specific examples thereof include vanadium oxide, niobium oxide, tantalum oxide, chromium oxide, tungsten oxide, manganese oxide, and rhenium oxide.

As molybdenum oxide of the oxide semiconductor material, a material (hereinafter referred to as $MoO_3+MoO_y$ ($2<y<3$)) in which molybdenum trioxide (hereinafter referred to as $MoO_3$) and molybdenum oxide (hereinafter referred to as $MoO_y$ ($2<y<3$)) having an intermediate composition between molybdenum dioxide and molybdenum trioxide are mixed is preferably used.

The conductivity of $MoO_3+MoO_y$ ($2<y<3$) can be p-type conductivity. To obtain a p-type semiconductor material having a high carrier concentration, the proportion of $MoO_y$ ($2<y<3$) in the composition of $MoO_3+MoO_y$ ($2<y<3$) is preferably set to 4% or more.

Note that the material having p-type conductivity in this specification includes a material in which the Fermi level is closer to the valence band than to the conduction band, and a material in which holes that are p-type carriers can be transferred, and a material in which current-voltage (I-V) characteristics exhibit rectifying properties by band bending due to difference in work functions caused when the material having p-type conductivity is bonded to a material having n-type conductivity.

Examples of the above-described $MoO_y$ ($2<y<3$) include $Mo_2O_5$, $Mo_3O_8$, $Mo_8O_{23}$, $Mo_9O_{26}$, $Mo_4O_{11}$, $Mo_{17}O_{47}$, $Mo_5O_{14}$, and the one which has an intermediate composition between $MoO_2$ and $MoO_3$ due to a deficiency of a part of oxygen atoms in $MoO_3$.

A $MoO_3+MoO_y$ ($2<y<3$) film can be formed by a vapor phase method such as an evaporation method, a sputtering method, or an ion plating method. As an evaporation method, a method in which a material of molybdenum oxide alone is evaporated, or a method in which a material of molybdenum oxide and an impurity imparting conductivity type are co-evaporated may be used. Note that the co-evaporation refers to an evaporation method in which evaporation is carried out from a plurality of evaporation sources at the same time in one treatment chamber. In a sputtering method, molybdenum oxide, molybdenum, or any of the above materials which contains an impurity imparting a conductivity type may be used as a target, and oxygen or a mixed gas of oxygen and a rare gas such as argon may be used as a sputtering gas. As an ion plating method, a film may be formed in plasma containing oxygen using a material similar to the material used in the sputtering method described above.

In this embodiment, a method in which a material of molybdenum oxide alone is evaporated is used so as to form the $MoO_3+MoO_y$ ($2<y<3$) film having p-type conductivity. As an evaporation source, powder of molybdenum oxide can be used.

The purity of the powder of molybdenum oxide is preferably 99.99% (4N) to 99.9999% (6N). The evaporation is preferably performed in a high vacuum of $5\times10^{-3}$ Pa or less, preferably $1\times10^{-4}$ Pa or less.

For example, when molybdenum trioxide powder (4N MOO03PB) manufactured by Kojundo Chemical Laboratory Co., Ltd. is put in a tungsten boat (BB-3) manufactured by Furuuchi Chemical Corporation, and resistance-heating evaporation is performed on a silicon substrate at a deposition rate of 0.2 nm/s in a vacuum of less than or equal to $1\times10^{-4}$ Pa, a $MoO_3+MoO_y$ ($2<y<3$) film having p-type conductivity, which has a mixed composition including $MoO_3$ at about 90% and $MoO_y$ ($2<y<3$) at about 10% can be obtained. Note that the electric conductivity, the refractive index, the extinction coefficient, the optical band gap obtained from a Tauc plot, and the ionization potential of the film are $1\times10^{-6}$ S/cm to $3.8\times10^{-3}$ S/cm (dark conductivity), 1.6 to 2.2 (a wavelength: 550 nm), $6\times10^{-4}$ to $3\times10^{-3}$ (a wavelength: 550 nm), 2.8 eV to 3 eV, and about 6.4 eV, respectively.

Further, the $MoO_3+MoO_y$ ($2<y<3$) film has a high passivation effect and can reduce defects on a surface of silicon, whereby the lifetime of carriers can be improved.

For example, in the case where the $MoO_3+MoO_y$ ($2<y<3$) film is formed as a passivation film over both surfaces of an n-type single crystal silicon substrate having a resistivity of approximately 9 Ω·cm, it has been confirmed that the effective lifetime at this time is about 400 μsec by a microwave detected photoconductivity decay (μ-PCD) method. Further, the lifetime of the n-type single crystal silicon substrate, on which chemical passivation using an alcoholic iodine solution has been performed, which is the bulk lifetime of the single crystal silicon substrate, is also about 400 msec. Note that the effective lifetime of the n-type single crystal silicon substrate where a passivation film is not formed is about 40 μsec.

Figure 5:
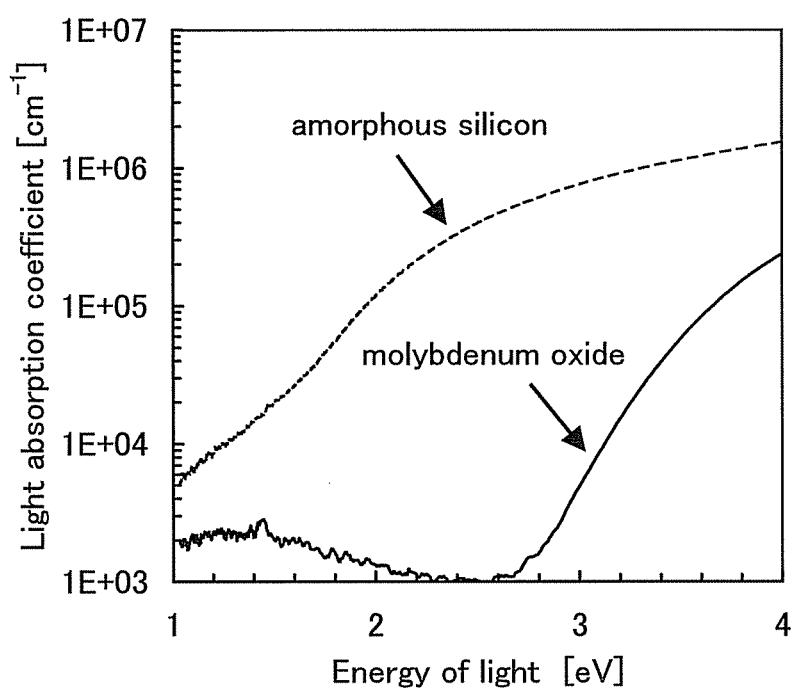
FIG. 5 shows comparison of the absorption coefficients between a molybdenum oxide film and an amorphous silicon film.

In FIG. 5, the light absorption coefficient of the $MoO_3+MoO_y$ ($2<y<3$) film formed over a glass substrate by the above evaporation method is compared with that of an amorphous silicon film formed by a plasma CVD method, which is a comparative example. The light absorption coefficient of the $MoO_3+MoO_y$ ($2<y<3$) film is small in a wide wavelength range, and thus it is found that the $MoO_3+MoO_y$ ($2<y<3$) film has a high light-transmitting property.

The ratio of $MoO_3$ to $MoO_y$ ($2<y<3$) in $MoO_3+MoO_y$ ($2<y<3$) is found out, for example, by examining Mo3d core levels by X-ray photoelectron spectroscopy (XPS). Here, the ratio means the ratio of Mo elements having a $MoO_3$ bond to Mo elements having a $MoO_y$ ($2<y<3$) bond.

FIG. 1 shows XPS spectra in the vicinity of Mo3d core levels of samples A to D in which molybdenum oxide films with different deposition conditions are individually formed over silicon substrates, which are measured with incident energy of 1486.6 eV (an X-ray source: monochromatic Al X-ray) and an extraction angle of 45°.

It is known that the peak position in binding energy of $Mo3d_{5/2}$ core levels in molybdenum is about 227.9 eV, that in molybdenum dioxide ($MoO_2$) is about 229.6 eV, and that in molybdenum trioxide ($MoO_3$) is about 232.8 eV. Thus, the composition of the molybdenum oxide film can be specified by the peak position (chemical shift) of $Mo3d_{5/2}$ core levels with XPS.

In the XPS spectra of all the samples shown in FIG. 1, the $Mo3d_{5/2}$ peak positions are located around 232.8 eV; accordingly, it is found that the main component of the samples is molybdenum trioxide ($MoO_3$).

Further, from the XPS peak shapes, it is found that components other than molybdenum trioxide ($MoO_3$) are contained in the molybdenum oxide films of the samples. It is turned out by peak separation in the spectrum of each sample that a component of molybdenum oxide ($MoO_y$ ($2<y<3$)) having an intermediate composition between molybdenum dioxide and molybdenum trioxide is contained. Note that each of the molybdenum oxide films hardly contain a component of molybdenum dioxide ($MoO_2$), which is about 1% or less.

The XPS peak intensity is proportional to the composition and an element density. Thus, the ratio of $MoO_3$ to $MoO_y$ ($2<y<3$) in the molybdenum oxide film can be specified by examining the ratio of the integrated value of the peak exhibiting a $MoO_3$ component to the integrated value of the peak exhibiting a $MoO_y$ ($2<y<3$) component. The proportion of $MoO_y$ ($2<y<3$) observed from the XPS spectrum of sample A is about 26%; that of sample B is about 10%; that of sample C is about 4%; and that of sample D is about 3% or less.

Figure 2:
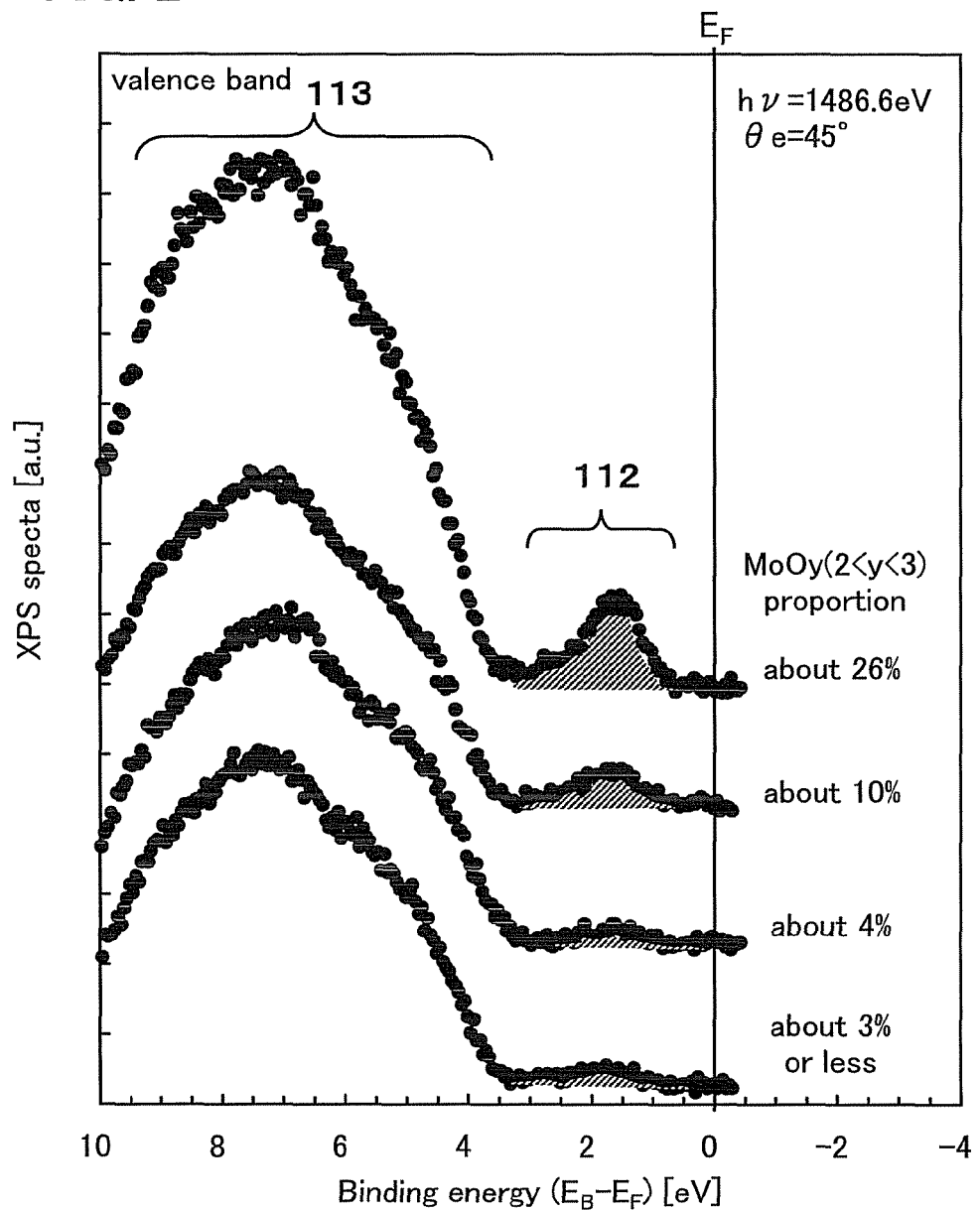
FIG. 2 shows XPS spectra in the vicinity of the valence band in molybdenum oxide.

The molybdenum oxide film has p-type conductivity by the molybdenum oxide ($MoO_y$ ($2<y<3$)) having an intermediate composition between molybdenum dioxide and molybdenum trioxide. FIG. 2 shows the states of samples A to D in the valence bands measured by XPS. The XPS spectra in FIG. 2 are spectra in the vicinity of the valence band, which are measured with incident energy of 1486.6 eV (an X-ray source: monochromatic Al X-ray) and an extraction angle of 45°. Note that the binding energy is energy based on the Fermi level ($E_F$). Note that a general correction method by which a C1s peak is adjusted to 284.6 eV is used as the energy axis.

The XPS spectra of the valence band each include peak intensity proportional to the state density of the valence band. The peak 112 around the binding energy of 1.7 eV shown in FIG. 2 is a peak of a gap level. Further, the peak 113 at the binding energy of 3.5 eV or more is a peak of a bulk in which $MoO_3$ is a main component.

FIG. 2 shows that the peak intensity of the gap level increases as the proportion of $MoO_y$ ($2<y<3$) in the molybdenum oxide film increases. Further, it can be seen that as the ratio of $MoO_y$ ($2<y<3$) is higher, energy at an energy band constituted by gap levels and energy at the Fermi level ($E_F$) are closer to each other; thus, p-type conductivity is more likely to be obtained.

It can be said that the gap levels are filled with electrons since they are observed by XPS. The conduction band not shown in FIG. 2 is not observed by XPS because it is not filled with electrons. However, the Fermi level ($E_F$) exists between the conduction band and the gap levels filled with electrons. If the same number of carriers are excited in the conduction band and the gap levels filled with electrons thermally or in the equilibrium state under irradiation with light, it can be said that the Fermi level ($E_F$) is getting closer to the gap level side because the state density in the conduction band that is a bulk level is higher than that in the gap level. Further, the gap levels have a higher state density as can be observed by XPS. The gap levels act as one of energy bands of the conduction band to which holes are transferred, whereby p-type conductivity can be obtained. Thus, the molybdenum oxide film containing $MoO_y$ ($2<y<3$) which contributes to an increase in the state density in the gap levels can have p-type conductivity.

The following can be given as another reason that molybdenum oxide has p-type conductivity. For example, as for a molybdenum oxide film in which the proportion of $MoO_y$ ($2<y<3$) is about 10% or more, the energy difference between the energy ($E_q$) that is energy on the top of the valence band of the peak 112 and the Fermi level ($E_F$) in FIG. 2 showing the valence band XPS spectrum is about 0.3 eV to 0.7 eV. In addition, activation energy corresponding to energy difference between the energy ($E_v$) that is energy on the top of the valence band obtained from electric conductivity with respect to a temperature change and the Fermi level ($E_F$), is about 0.41 eV corresponding to the value obtained from the XPS spectrum. The optical band gap of the molybdenum oxide film is about 3.2 eV; thus, the energy difference between the midgap ($E_i$) that is half of the optical band gap and the Fermi level ($E_F$) is about 1.6 eV. Further, the energy difference between the top of the valence band ($E_v$) and the Fermi level ($E_F$) is about 0.3 eV to 0.7 eV, and the energy difference between the top of the valence band ($E_v$) and the Fermi level ($E_F$) is smaller. Thus it can be said that the molybdenum oxide film has p-type conductivity. Note that the molybdenum oxide film has a state density as high as that can be observed by XPS whose detection sensitivity is a percent level. The optical band gap can be measured by optical transition of an energy in the vicinity of the top of the valence band of the peak 112.

Figure 3:
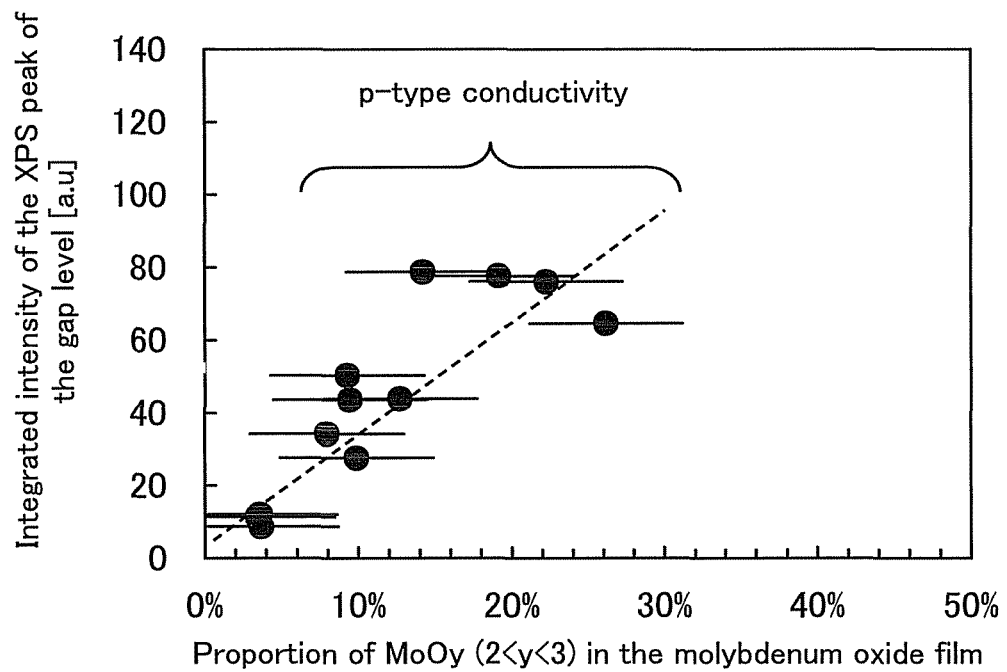
FIG. 3 is a correlation diagram of a composition of molybdenum oxide and a gap level.

FIG. 3 is a correlation diagram between the proportion of $MoO_y$ ($2<y<3$) in the molybdenum oxide film shown in FIG. 1 and the integrated intensity of the XPS peak of the gap level in the vicinity of the binding energy of 1.7 eV in the valence band shown in FIG. 2. Further, it is found from verification tests for rectifying properties of an element that the proportion of $MoO_y$ ($2<y<3$) is preferably 4% or more so that the molybdenum oxide film containing $MoO_3$ and $MoO_y$ ($2<y<3$) has p-type conductivity.

Note that it is known that molybdenum trioxide ($MoO_3$) has n-type conductivity. Thus, not only a semiconductor device using molybdenum oxide having p-type conductivity but also a semiconductor device in which molybdenum oxide having p-type conductivity and molybdenum oxide having n-type conductivity are combined can be formed.

This embodiment can be freely combined with any of the other embodiments and an example.

Embodiment 2

In this embodiment, a structure of a photoelectric conversion device of one embodiment of the disclosed invention and a manufacturing method thereof are described with reference to FIGS. 6A and 6B, FIGS. 7A and 7B, FIGS. 8A to 8C, and FIGS. 9A to 9C.

First, a structure of a photoelectric conversion device that is one embodiment of the present invention is described.

Figure 6A:
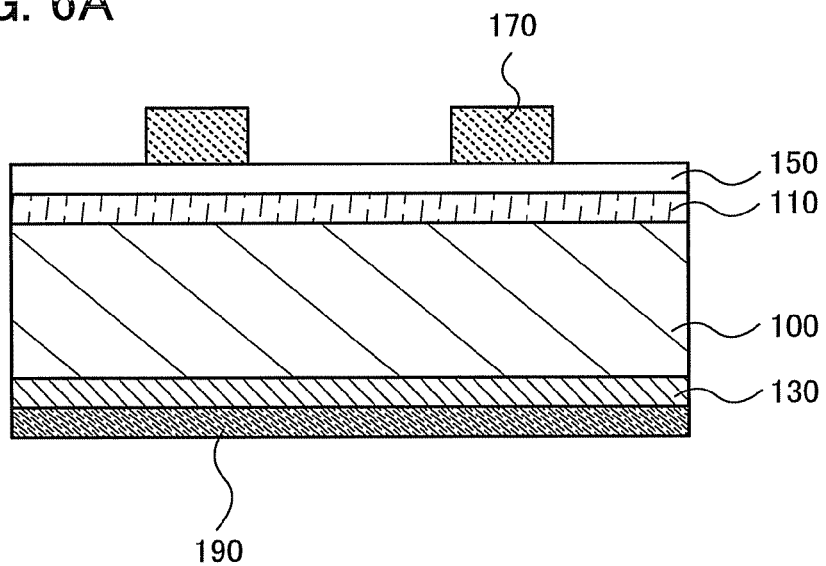
FIGS. 6A and 6B are cross-sectional views each showing a photoelectric conversion device according to one embodiment of the present invention.

FIG. 6A shows an example of a schematic cross-sectional view of the photoelectric conversion device that is one embodiment of the present invention. The photoelectric conversion device includes a silicon substrate 100; an oxide semiconductor layer 110 over one surface of the silicon substrate; an impurity region 130 over the other surface of the silicon substrate; a light-transmitting conductive film 150 over the oxide semiconductor layer 110; a first electrode 170 in contact with the light-transmitting conductive film; and a second electrode 190 in contact with the impurity region 130. Note that the first electrode 170 is a grid electrode, and a surface on the first electrode 170 side serves as a light-receiving surface.

The silicon substrate 100 has one conductivity type, and the oxide semiconductor layer 110 is a semiconductor layer having a conductivity type opposite to that of the silicon substrate 100. Accordingly, a p-n junction is formed between the silicon substrate 100 and the oxide semiconductor layer 110.

Here, in the photoelectric conversion device of one embodiment of the present invention, a semiconductor layer having p-type conductivity is used as the oxide semiconductor layer 110; thus, a silicon substrate having n-type conductivity is used as the silicon substrate 100.

The light-transmitting conductive film 150 is preferably formed over the oxide semiconductor layer 110. The provision of the light-transmitting conductive film 150 enables resistance loss between the oxide semiconductor layer 110 and the first electrode 170 to be reduced. However, in the case where the resistance of the oxide semiconductor layer 110 is sufficiently low or in the case where the manufactured photoelectric conversion device is used for low-current applications which are not affected by the resistance loss, a structure in which the light-transmitting conductive film 150 is not provided as illustrated in FIG. 6B may be employed.

The impurity region 130 is a back surface field (BSF) layer, which has the same conductivity type as the silicon substrate 100 and has a higher carrier concentration than the silicon substrate 100. When the BSF layer is formed, an $n$-$n^+$ junction or a $p$-$p^+$ junction is formed, whereby recombination of minority carriers in the vicinity of the second electrode 190 can be prevented by the potential barrier due to the band bending.

Note that in this specification, in the case where materials which have the same conductivity type and have different carrier concentrations need to be distinguished, the conductivity type of a material having a relatively higher carrier concentration than an n-type or p-type silicon substrate is referred to as $n^+$-type or $p^+$-type, whereas the conductivity type of a material having a relatively lower carrier concentration than an n-type or p-type silicon substrate is referred to as $n^-$-type or $p^-$-type.

Figure 6B:
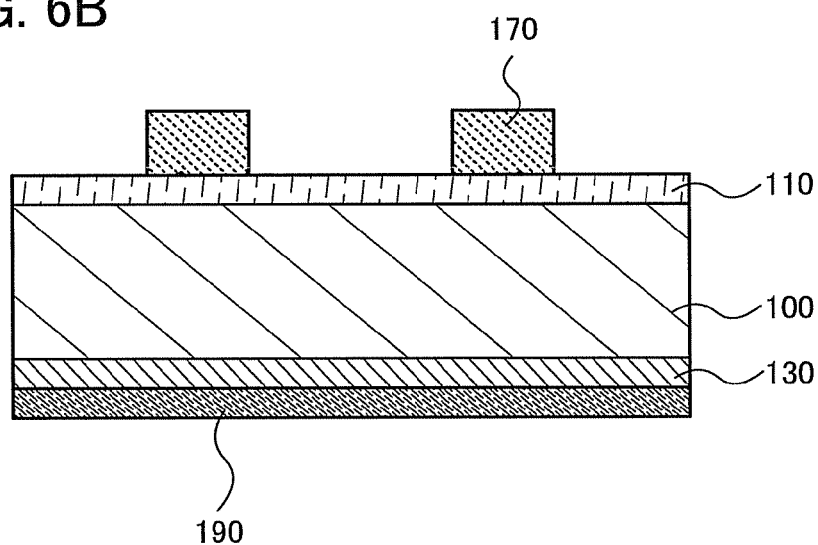
Figure 9A:
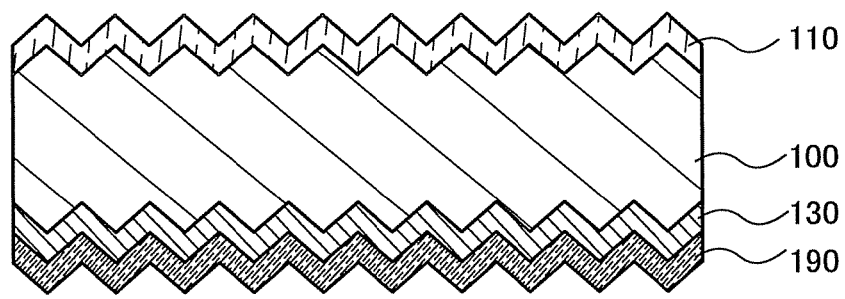
FIGS. 9A to 9C are cross-sectional views showing a method for manufacturing a photoelectric conversion device according to one embodiment of the present invention.
Figure 9B:
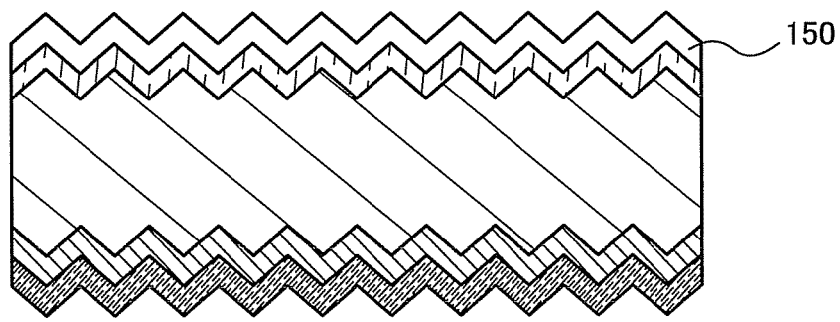
Figure 9C:
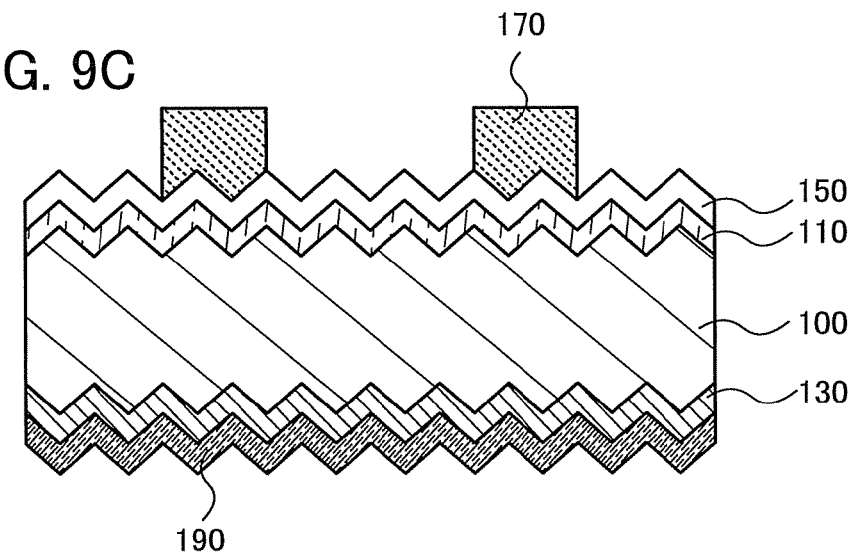

Although not shown in FIGS. 6A and 6B, the silicon substrate 100 may have a texture structure in which the silicon substrate 100 is processed to have unevenness as shown in FIG. 9C. The texture structure provided on the light-receiving surface side can reduce reflection loss at the surface because incident light is reflected in a multiple manner. Further, in the texture structure, light enters a photoelectric conversion region obliquely by the difference in refractive indexes between the silicon substrate that has a high refractive index and that is a photoelectric conversion region and air that has a low refractive index and that is a light incidence medium. Thus, the optical path length is increased and reflection between the front surface and the back surface of the photoelectric conversion region is repeated, whereby a so-called light trapping effect can occur. The light which enters the silicon substrate travels, in accordance with Snell's law, between the air that is a light incidence medium and the silicon substrate having a high refractive index in a direction that is close to the normal direction to the unevenness on the surface of the silicon substrate. Thus, by the texture structure in which the surface of the silicon substrate has various angles with an uneven surface, incident light is refracted in a direction that is close to the normal direction to the surface with the texture structure and the light travels. Accordingly, the incident light travels obliquely to the thickness direction of the silicon substrate and the optical path length can be increased. The texture structure may be provided for both surfaces of the silicon substrate as shown in FIG. 9C, or either the front or back surface of the silicon substrate.

Figure 7A:
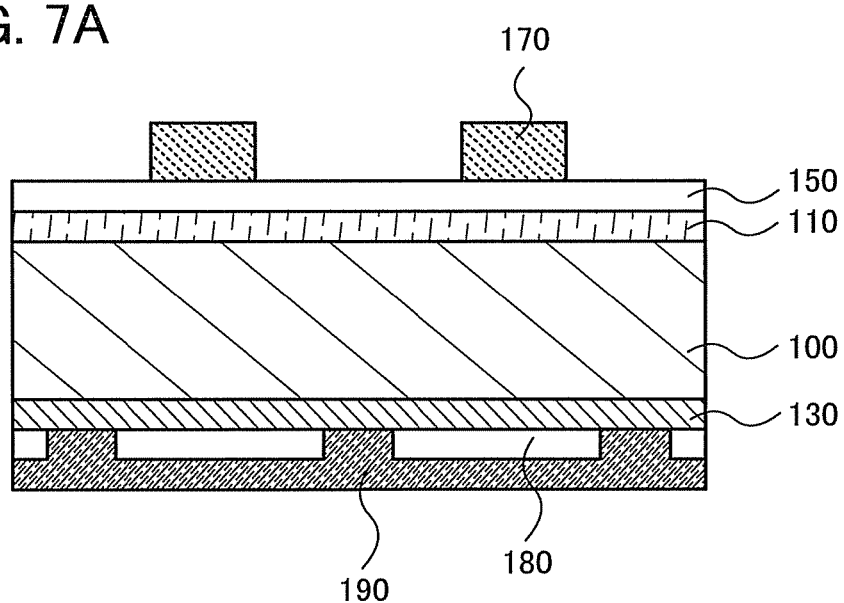
FIGS. 7A and 7B are cross-sectional views each showing a photoelectric conversion device according to one embodiment of the present invention.
Figure 7B:
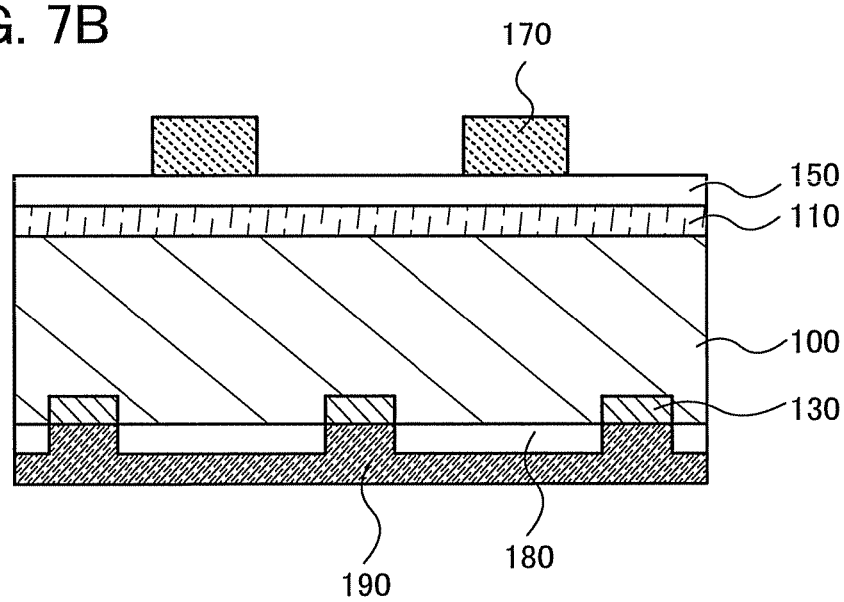

Further, a photoelectric conversion device of one embodiment of the present invention may have the structure shown in FIG. 7A or 7B. The photoelectric conversion devices shown in FIGS. 7A and 7B each include the silicon substrate 100 having one conductivity type, and further includes, over one surface of the silicon substrate 100, the oxide semiconductor layer 110 having a conductivity type opposite to that of the silicon substrate 100, the light-transmitting conductive film 150 over the oxide semiconductor layer 110, and the first electrode 170 in contact with the light-transmitting conductive film. Furthermore, the photoelectric conversion device includes, over the other surface of the silicon substrate 100, the impurity region 130 having the same conductivity type as the silicon substrate 100 and having a higher carrier concentration than the silicon substrate 100, a passivation layer 180, and the second electrode 190 in contact with the impurity region 130.

The passivation layer 180 can be formed using a silicon oxide film, a silicon nitride film, a silicon nitride oxide ($SiN_xO_y$ ($x>y>0$)) film, a silicon oxynitride ($SiO_xN_y$ ($x>y>0$)) film, an aluminum oxide film, or the like. The provision of the passivation layer 180 enables recombination of minority carriers at the back surface of the silicon substrate 100 to be reduced, which contributes to improvement in output voltage of the photoelectric conversion device in power generation. Further, with the use of a film formed of a material having a lower refractive index than the silicon substrate as the passivation layer 180, reflectance at the back surface of the silicon substrate can be increased, which also contributes to improvement in output current of the photoelectric conversion device in power generation.

The photoelectric conversion device shown in FIG. 7A has a structure in which the impurity region 130 is formed on the entire back surface of the silicon substrate and the impurity region 130 is in contact with the second electrode 190 in openings provided in the passivation layer 180. Further, the photoelectric conversion device shown in FIG. 7B has a structure in which the impurity region 130 is provided only in the vicinity of the openings in the passivation layer 180 and the impurity region 130 is in contact with the second electrode 190 in the openings. By the provision of the passivation layer 180, the minority carrier density can be reduced; on the other hand, the recombination rate at the surface of the impurity region 130 and the passivation layer 180 is increased; that is, there is a trade-off therebetween.

Therefore, in consideration of the quality of the passivation layer 180; that is, in consideration of the surface recombination rate at the interface between the passivation layer 180 and the silicon substrate, a practitioner may determine the structure so as to obtain more favorable electric characteristics. For example, in the case where the quality of the passivation layer 180 is low and the surface recombination rate is high, the impurity region 130 is preferably provided for the entire back surface of the silicon substrate because the minority carrier density itself which causes recombination at the back surface of the silicon substrate can be lowered and occurrence of the recombination at the back surface of the silicon substrate can be suppressed. On the contrary, in the case where the quality of the passivation layer 180 is high and the surface recombination rate is low, the impurity region 130 is preferably provided only for the vicinity of the openings because a contact interface between the impurity region 130 and the passivation layer 180, which is a cause for the low recombination rate, can be reduced and recombination at the entire back surface of the silicon substrate can be suppressed.

Note that the photoelectric conversion device may have a structure in which the structures of FIGS. 6A and 6B and FIGS. 7A and 7B and a texture structure provided with unevenness are combined as appropriate.

For the oxide semiconductor layer 110 in one embodiment of the present invention, molybdenum oxide can be used. Molybdenum oxide is preferable since it is stable in the air, has a low hygroscopic property, and is easily treated.

The conductivity type of the oxide semiconductor layer 110 can be changed by mixing a plurality of oxides. For example, molybdenum oxide is formed to be a mixed composition including molybdenum trioxide ($MoO_3$) and molybdenum oxide ($MoO_y$, $2<y<3$)) having an intermediate composition between molybdenum dioxide and molybdenum trioxide, so that p-type conductivity can be provided. The mixed composition contains $MoO_y$ ($2<y<3$) at 4% or more, so that a p-type semiconductor with a high carrier concentration can be obtained. Note that the term "p-type conductivity" herein means that the Fermi level is closer to the valence band than to the conduction band, holes that are p-type carriers can be transferred, and current-voltage (I-V) characteristics of an element bonded to a semiconductor material having n-type conductivity exhibit rectifying properties by band bending due to the difference in work functions caused when the material having p-type conductivity is bonded to a semiconductor material having n-type conductivity.

Further, an impurity is added to the oxide semiconductor layer, whereby the conductivity type can be changed. Furthermore, even in the case where an impurity is not intentionally added to the oxide semiconductor layer, a defect in the oxide semiconductor layer, and a slight amount of an impurity introduced during the deposition cause the formation of a donor level or an acceptor level in some cases, so that the oxide semiconductor layer exhibits n-type or p-type conductivity in some cases.

Further, as shown in FIG. 5, the light absorption coefficient of the molybdenum oxide film is small in a wide wavelength range; thus, the light-transmitting property is high. Therefore, a metal oxide having a light-transmitting property, e.g., the molybdenum oxide film is used as a window layer of the photoelectric conversion device, whereby light absorption loss in the window layer is reduced and photoelectric conversion can be efficiently performed in a light absorption region. Further, as described above, the metal oxide has extremely a high passivation effect on the silicon surface. Accordingly, the electric characteristics of the photoelectric conversion device can be improved.

Next, methods for manufacturing the photoelectric conversion devices shown in FIGS. 6A and 6B are described with reference to FIGS. 8A to 8C and FIGS. 9A to 9C.

A single crystal silicon substrate or a polycrystalline silicon substrate can be used for the silicon substrate 100 that can be used in one embodiment of the present invention. The method for manufacturing the silicon substrate is not particularly limited. In this embodiment, described is an example in which an n-type single crystal silicon substrate whose surface corresponds to the (100) plane and which is manufactured by a Magnetic Czochralski (MCZ) method is used.

In the case where the initial single crystal silicon substrate is a substrate which is subjected to only a slicing process, a damage layer with a thickness of 10 μm to 20 μm, remaining on the surface of the single crystal silicon substrate, is removed by a wet etching process. For an etchant, an alkaline solution with a relatively high concentration, for example, 10% to 50% sodium hydroxide solution, or 10% to 50% potassium hydroxide solution can be used. Alternatively, a mixed acid in which hydrofluoric acid and nitric acid are mixed, or the mixed acid to which acetic acid is further added may be used.

Next, impurities adhering to the surfaces of the single crystal silicon substrate from which the damage layers have been removed are removed by acid cleaning. As an acid, for example, a mixture (FPM) of 0.5% hydrofluoric acid and 1% hydrogen peroxide, or the like can be used. Alternatively, RCA cleaning or the like may be performed. Note that this acid cleaning may be omitted.

An example of forming a texture structure in which the silicon substrate 100 is processed to have unevenness in order to reduce light loss due to multiple reflection at the surface of the silicon substrate 100 and to trap light for the increase in an optical path length, is described. In the case of using the single crystal silicon substrate having the (100) plane on the surface as described above, a pyramidal textured structure can be formed by anisotropic etching utilizing a difference in etching rates among plane orientations using an alkaline solution.

For the etchant used when the pyramidal textured structure is formed on the single crystal silicon substrate having (100) plane on its surface, an alkaline solution such as a sodium hydroxide solution or a potassium hydroxide solution can be used. For an etchant, 1% to 5% sodium hydroxide solution, or 1% to 5% potassium hydroxide solution can be used, preferably several percent isopropyl alcohol is added thereto. The temperature of the etchant is 70° C. to 90° C., and the single crystal silicon substrate is soaked in the etchant for 30 to 60 minutes. By this treatment, pyramidal unevenness including a plurality of minute projections each having a substantially square pyramidal shape and recessions formed between adjacent projections can be formed on the surfaces of the single crystal silicon substrate.

Note that in the case where a single crystal silicon substrate other than the single crystal silicon substrate having the (100) plane on the surface or a polycrystalline silicon substrate is used as the silicon substrate 100, unevenness may be formed by dry etching, wet etching using a metal catalyst such as silver, or the like.

Next, an oxide layer which is non-uniformly formed on the silicon surface in the etching step for forming the unevenness is removed. Another purpose to remove the oxide layer is to remove a component of the alkaline solution, which is likely to remain in the oxide layer. When an alkali metal ion, e.g., an Na ion or a K ion enters silicon, the lifetime is decreased, and the electric characteristics of the photoelectric conversion device are drastically lowered as a result. Note that in order to remove the oxide layer, 1 to 5% diluted hydrofluoric acid may be used.

Next, the surface of the single crystal silicon substrate is preferably etched with a mixed acid in which hydrofluoric acid and nitric acid are mixed, or the mixed acid to which acetic acid is further added so that impurities such as a metal component are removed from the surface. By adding the acetic acid, oxidizing ability of nitric acid can be kept so as to stably perform the etching, and the etching rate can be adjusted. For example, the volume ratio of hydrofluoric acid, nitric acid, and acetic acid can be 1:1.5 to 3:2 to 4. Note that in this specification, the mixed acid solution containing hydrofluoric acid, nitric acid, and acetic acid is referred to as HF-nitric-acetic acid. Note that in the case where the etching with the HF-nitric-acetic acid is performed, the above step of removing the oxide layer with diluted hydrofluoric acid can be omitted. Though these steps, the texture structure in which unevenness is formed on the surface of the silicon substrate 100 can be formed (see FIG. 8A).

Figure 8A:
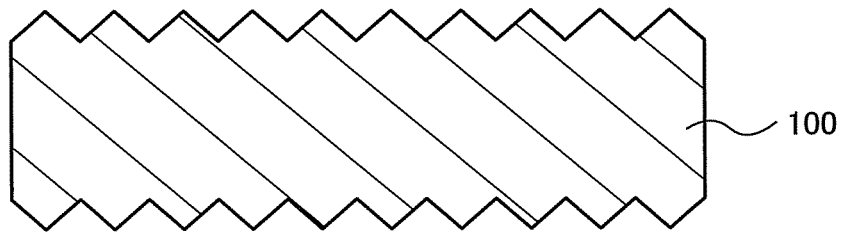
FIGS. 8A to 8C are cross-sectional views showing a method for manufacturing a photoelectric conversion device according to one embodiment of the present invention.
Figure 8B:
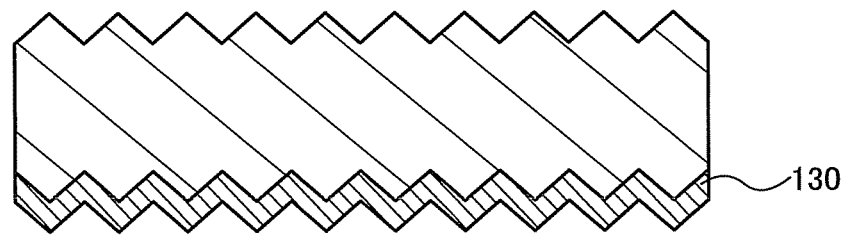

Next, impurities imparting the same conductivity as the silicon substrate 100 are diffused into a surface layer on the back surface of the silicon substrate 100, which is opposite to the light-receiving surface, whereby the impurity region 130 is formed (see FIG. 8B). In the case of using a silicon substrate 100 having n-type conductivity, as an impurity imparting n-type conductivity, phosphorus, arsenic, antimony, or the like can be used. For example, the silicon substrate 100 is subjected to heat treatment at a temperature higher than or equal to 800° C. and lower than or equal to 900° C. in an atmosphere of phosphorus oxychloride, whereby phosphorus can be diffused at a depth of approximately 0.5 µm from the surface of the silicon substrate 100.

The impurity region 130 is formed only on the back surface of the silicon substrate 100, which is opposite to the light-receiving surface. Thus, the following steps may be performed in order that impurities are not diffused into the light-receiving surface: the light-receiving surface side is covered with a mask formed using a heat resistant material, such as an inorganic insulating film, by a known method, and the mask is removed after the formation of the impurity region 130. Alternatively, the following steps may be performed: impurities are diffused into both the front surface and the back surface of the silicon substrate 100 to form an impurity region; the back surface is covered with a mask; and the impurity layer on the light-receiving surface is etched to be removed.

Figure 8C:
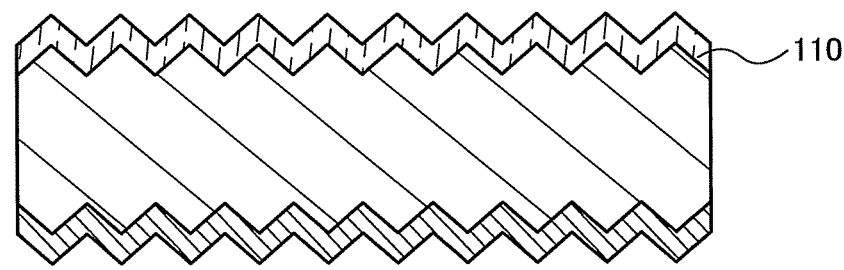

Next, after appropriate cleaning, the oxide semiconductor layer 110 having a conductivity type opposite to that of the silicon substrate 100 is formed over the surface of the silicon substrate 100, which serves as a light-receiving surface (see FIG. 8C). Here, a molybdenum oxide film is used as the oxide semiconductor layer 110.

The molybdenum oxide film can be formed by a vapor phase method such as an evaporation method, a sputtering method, or an ion plating method. As an evaporation method, a method in which a material of molybdenum oxide alone is evaporated, or a method in which a material of molybdenum oxide and an impurity imparting p-type conductivity are co-evaporated may be used. Note that the co-evaporation refers to an evaporation method in which evaporation is carried out from a plurality of evaporation sources at the same time in one treatment chamber. In a sputtering method, molybdenum oxide, molybdenum, or a material containing an impurity imparting a conductivity type thereto may be used as a target, and oxygen or a mixed gas of oxygen and a rare gas such as argon may be used as a sputtering gas. As an ion plating method, a method in which a film is formed in plasma containing oxygen using a material similar to the material used in the sputtering method described above may be used.

In this embodiment, powder of molybdenum oxide is used as an evaporation source in order to form a molybdenum oxide film having p-type conductivity. Further, a co-evaporation method in which molybdenum or the like is added to powder of molybdenum oxide may be used. The molybdenum oxide film which can be used in this embodiment has, for example, a mixed composition including molybdenum trioxide ($MoO_3$) and molybdenum oxide ($MoO_y$ ($2<y<3$)) having an inter mediate composition between molybdenum dioxide and molybdenum trioxide. Note that the molybdenum oxide film preferably contains $MoO_y$ ($2<y<3$) at 4% or more in order to increase a carrier concentration. The purity of the powder of molybdenum oxide is preferably 99.99% (4N) to 99.9999% (6N). The evaporation is preferably performed in a high vacuum of $5×10^{-3}$ Pa or less, preferably $1×10^{-4}$ Pa or less.

Next, the second electrode 190 is formed over the impurity region 130 (see FIG. 9A). The second electrode 190 can be a single layer or a stack of a conductive film formed using a low-resistance metal such as silver, aluminum, or copper; indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. As a deposition method, a sputtering method, a vacuum evaporation method, or the like can be used. Alternatively, the second electrode 190 may be formed in such a manner that a conductive resin such as a silver paste, a copper paste, or an aluminum paste is applied by a screen printing method and baked.

Next, the light-transmitting conductive film 150 is formed over the oxide semiconductor layer 110 (see FIG. 9B). For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film is not limited to a single layer, and may have a stacked structure of different films. For example, a stacked layer of an indium tin oxide and a tin oxide containing antimony, a stacked layer of an indium tin oxide and a tin oxide containing fluorine, etc. can be used. The light-transmitting conductive film can be formed by a sputtering method or the like. The total thickness is preferably greater than or equal to 10 nm and less than or equal to 1000 nm. For example, the light-transmitting conductive film 150 is formed using indium tin oxide and the thickness thereof is set to 70 nm so as to reduce optical reflectance.

Next, the first electrode 170 is formed over the light-transmitting conductive film 150 (see FIG. 9C). The first electrode 170 is a grid electrode and is preferably formed in such a manner that a conductive resin such as a silver paste, a copper paste, a nickel paste, a molybdenum paste, or an aluminum paste is applied by a screen printing method and baked. Further, the first electrode 170 may be a stacked layer of different materials, such as a stacked layer of a silver paste and a copper paste. Further, the conductive resin may be applied by a dispensing method or an ink-jet method.

Further, in order to form a photoelectric conversion device having the structure illustrated in FIG. 6B, a step for limning the light-transmitting conductive film 150 may be omitted.

Further, in order to form a photoelectric conversion device having the structure shown in either of FIGS. 7A and 7B, a silicon oxide film or a silicon nitride film may be provided as the passivation layer 180 having openings between the step of FIG. 8A and the step of FIG. 8B. The passivation layer 180 can be formed by a thermal oxidation method, a plasma CVD method, or the like.

Note that the order of the steps shown in FIGS. 8A to 8C and FIGS. 9A to 9C may be changed as appropriate.

In this manner, the photoelectric conversion device of one embodiment of the present invention is formed.

This embodiment can be freely combined with any of the other embodiments and an example.

Embodiment 3

In this embodiment, a photoelectric conversion device whose structure is different from the structures of the photoelectric conversion devices in Embodiment 2, and a method for manufacturing the photoelectric conversion device is described with reference to FIG. 10, FIG. 11, FIG. 12, FIG. 13, FIGS. 14A to 14C, and FIGS. 15A to 15C. Note that detailed description of portions which are similar to those of Embodiment 2 is omitted in this embodiment.

Figure 10:
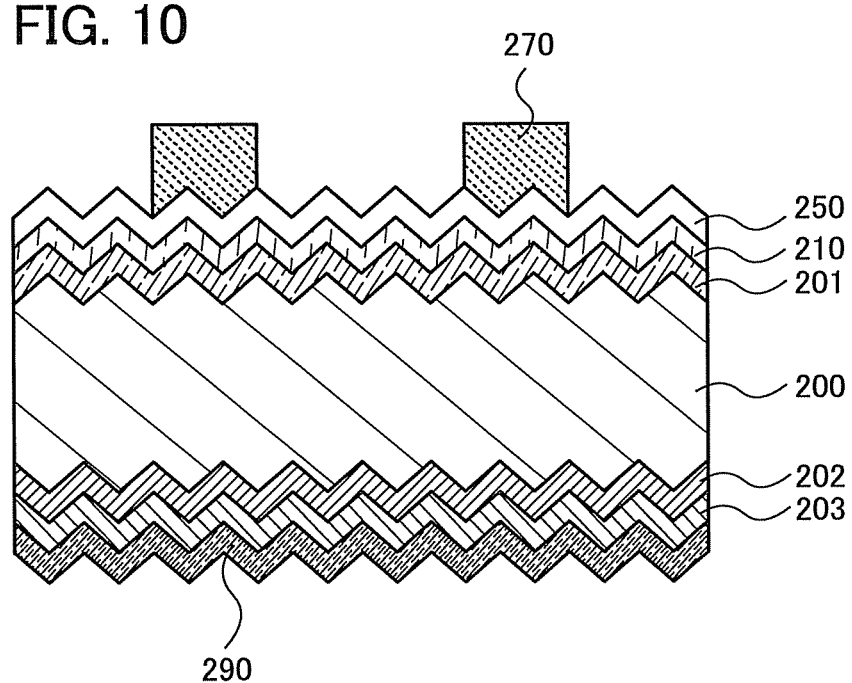
FIG. 10 is a cross-sectional view showing a photoelectric conversion device according to one embodiment of the present invention.

FIG. 10 is a cross-sectional view of a photoelectric conversion device that is one embodiment of the present invention. The photoelectric conversion device includes a silicon substrate 200; a first silicon semiconductor layer 201, an oxide semiconductor layer 210, a light-transmitting conductive film 250, and a first electrode 270 which are formed over one surface of the silicon substrate 200; and a second silicon semiconductor layer 202, a third silicon semiconductor layer 203, and a second electrode 290 which are formed over the other surface of the silicon substrate 200. Note that the first electrode 270 is a grid electrode, and the surface on which the first electrode 270 is formed serves as a light-receiving surface.

The oxide semiconductor layer 210 can be formed using the same material as the oxide semiconductor layer 110 having p-type conductivity described in Embodiments 1 and 2. For example, an oxide semiconductor containing molybdenum oxide ($MoO_y$, ($2<y<3$)) having an intermediate composition between molybdenum dioxide and molybdenum trioxide may be used.

In conventional photoelectric conversion devices, a window layer is formed using a silicon material; therefore, the light absorption in the window layer is a heavy loss. In one embodiment of the present invention, a light-transmitting metal oxide is used for a window layer of the photoelectric conversion device, whereby light absorption loss in the window layer is reduced, and photoelectric conversion can be efficiently performed in a light absorption region.

Further, FIG. 10 shows an example of a texture structure in which a front surface and a back surface of the silicon substrate 200 are processed to have unevenness. On the surface processed to have the texture structure, incident light is reflected in a multiple manner, and the light travels obliquely into a photoelectric conversion region; thus, the optical pass length is increased. In addition, a so-called light trapping effect in which light reflected by the back surface is totally reflected by the surface can occur.

Figure 11:
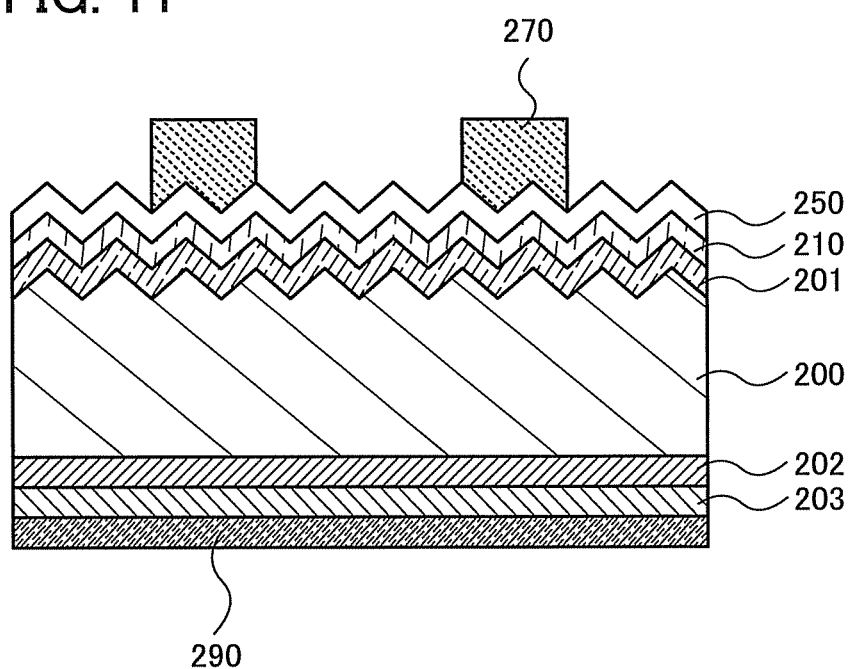
FIG. 11 is a cross-sectional view showing a photoelectric conversion device according to one embodiment of the present invention.

Note that as shown in FIG. 11, a structure in which only one of the front surface and the back surface of the silicon substrate 200 is processed to have unevenness may be employed. The surface area of the silicon substrate is increased by the unevenness; thus, while the optical effect described above can be obtained, the absolute amount of surface defects is increased. Therefore, in consideration of the balance between the optical effect and the amount of the surface defects, a practitioner may determine the structure so that more favorable electric characteristics can be obtained.

Figure 12:
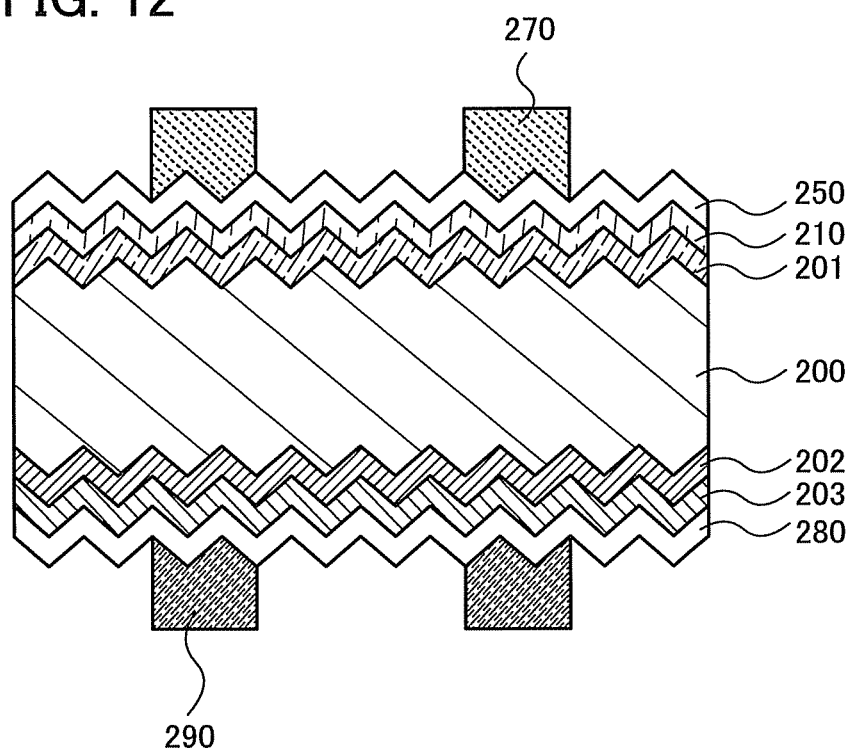
FIG. 12 is cross-sectional view showing a photoelectric conversion device according to one embodiment of the present invention.

Alternatively, as shown in FIG. 12, a structure in which the second electrode 290 is also a grid electrode and a light-transmitting conductive film 280 is provided between the third silicon semiconductor layer 203 and the second electrode 290 so that both surfaces of the silicon substrate 200 serve as light-receiving surfaces may be employed.

Figure 13:
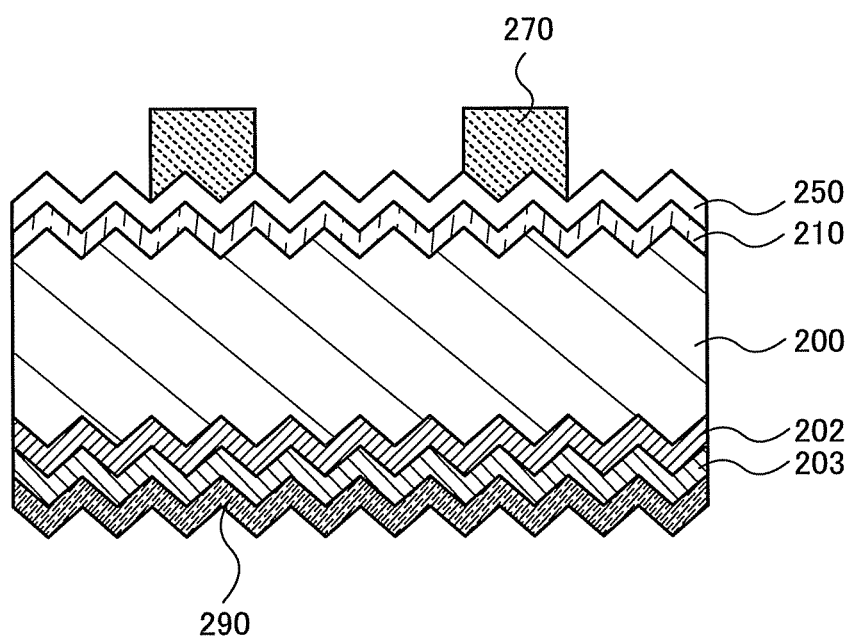
FIG. 13 is a cross-sectional view showing a photoelectric conversion device according to one embodiment of the present invention.

Further, as shown in FIG. 13, a structure in which the first silicon semiconductor layer 201 is not provided and the silicon substrate 200 and the oxide semiconductor layer 210 are in direct contact with each other may be employed. As described in Embodiment 1, the oxide semiconductor layer which can be used for the photoelectric conversion device of one embodiment of the present invention has a high passivation effect on the silicon surface, so that the light-transmitting semiconductor layer can be favorably bonded to the silicon substrate 200.

Note that the photoelectric conversion device may have a structure in which structures of FIG. 10, FIG. 11, FIG. 12, and FIG. 13 are combined as appropriate.

As each of the first silicon semiconductor layer 201 and the second silicon semiconductor layer 202, a semiconductor layer containing hydrogen and few defects can be used, so that defects on the surface of the silicon substrate 200 can be terminated. The semiconductor layer is preferably formed using an amorphous silicon semiconductor.

For each of the first silicon semiconductor layer 201 and the second silicon semiconductor layer 202, an i-type silicon semiconductor layer can be used, for example. In this embodiment, an n-type silicon substrate is used as the silicon substrate 200; accordingly, a p-type silicon semiconductor layer can be used for each of the first silicon semiconductor layer 201 and the second silicon semiconductor layer 202.

It is to be noted that in this specification, the term "i-type semiconductor" refers not only to a so-called intrinsic semiconductor with the Fermi level positioned in the middle of the band gap, but also to a semiconductor in which the concentration of an impurity for imparting p-type or n-type conductivity is $1\times10^{18}$ atoms/cm$^{-3}$ or less, and in which the photoconductivity is higher than the dark conductivity.

Further, in the case where a silicon semiconductor layer having p-type conductivity is used as each of the first silicon semiconductor layer 201 and the second silicon semiconductor layer 202, a p$^-$-type silicon semiconductor layer is preferably used. In the case where a p$^-$-type silicon semiconductor layer is used, the semiconductor layer has a dark conductivity of $1\times10^{-10}$ S/cm to $1\times10^{-5}$ S/cm, preferably $1\times10^{-9}$ S/cm to $1\times10^{-6}$ S/cm, more preferably $1\times10^{-9}$ S/cm to $1\times10^{-7}$ S/cm.

In this embodiment, the silicon substrate 200 has n-type conductivity and the oxide semiconductor layer 210 has p-type conductivity. Thus, a p-n junction is formed between the silicon substrate 200 and the oxide semiconductor layer 210 with the first silicon semiconductor layer 201 provided therebetween.

Further, the third silicon semiconductor layer 203 provided on the back surface of the silicon substrate 200 has the same conductivity type as the silicon substrate 200 and has a higher carrier concentration than the silicon substrate 200. Accordingly, an n-n$^+$ junction is formed between the silicon substrate 200 and the third silicon semiconductor layer 203 with the second silicon semiconductor layer 202 provided therebetween. That is, the third silicon semiconductor layer 203 serves as a BSF layer. When the BSF layer is provided, recombination of minority carriers in the vicinity of the second electrode 290 can be prevented by the potential barrier due to band bending of the n-n$^+$ junction.

Note that a light-transmitting conductive film having n-type conductivity may be used as an alternative to the third silicon semiconductor layer 203. For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The above light-transmitting conductive film is not limited to a single layer, and a stacked structure of different films may be employed. The light-transmitting conductive film serves not only as an electric field forming layer but also as a film for promoting reflection of light reaching the second electrode 290.

Next, a method for manufacturing the photoelectric conversion device shown in FIG. 10 is described with reference to FIGS. 14A to 14C and FIGS. 15A to 15C.

A single crystal silicon substrate or a polycrystalline silicon substrate can be used for the silicon substrate 200 that can be used in one embodiment of the present invention. A method for manufacturing the crystalline silicon substrate is not specifically limited. In this embodiment, described is an example in which an n-type single crystal silicon substrate whose surface corresponds to the (100) plane and which is manufactured by a Magnetic Czochralski (MCZ) method is used.

Figure 14A:
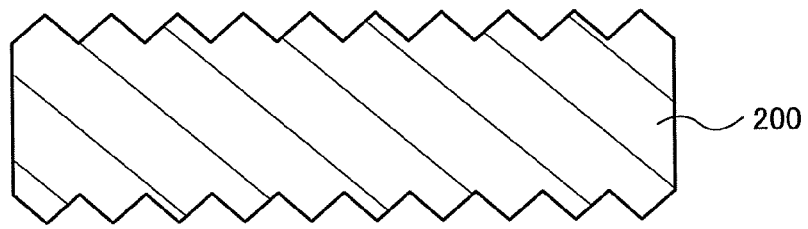
FIGS. 14A to 14C are cross-sectional views showing a method for manufacturing a photoelectric conversion device according to one embodiment of the present invention.

Next, the front surface and the back surface of the silicon substrate 200 are processed to have a texture structure (see FIG. 14A). For a method for processing the silicon substrate 200 to have unevenness, the description of the step of processing the silicon substrate 100 to have unevenness in Embodiment 2, which is illustrated in FIG. 8A, can be referred to.

Next, after appropriate cleaning, the second silicon semiconductor layer 202 is formed over the back surface of the silicon substrate 200 which is opposite to the light-receiving surface by a plasma CVD method. The thickness of the second silicon semiconductor layer 202 is preferably greater than or equal to 3 nm and less than or equal to 50 nm. In this embodiment, the second silicon semiconductor layer 202 is i-type amorphous silicon, which has a thickness of 5 nm. Note that microcrystalline silicon may be used for the second silicon semiconductor layer 202. The conductivity type of the second silicon semiconductor layer 202 is not limited to an i-type and may be an n$^-$-type.

The second silicon semiconductor layer 202 can be formed, for example, under the following conditions: monosilane is introduced to a reaction chamber at a flow rate of greater than or equal to 5 sccm and less than or equal to 200 sccm; the pressure inside the reaction chamber is set to higher than or equal to 100 Pa and lower than or equal to 200 Pa; the distance between electrodes is set to greater than or equal to 10 mm and less than or equal to 40 mm; the power density based on the area of a cathode electrode is set to greater than or equal to 8 mW/cm$^2$ and less than or equal to 120 mW/cm$^2$; and the substrate temperature is set to higher than or equal to 150° C. and lower than or equal to 300° C.

Figure 14B:
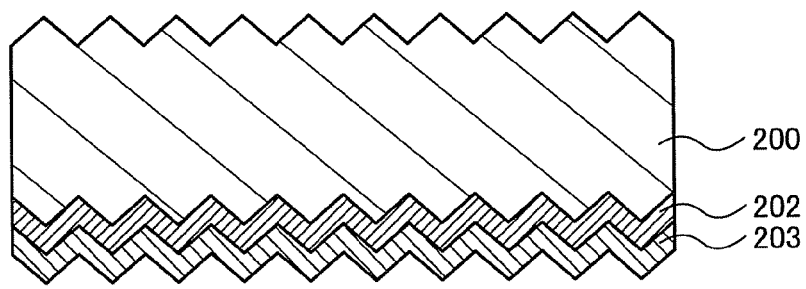

Next, the third silicon semiconductor layer 203 is formed over the second silicon semiconductor layer 202 (see FIG. 14B). The third silicon semiconductor layer 203 preferably has a thickness of greater than or equal to 3 nm and less than or equal to 50 nm. In this embodiment, the third silicon semiconductor layer 203 is formed using n$^+$-type microcrystalline silicon or amorphous silicon, and has a thickness of 10 nm.

The third silicon semiconductor layer 203 can be formed, for example, under the following conditions: monosilane and hydrogen-based phosphine (0.5%) are introduced to a reaction chamber at a flow rate ratio of 1:1 to 15; the pressure inside the reaction chamber is set to higher than or equal to 100 Pa and lower than or equal to 200 Pa; the distance between electrodes is set to greater than or equal to 10 mm and less than or equal to 40 mm; the power density based on the area of a cathode electrode is set to greater than or equal to 8 mW/cm$^2$ and less than or equal to 120 mW/cm$^2$; and the substrate temperature is set to higher than or equal to 150° C. and lower than or equal to 300° C.

Figure 14C:
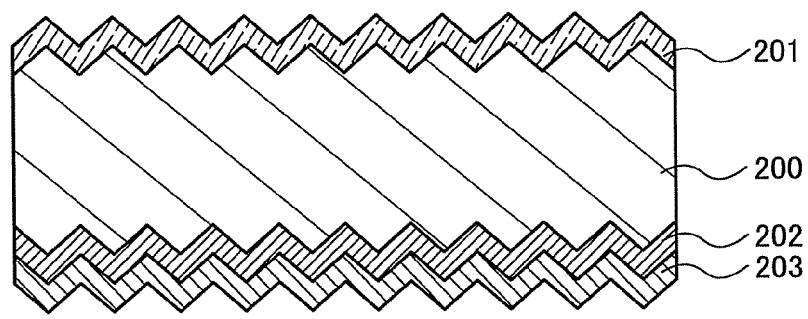

Next, the first silicon semiconductor layer 201 is formed over the surface of the silicon substrate 200 on the light-receiving surface side by a plasma CVD method (see FIG. 14C). The thickness of the first silicon semiconductor layer 201 is preferably greater than or equal to 3 nm and less than or equal to 50 nm. In this embodiment, the first silicon semiconductor layer 201 is i-type amorphous silicon and has a thickness of 5 nm. Note that microcrystalline silicon may be used for the first silicon semiconductor layer 201. The conductivity type of the first silicon semiconductor layer 201 is not limited to i-type and may be p$^-$-type. Note that the first silicon semiconductor layer 201 can be formed under conditions similar to those of the third silicon semiconductor layer 203.

Note that in the case where the first silicon semiconductor layer 201 is a p$^-$-type silicon semiconductor layer, the first silicon semiconductor layer 201 can be formed, for example, under the following conditions: monosilane and hydrogen-based diborane (0.1%) are introduced to a reaction chamber at a flow rate ratio of 1:0.01 to 1 (greater than or equal to 0.01 and less than 1); the pressure inside the reaction chamber is set to higher than or equal to 100 Pa and lower than or equal to 200 Pa; the distance between electrodes is set to greater than or equal to 10 mm and less than or equal to 40 mm; the power density based on the area of a cathode electrode is set to greater than or equal to 8 mW/cm$^2$ and less than or equal to 120 mW/cm$^2$; and the substrate temperature is set to higher than or equal to 150° C. and lower than or equal to 300° C.

Note that in this embodiment, although an RF power source with a frequency of 13.56 MHz is used as a power source for forming the first silicon semiconductor layer 201, the second silicon semiconductor layer 202, and the third silicon semiconductor layer 203, an RF power source with a frequency of 27.12 MHz, 60 MHz, or 100 MHz may be used instead. In addition, the deposition may be carried out by not only continuous discharge but also pulse discharge. The implementation of pulse discharge can improve the film quality and reduce particles produced in the gas phase.

Figure 15A:
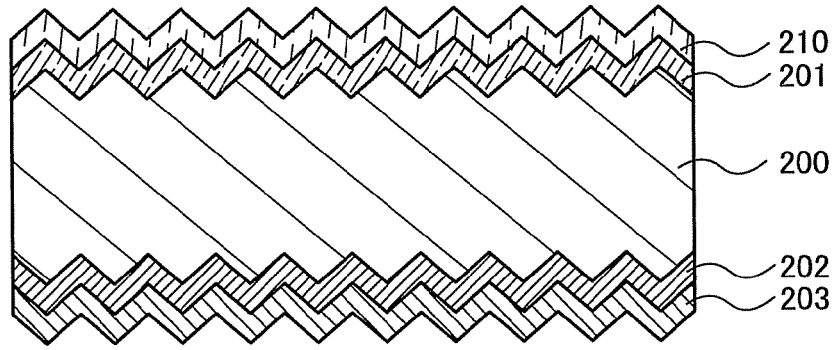
FIGS. 15A to 15C are cross-sectional views showing a method for manufacturing a photoelectric conversion device according to one embodiment of the present invention.

Next, the oxide semiconductor layer 210 is formed over the first silicon semiconductor layer 201 (see FIG. 15A). For a method for forming the oxide semiconductor layer 210, the description of the step of forming the oxide semiconductor layer 110 in Embodiment 2, which is illustrated in FIG. 9A, can be referred to. In this embodiment, the oxide semiconductor layer 210 is formed using a molybdenum oxide film having p-type conductivity and has a thickness of 1 nm to 100 nm. Note that the oxide semiconductor layer 210 is formed so as to have a higher carrier concentration than the first silicon semiconductor layer 201.

Figure 15B:
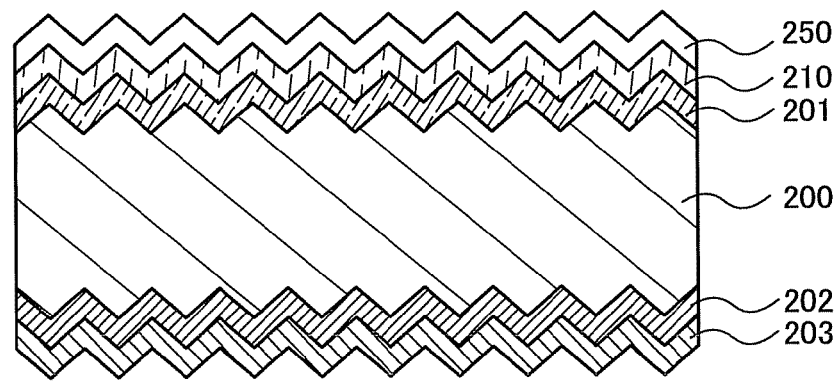

Next, the light-transmitting conductive film 250 is formed over the oxide semiconductor layer 210 (see FIG. 15B). Here, the thickness of the light-transmitting conductive film 250 is preferably greater than or equal to 10 nm and less than or equal to 1000 nm. For a method for forming the light-transmitting conductive film 250, the description of the step of forming the light-transmitting conductive film 150 in Embodiment 2, which is illustrated in FIG. 9B, can be referred to. For example, the light-transmitting conductive film 250 is formed using indium tin oxide and has a thickness of 70 nm so as to reduce optical reflectance.

Note that the formation order of the films provided on the front surface and the back surface of the silicon substrate 200 is not limited to the order described above as long as the structure illustrated in FIG. 15B can be obtained. For example, the second silicon semiconductor layer 202 may be formed, and then the first silicon semiconductor layer 201 may be formed.

Next, the second electrode 290 is formed over the third silicon semiconductor layer 203. The second electrode 290 can be formed using a low-resistance metal such as silver, aluminum, or copper by a sputtering method, a vacuum evaporation method, or the like. Alternatively, a screen printing method may be used to form the second electrode 290 from a conductive resin such as a silver paste or a copper paste.

Figure 15C:
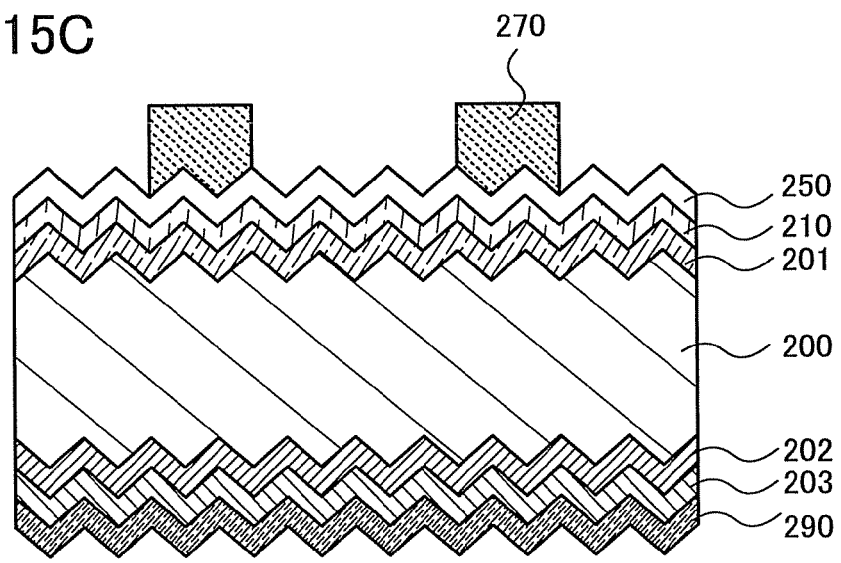

Next, the first electrode 270 is formed over the light-transmitting conductive film 250 (see FIG. 15C). The first electrode 270 is a grid electrode and is preferably formed using a conductive resin such as a silver paste, a copper paste, a nickel paste, or a molybdenum paste by a screen printing method. Further, the first electrode 270 may be a stacked layer of different materials, such as a stacked layer of a silver paste and a copper paste.

Note that in order to form a photoelectric conversion device having the structure illustrated in FIG. 11, before a process for forming unevenness, a resist mask or the like may be provided on a surface where the unevenness is not formed.

Further, in order to form a photoelectric conversion device having the structure illustrated in FIG. 12, in the step of FIG. 15B, the light-transmitting conductive film 280 may be formed over the third silicon semiconductor layer 203, and after that, as grid electrodes, the first electrode 270 and the second electrode 290 may be provided over the light-transmitting conductive film 250 and the light-transmitting conductive film 280, respectively.

Further, in order to form a photoelectric conversion device having the structure illustrated in FIG. 13, a structure in which the first silicon semiconductor layer 201 is not provided in the step of FIG. 14C may be employed.

In the above manner, the photoelectric conversion device in which the oxide semiconductor layer is used as a window layer, which is one embodiment of the present invention, can be manufactured.

This embodiment can be freely combined with any of the other embodiments and an example.

Embodiment 4

In this embodiment, photoelectric conversion devices whose structures are different from the structures of the photoelectric conversion devices in Embodiments 2 and 3 is described with reference to FIGS. 16A and 16B, FIGS. 17A and 17B, and FIGS. 18A and 18C. Note that detailed description of portions which are similar to those of Embodiments 2 and 3 is omitted in this embodiment.

Figure 16A:
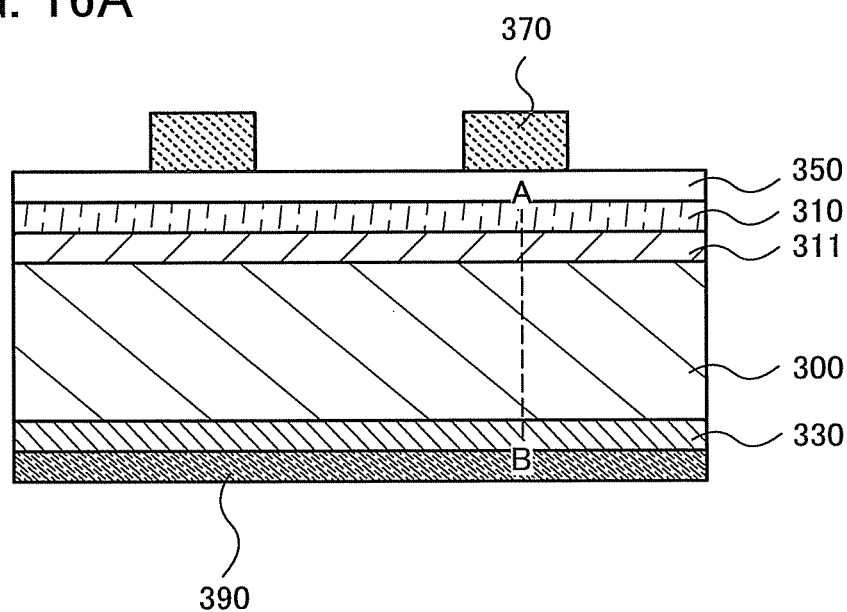
FIGS. 16A and 16B are cross-sectional views each showing a photoelectric conversion device according to one embodiment of the present invention.

FIG. 16A is a schematic cross-sectional view illustrating an example of a photoelectric conversion device. The photoelectric conversion device includes a silicon substrate 300, and further includes, over one surface of the silicon substrate 300, a silicon oxide layer 311, an oxide semiconductor layer 310 over the surface of the silicon substrate 300 with the silicon oxide layer 311 provided therebetween, a light-transmitting conductive film 350 over the oxide semiconductor layer 310, and a first electrode 370 in contact with the light-transmitting conductive film 350. Furthermore, the photoelectric conversion device includes, over the other surface of the silicon substrate 300, an impurity region 330, and a second electrode 390 in contact with the impurity region 330. Note that the first electrode 370 is a grid electrode, and the surface on the first electrode 370 side serves as a light-receiving surface.

For the oxide semiconductor layer 310, an oxide semiconductor which has p-type conductivity and contains molybdenum oxide ($MoO_y$, ($2<y<3$)) having an intermediate composition between molybdenum dioxide and molybdenum trioxide, which is described in other embodiments, can be used. For example, molybdenum oxide containing molybdenum trioxide ($MoO_3$) and molybdenum oxide ($MoO_y$, ($2<y<3$)) having an intermediate composition between molybdenum dioxide and molybdenum trioxide is used. Molybdenum oxide is preferable since it is stable in the air, has a low hygroscopic property, and is easily treated.

In this embodiment, a silicon substrate having n-type conductivity is used as the silicon substrate 300. Further, as described above, the oxide semiconductor layer 310 has p-type conductivity. Thus, a p-n junction with a semiconductor-insulator-semiconductor (SIS) structure is formed between the silicon substrate 300 and the oxide semiconductor layer 310.

The light-transmitting conductive film 350 is preferably formed over the oxide semiconductor layer 310. By the provision of the light-transmitting conductive film 350, resistance loss between the oxide semiconductor layer 310 and the first electrode 370 can be reduced. However, in the case where the resistance of the oxide semiconductor layer 310 is sufficiently low or in the case where the manufactured photoelectric conversion device is used for low-current applications which are not affected by the loss of current due to its resistance, a structure in which the light-transmitting conductive film 350 is not provided may be employed.

The same material as the light-transmitting conductive film 150 described in Embodiment 1 can be used for the light-transmitting conductive film 350.

The impurity region 330 is a BSF layer, has the same conductivity type as the silicon substrate 300, and is a region having a higher carrier concentration than the silicon substrate 300. By the provision of the BSF layer, an $n$-$n^+$ junction is formed and recombination of minority carriers in the vicinity of the second electrode 390 can be prevented by the potential barrier due to band bending.

Figure 16B:
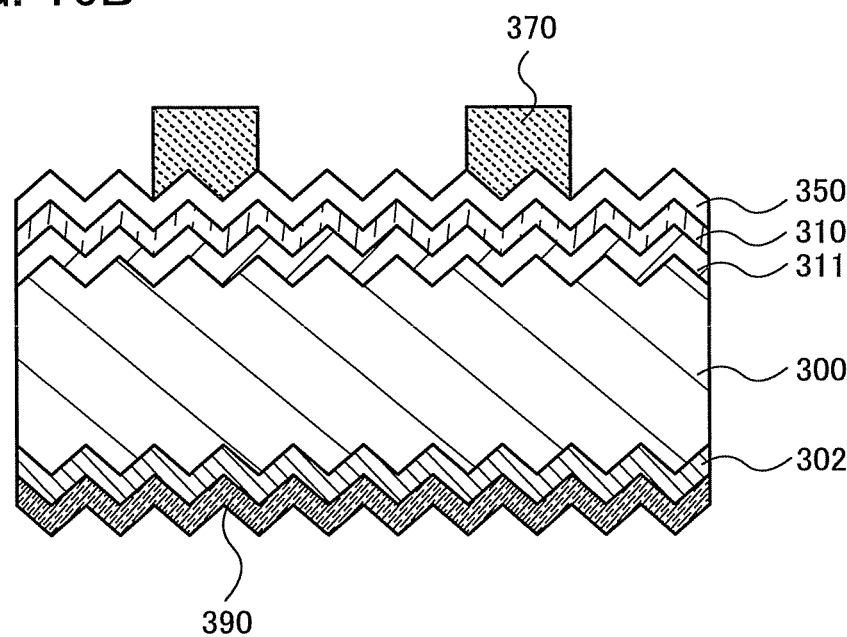

Further, as shown in FIG. 16B, a texture structure in which the silicon substrate 300 is processed to have unevenness may be employed. The texture structure provided for the light-receiving surface side can reduce reflection loss at the surface because incident light is reflected in a multiple manner. Further, by the texture structure, light enters a photoelectric conversion region obliquely by the refractive indexes of the silicon substrate in the photoelectric conversion region. Thus, the optical path length is increased and reflection between the front surface and the back surface of the photoelectric conversion region is repeated, whereby light trapping effect can occur. The texture structure may be provided for both surfaces as shown in FIG. 16B, or either the front surface or the back surface of the silicon substrate.

For the silicon oxide layer 311, silicon dioxide ($SiO_2$), silicon monoxide (SiO), silicon oxide ($SiO_x$ (x>0)) such as silicon oxide in which silicon dioxide and silicon are mixed, and a compound of silicon, oxygen, and a metal contained in the oxide semiconductor layer 310 can be used. The silicon oxide layer 311 can be obtained by oxidation or deposition using an electric furnace, a plasma CVD apparatus, a plasma treatment apparatus, or the like. Alternatively, the silicon oxide layer 311 may be formed in such a manner that the silicon substrate 300 and the oxide semiconductor layer 310 are reacted with each other using heat, infrared rays, energy in forming the oxide semiconductor layer 310, or the like. Note that the silicon oxide layer 311 may have a resistance which is the same level as a semiconductor.

The thickness of the silicon oxide layer 311 can be 0.5 nm to 10 nm. Since the silicon oxide layer 311 is formed in a p-n junction formed between the silicon substrate 300 and the oxide semiconductor layer 310, the silicon oxide layer 311 is preferably an extremely thin film through which tunnel current flows. Further, the silicon oxide layer 311 function as a buffer layer to relax lattice mismatch in junction between the silicon substrate 300 and the oxide semiconductor layer 310.

Figure 17A:
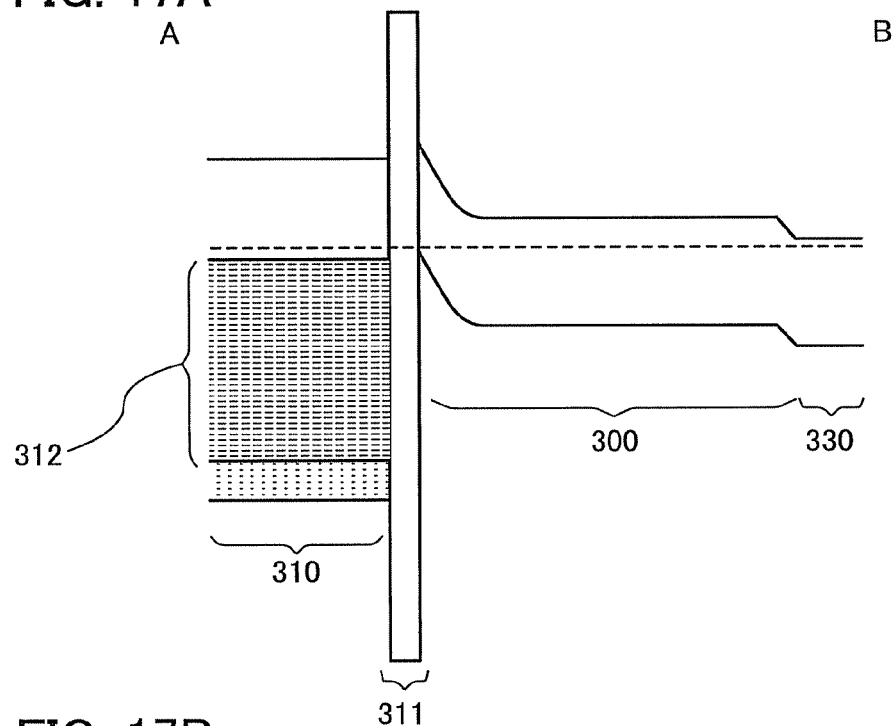
FIGS. 17A and 17B are views each showing a band structure of a photoelectric conversion device according to one embodiment of the present invention.
Figure 17B:
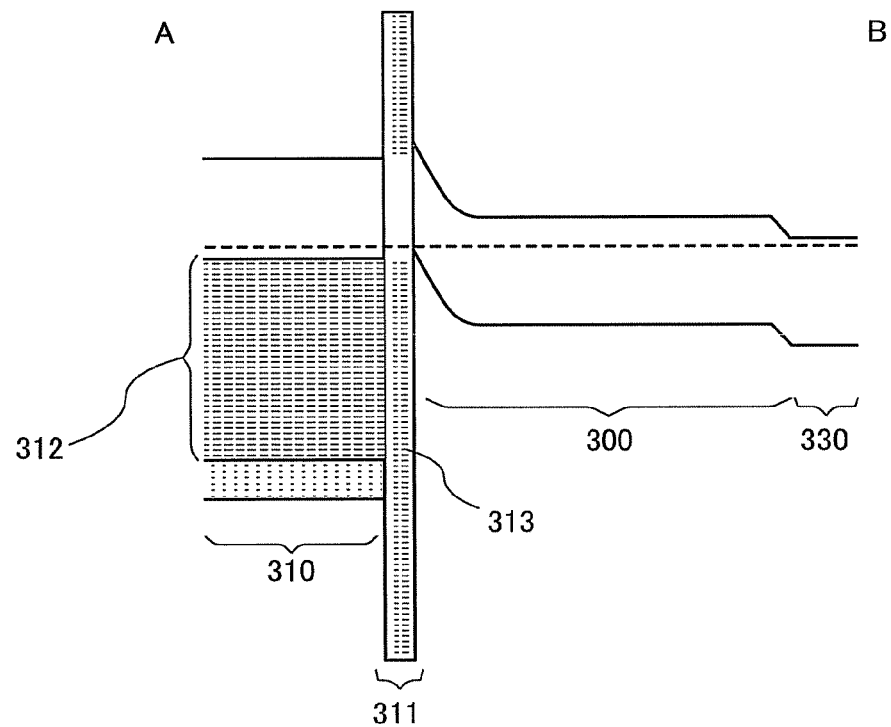

FIGS. 17A and 17B are schematic views of energy band structures along A-B direction in FIG. 16A. Here, as an example, single crystal silicon having n-type conductivity is used as the silicon substrate 300, molybdenum oxide containing $MoO_3$ and $MoO_y$ (2<y<3) and having p-type conductivity is used as the oxide semiconductor layer 310, silicon oxide ($SiO_x$ (x>0)) is used as the silicon oxide layer 311, and $n^+$-type single crystal silicon to which phosphorus is added at high concentration is used as the impurity region 330. In FIGS. 17A and 17B, an energy level 312 in the band gap of the oxide semiconductor layer 310 is similar to the gap level detected as the peak 112 in XPS spectra in FIG. 2.

As shown in FIG. 17A, the silicon oxide layer 311 is formed in a p-n junction between the p-type oxide semiconductor layer 310 and the n-type silicon substrate 300, so that a potential barrier is formed on the conduction band side to which electrons are transferred and on the valence band side to which holes are transferred. The potential barrier on the conduction band for electrons that are majority carriers in the n-type silicon substrate 300 is a potential barrier by band bending in a depletion region of the n-type silicon substrate 300, which can reduce diffusion current or thermal release current as a diode in the p-n junction and improve output voltage of the photoelectric conversion device.

On the other hand, in FIG. 17A, the potential barrier on the valence band side for holes that are minority carrier in the n-type silicon substrate 300 due to the silicon oxide layer 311 can be a potential barrier when electron-hole pairs excited by light absorption in the n-type silicon substrate 300 that is a photo conversion layer are formed and then the holes are transferred, thereby preventing entry of photocurrent. However, the silicon oxide layer 311 is formed with en extremely thin film; thus, a tunnel current or a leak current can be generated. Accordingly, even with the potential barrier on the conduction band due to the silicon oxide layer 311 exists, when electron-hole pairs excited by light absorption in the n-type silicon substrate 300 that is a photo conversion layer are formed, the holes can flow into the potential barrier by the tunnel current or the leak current and can be extracted as a current. Furthermore, in the case where a tunnel current flowing through the potential barrier of the silicon oxide layer 311 is a device operation mechanism, a decrease in the output due to a temperature rise of the photoelectric conversion device in accordance with solar radiation and an air temperature rise can be reduced since the tunnel current has little dependence on temperature.

By the energy level 312 in the energy band gap of the oxide semiconductor layer 310, current in which holes are carriers can flow. Further, the energy level 312 acts as an energy band as the valence band of the oxide semiconductor layer 310, thereby imparting p-type conductivity.

Further, FIG. 17B is a band diagram in which the silicon oxide layer 311 is formed using silicon oxide ($SiO_x$ (x>0)). As shown in the figure, an energy level is formed in the band gap of the silicon oxide layer 311; thus, current can be easily extracted.

Next, methods for manufacturing the photoelectric conversion devices shown in FIGS. 16A and 16B are described. The photoelectric conversion devices shown in FIGS. 16A and 16B are formed as described in Embodiment 2 with reference to FIGS. 8A to 8C and FIGS. 9A to 9C and then the silicon oxide layer 311 may be formed before or at the same time as the formation of the oxide semiconductor layer 110 described in FIG. 8C. Alternatively, after the formation of the oxide semiconductor layer 110 described in FIG. 8C, the silicon oxide layer 311 may be formed by a reaction caused at an interface between the oxide semiconductor layer 110 and the silicon substrate 100.

Figure 18A:
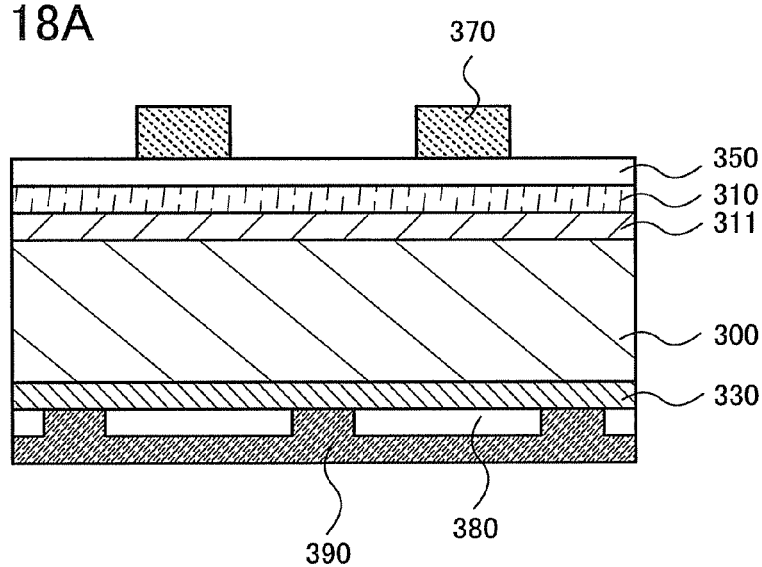
FIGS. 18A and 18B are cross-sectional views each showing a photoelectric conversion device according to one embodiment of the present invention.
Figure 18B:
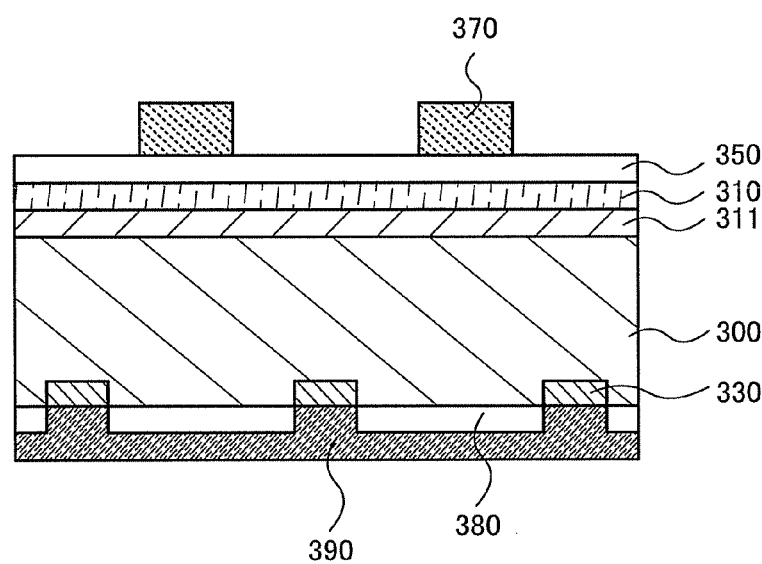

Further, the photoelectric conversion device of one embodiment of the present invention may have a structure illustrated in FIG. 18A or 18B. The photoelectric conversion devices shown in FIGS. 18A and 18B each includes a silicon substrate 300, and further includes, over one surface of the silicon substrate 300, a silicon oxide layer 311, an oxide semiconductor layer 310 over the silicon oxide layer 311, a light-transmitting conductive film 350 over the oxide semiconductor layer 310, and a first electrode 370 in contact with the light-transmitting conductive film 350. Furthermore, the photoelectric conversion device includes, over the other surface of the silicon substrate 300, an impurity region 330 having the same conductivity as the silicon substrate 300, a passivation layer 380, and a second electrode 390 in contact with the impurity region 330.

For the passivation layer 380, silicon oxide, silicon nitride, silicon nitride oxide ($SiN_xO_y$ (x>y>0)), silicon oxynitride ($SiO_xN_y$ (x>y>0)), aluminum oxide, or the like can be used. The provision of the passivation layer 380 enables recombination of minority carriers at the other surface side of the silicon substrate 300 to be reduced, so that output voltage of the photoelectric conversion device in power generation can be improved. Further, by the use of a material having a lower refractive index than the silicon substrate 300 for the passivation layer 380, reflectance at the back surface of the silicon substrate 300 can be increased and output current of the photoelectric conversion device in power generation can be improved.

The impurity region 330 may be provided on the entire back surface of the silicon substrate as shown in FIG. 18A; alternatively the impurity region 330 may be provided only in the vicinity of the openings in the passivation layer 380 as shown in FIG. 18B. By the provision of the impurity region 330, the minority carrier density can be reduced but the surface recombination rate at the interface between the impurity region 330 and the passivation layer 380 is increased; that is, there is a trade-off therebetween. Therefore, in consideration of the surface recombination rate at the interface between the impurity region 330 and the passivation layer 380 depending on the manufacturing process, a practitioner can determine the structure so that more favorable electric characteristics can be obtained.

Note that the photoelectric conversion device may have a structure in which structures of FIGS. 16A and 16B and FIGS. 18A and 18B are combined as appropriate.

This embodiment can be freely combined with any of the other embodiments and an example.

Embodiment 5

In this embodiment, photoelectric conversion devices whose structures are different from the structures of the photoelectric conversion devices in Embodiments 2 to 4 is described with reference to FIGS. 19A and 19B and FIGS. 20A and 20B. Note that detailed description of portions which are similar to those of Embodiments 2 to 4 is omitted in this embodiment.

Figure 19A:
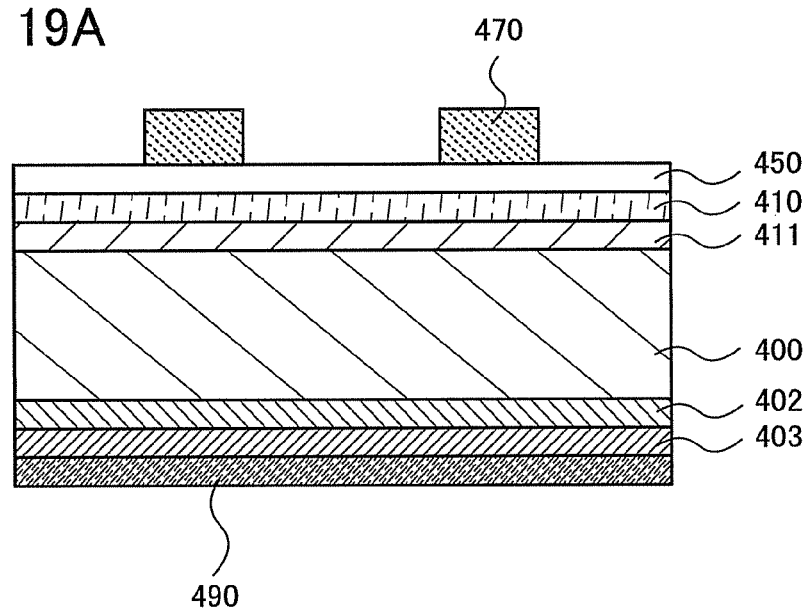
FIGS. 19A and 19B are cross-sectional views each showing a photoelectric conversion device according to one embodiment of the present invention.
Figure 19B:
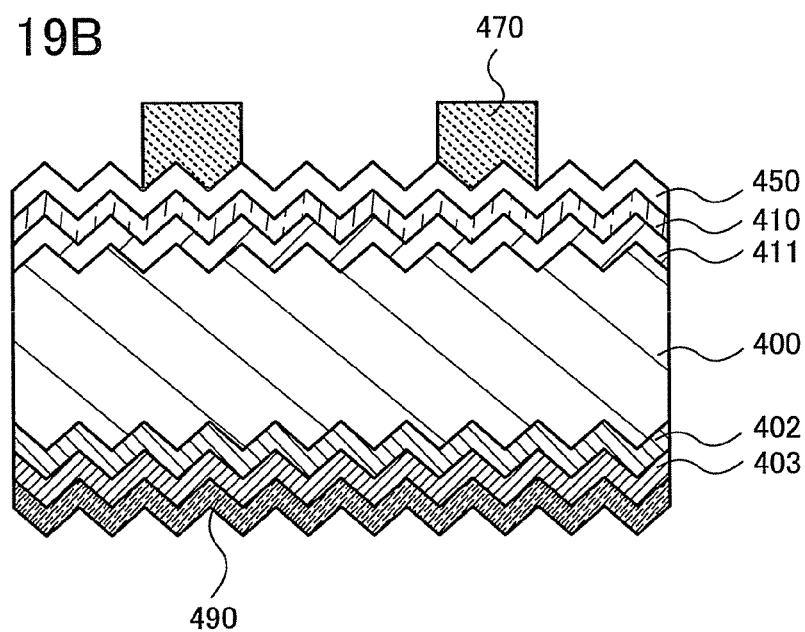

FIGS. 19A and 19B are cross-sectional views each showing a photoelectric conversion device of one embodiment of the present invention. The photoelectric conversion device includes a silicon substrate 400, and further includes, over one surface of the silicon substrate 400, a silicon oxide layer 411, an oxide semiconductor layer 410 formed over the surface of the silicon substrate 400 with the silicon oxide layer 411 provided therebetween, a light-transmitting conductive film 450, and a first electrode 470. Furthermore, the photoelectric conversion device includes, over the other surface of the silicon substrate 400, a first silicon semiconductor layer 402, a second silicon semiconductor layer 403, and a second electrode 490. Note that the first electrode 470 is a grid electrode, and the surface on the first electrode 470 side serves as a light-receiving surface.

Further, FIG. 19B shows an example of a texture structure in which the front surface and the back surface of the silicon substrate 400 are processed to have unevenness. On the surface processed to have unevenness, incident light is reflected in a multiple manner, and the light travels obliquely into a photoelectric conversion region; thus, the optical pass length is increased. In addition, a so-called light trapping effect in which light reflected by the back surface is totally reflected by the surface can occur. The texture structure may be provided for both surfaces or either the front surface or the back surface of the silicon substrate 400.

For the oxide semiconductor layer 410 in one embodiment of the present invention, an oxide semiconductor containing molybdenum oxide ($MoO_y$ ($2<y<3$)) having an intermediate composition between molybdenum dioxide and molybdenum trioxide, which is described in the other embodiments, can be used.

The silicon oxide layer 411 can be formed using the same material as the silicon oxide layer 311 described in Embodiment 4. The thickness of the silicon oxide layer 411 is preferably 0.5 nm to 10 nm, more preferably 0.5 nm to 5 nm. Since the silicon oxide layer 411 is formed in a p-n junction, the oxide layer is preferably an extremely thin film through which tunnel current flows. Further, the silicon oxide layer 411 function as a buffer layer to relax lattice mismatch in junction between the silicon substrate 400 and the oxide semiconductor layer 410.

The first silicon semiconductor layer 402 and the second silicon semiconductor layer 403 can be formed using the same materials as the first silicon semiconductor layer 302 and the second silicon semiconductor layer 303, respectively, which are described in Embodiment 3. For example, an i-type silicon semiconductor layer, or a silicon semiconductor layer having a conductivity type opposite to the silicon substrate 400 may be used.

In conventional photoelectric conversion devices, a window layer is formed using a silicon material; therefore, the light absorption in the window layer is a heavy loss. In one embodiment of the present invention, a light-transmitting metal oxide is used for a window layer of a photoelectric conversion device, whereby the light loss caused by light absorption in the window layer is reduced, and photoelectric conversion can be efficiently performed in a light absorption region.

Figure 20A:
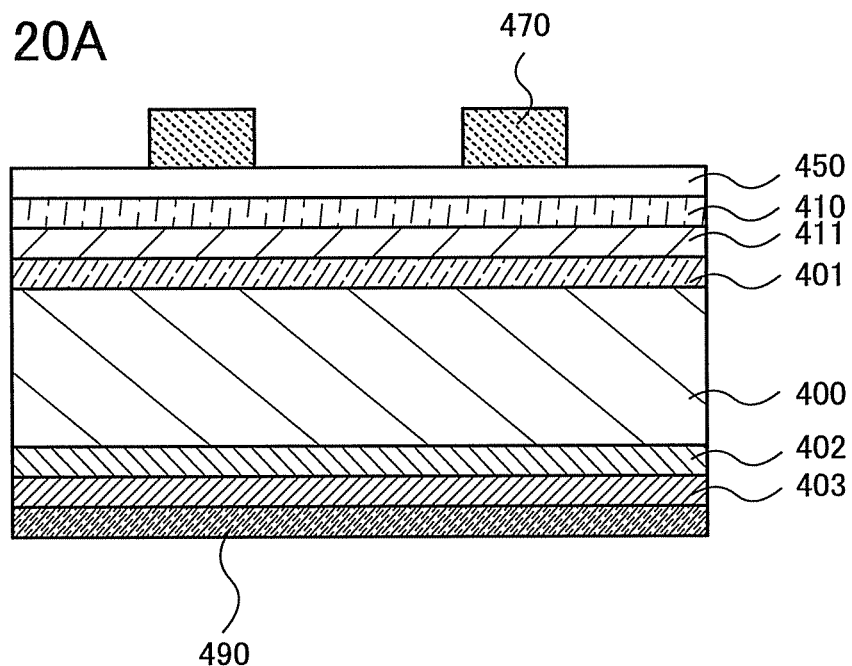
FIGS. 20A and 20B are cross-sectional views each showing a photoelectric conversion device according to one embodiment of the present invention.
Figure 20B:
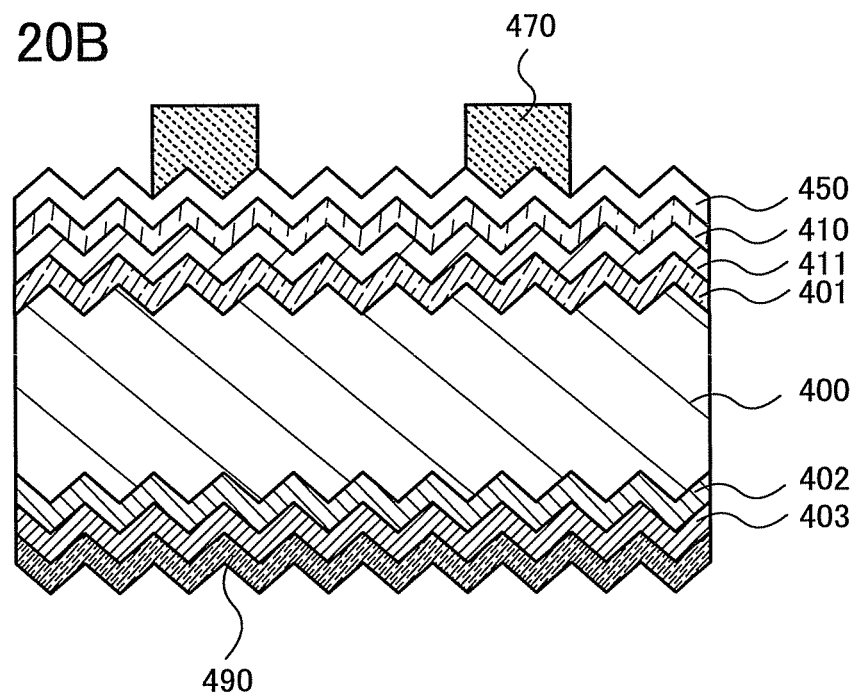

Further, the photoelectric conversion device of one embodiment of the present invention may have a structure illustrated in FIG. 20A or 20B. The photoelectric conversion devices shown in FIGS. 20A and 20B each include the silicon substrate 400, and further includes, over one surface of the silicon substrate 400, a third silicon semiconductor layer 401, the silicon oxide layer 411 over the third silicon semiconductor layer 401, the oxide semiconductor layer 410 over the silicon oxide layer 411, the light-transmitting conductive film 450, and the first electrode 470. Furthermore, the photoelectric conversion device includes, over the other surface of the silicon substrate 400, the first silicon semiconductor layer 402, the second silicon semiconductor layer 403, and the second electrode 490. Note that the first electrode 470 is a grid electrode, and the surface on the first electrode 470 side serves as a light-receiving surface.

The third silicon semiconductor layer 401 can be formed using a semiconductor layer containing hydrogen and few defects, which is similar to the first silicon semiconductor layer 201 described in Embodiment 3, so that defects on the surface of the silicon substrate 400 can be terminated. The semiconductor layer is preferably formed using an amorphous silicon semiconductor.

The photoelectric conversion device shown in FIG. 19B can be formed as described in Embodiment 4 with reference to FIGS. 17A and 17B and FIGS. 18A and 18B. The silicon oxide layer 411 may be provided instead of the first silicon semiconductor layer 201 in FIG. 17C.

The photoelectric conversion device shown in FIG. 20B is formed as described in Embodiment 4 with reference to FIGS. 17A and 17B and FIGS. 18A and 18B. Before or at the same time as the formation of the oxide semiconductor layer 210 described in FIG. 18C, the silicon oxide layer 411 may be formed. Alternatively, the silicon oxide layer 411 may be formed by a reaction caused at the interface between the oxide semiconductor layer 410 and the silicon substrate 400 after the formation of the oxide semiconductor layer 410.

Note that the photoelectric conversion device may have a structure in which structures shown in FIGS. 19A and 19B and FIGS. 20A and 20B are combined as appropriate.

This embodiment can be freely combined with any of the other embodiments and an example.

Embodiment 6

In this embodiment, photoelectric conversion devices whose structures are different from the structures of the photoelectric conversion devices in Embodiments 2 to 5 is described with reference to FIGS. 21A and 21B and FIGS. 22A and 22B. Note that detailed description of portions which are similar to those of Embodiments 2 to 5 is omitted in this embodiment.

Figure 21A:
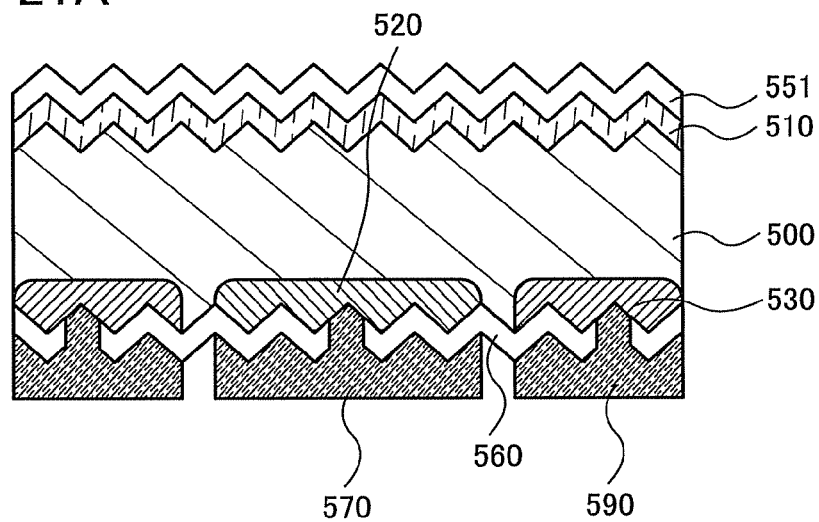
FIGS. 21A and 21B are cross-sectional views each showing a photoelectric conversion device according to one embodiment of the present invention.

FIG. 21A is a cross-sectional view of a photoelectric conversion device that is one embodiment of the present invention. The photoelectric conversion device includes a silicon substrate 500, and further includes, over one surface of the silicon substrate, an oxide semiconductor layer 510 and a light-transmitting thin film 551. Furthermore, the photoelectric conversion device includes, over the other surface of the silicon substrate 500, a first impurity region 520, a second impurity region 530, a first electrode 570 and a second electrode 590. In other words, the photoelectric conversion device has a back contact structure in which the electrodes and the impurity regions are provided only over the back surface of the silicon substrate. Note that the silicon substrate 500 may have either p-type conductivity or n-type conductivity. Further, the light-transmitting thin film 551 serves as an antireflection film and may be provided as necessary.

Figure 21B:
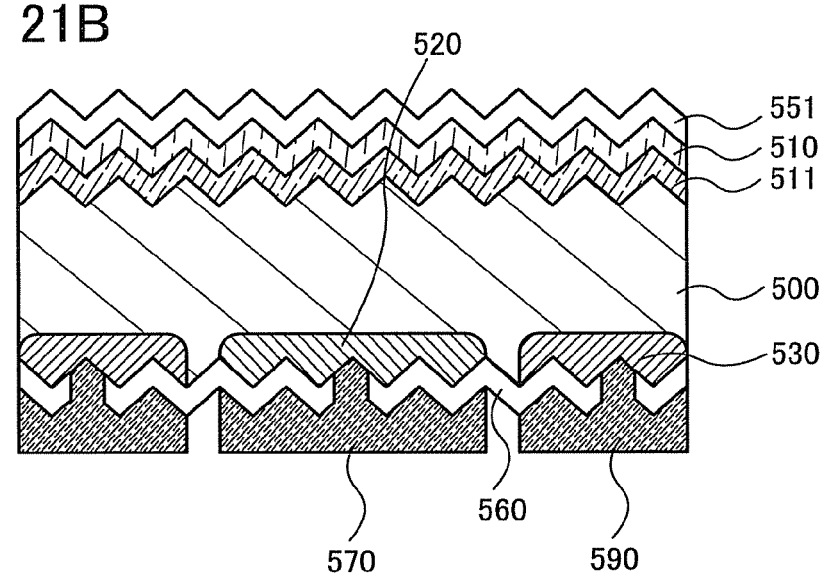

The oxide semiconductor layer 510 provided over the surface of the silicon substrate 500 can have a passivation effect of suppressing recombination of carriers by band bending in the vicinity where the oxide semiconductor layer 510 is connected to the silicon substrate 500 or by the potential barrier of the oxide semiconductor layer 510 itself. Further, as shown in FIG. 21B, a silicon oxide film layer 511 may be formed by a reaction caused at an interface between the oxide semiconductor layer 510 and the silicon substrate 500. The silicon oxide film layer 511 is interposed at the interface between the oxide semiconductor layer 510 and the silicon substrate 500, whereby a higher potential barrier is formed, so that a higher passivation effect can be obtained. Accordingly, the oxide semiconductor layer 510 can be used as a passivation film on the surface side of the photoelectric conversion device having a back contact structure.

The light-transmitting thin film 551 can be a single layer or a stacked layer of a silicon oxide film, a silicon nitride film, a silicon nitride oxide ($SiN_xO_y$ (x>y>0)) film, a silicon oxynitride ($SiO_xN_y$ (x>y>0)) film, a titanium oxide film, a zinc sulfide film, or a magnesium fluoride film. The light-transmitting thin film 551 is formed so as to serve as an antireflection film and thus is formed so as to reduce optical reflectance.

Figure 22A:
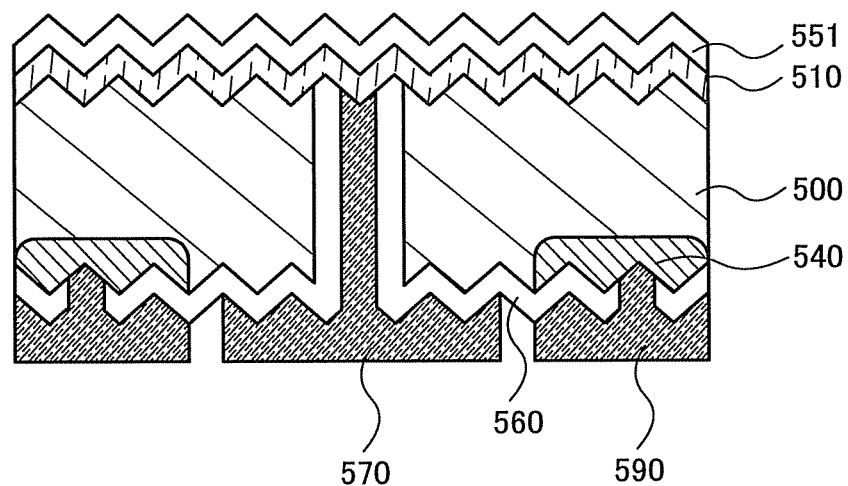
FIGS. 22A and 22B are cross-sectional views each showing a photoelectric conversion device according to one embodiment of the present invention.

The photoelectric conversion device shown in FIG. 22A includes the silicon substrate 500 having one conductivity type, and further includes, over one surface of the silicon substrate 500, the oxide semiconductor layer 510 having a conductivity type opposite to that of the silicon substrate 500, and the light-transmitting thin film 551 over the oxide semiconductor layer 510. Furthermore, the photoelectric conversion device includes, over the other surface of the silicon substrate 500, an impurity region 540 having the same conductivity type as the silicon substrate 500 and having a higher carrier concentration than the silicon substrate 500, a passivation layer 560 provided on a wall surface of an opening penetrating the silicon substrate 500, the first electrode 570 in contact with the oxide semiconductor layer 510 through the opening penetrating the silicon substrate 500, and the second electrode 590 in contact with the impurity region 540.

Figure 22B:
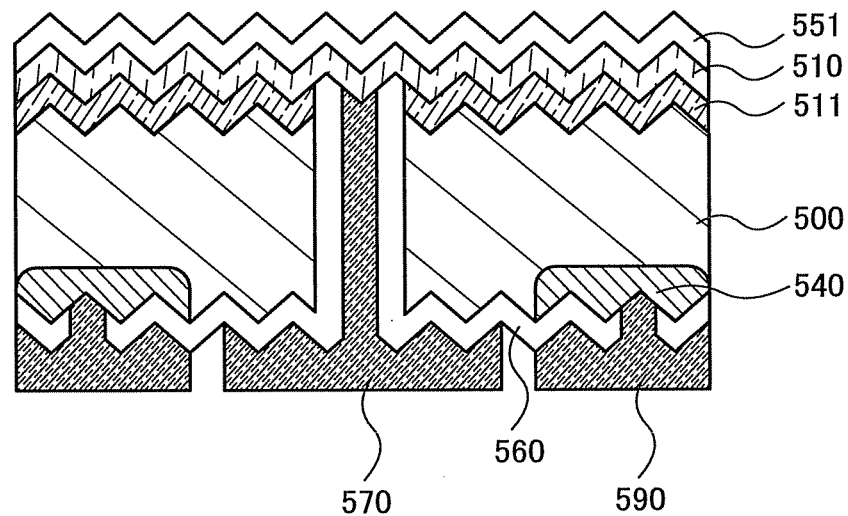

In the structures shown in FIGS. 22A and 22B, the oxide semiconductor layer 510 has a passivation effect of suppressing recombination of carriers at the surface of the silicon substrate 500 as in the structures shown in FIGS. 21A and 21B, and also has a function as a bonding layer which forms a bond with the silicon substrate 500. Further, the silicon oxide film layer 511 may be formed by a reaction caused at an interface between the oxide semiconductor layer 510 and the silicon substrate 500.

Note that the photoelectric conversion device may have a structure in which structures shown in FIGS. 21A and 21B and FIGS. 22A and 22B are combined as appropriate.

This embodiment can be freely combined with any of the other embodiments and an example.

Embodiment 7

In this embodiment, a photoelectric conversion device that is one embodiment of the present invention and a manufacturing method thereof is described.

Figure 23:
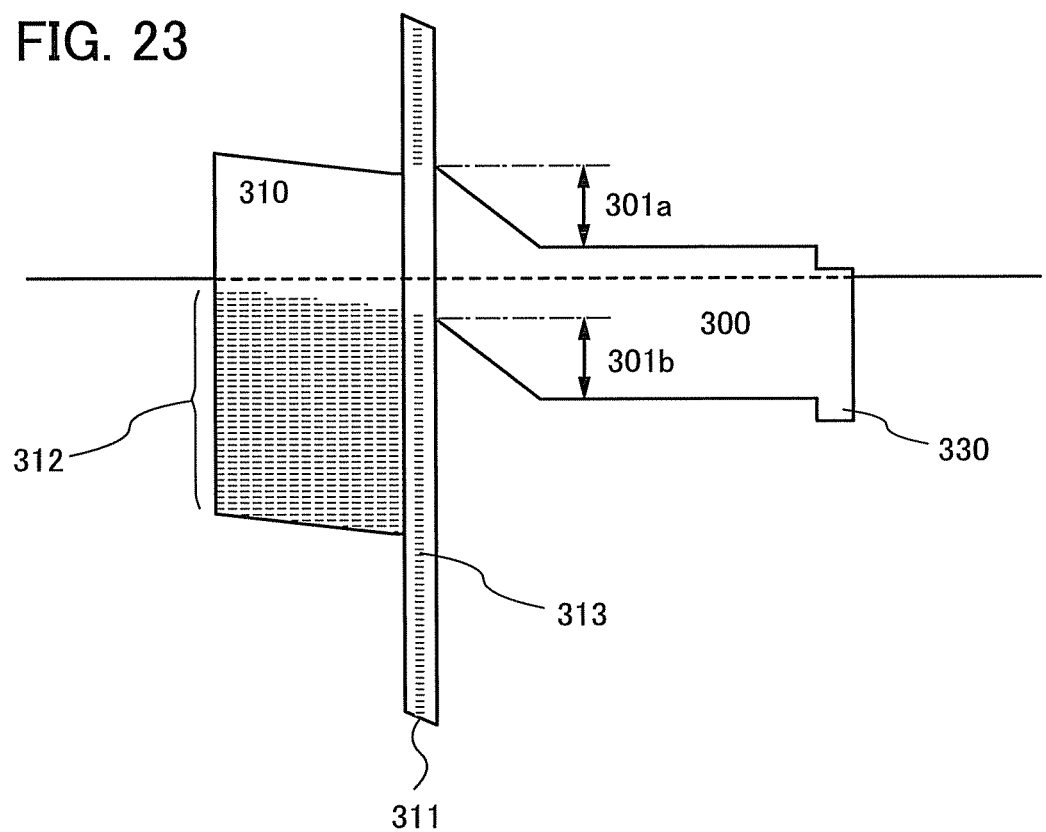
FIG. 23 is a view showing a band structure of a photoelectric conversion device.

The photoelectric conversion devices shown in FIGS. 16A and 16B described in Embodiment 4, as shown in the band diagram (see FIG. 23), has a p-n junction between the n-type silicon substrate 300 and the molybdenum oxide film that is the oxide semiconductor layer 310 having a higher work function than the silicon substrate 300 and having p-type conductivity. Further, a potential barrier is formed by band bending on the conduction side to which electrons are transferred. Furthermore, by the provision of the silicon oxide layer 311 in the p-n junction, potential barriers are formed on the conduction side to which electrons are transferred and the valence band to which holes are transferred. The silicon oxide layer 311 serves as a buffer layer to reduce lattice mismatch in bonding between the silicon substrate 300 and the oxide semiconductor layer 310. Since the potential barrier occurs on the valence band side from which hole current of the photocurrent is extracted, it is preferable that the silicon oxide layer 311 be extremely thin film for tunneling current conduction or have a conductivity level as a semiconductor with low insulating properties. When the silicon oxide layer 311 has low insulating properties, many energy levels 313 are formed in the band gap as shown in the figure; thus, photocurrent can be easily extracted by the conduction through the energy levels.

The energy level 312 in the energy band gap of the molybdenum oxide film can transfer holes. Further, the energy level 312 acts as an energy band as the valence band of the oxide semiconductor layer 110; therefore, the molybdenum oxide film can have p-type conductivity.

Figure 24:
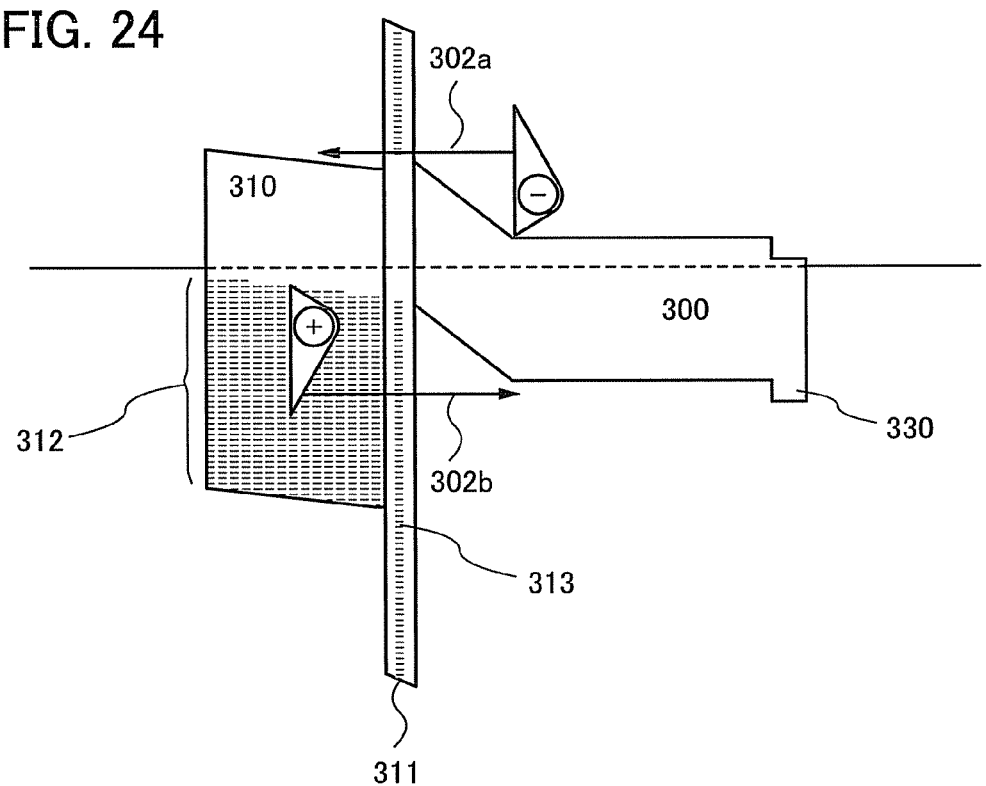
FIG. 24 is a view showing a band structure of a photoelectric conversion device.

Further, ionization potential of a molybdenum oxide film containing molybdenum trioxide ($MoO_3$) and molybdenum oxide $MoO_y$ (2<y<3)) having an intermediate composition of molybdenum dioxide and molybdenum trioxide at about 10% of the total composition is about 6.4 eV, and the work function is about 5.7 eV to 6.1 eV. Thus, as described above, a high potential barrier 301a can be formed on the conduction band side. The potential barrier 301a in an equilibrium state in the case where molybdenum oxide having the above-described structure and an n-type silicon substrate with an electric resistance of about 1 Ω·cm are used is about 1.4 eV to 1.8 eV, and an effective barrier height considering the maximum depletion layer capacity is approximately 0.66 eV. Accordingly, a thermal release current 302a due to electrons, which become a component of diode current as shown in FIG. 24 is not likely to flow. On the other hand, the potential barrier 301b on the valence band side is approximately 0.19 eV to 0.59 eV; that is, a diffusion current 302b due to holes is likely to flow.

In general, the control of the diode current enables a high open-circuit voltage (Voc) to be obtained theoretically. The relation between the diode current and the open voltage (Voc) can be simply represented by the following Formula 1. Here, k, T, q, $I_L$, and $I_{do}$ represent a Boltzmann's constant, a temperature, an elementary charge, a photocurrent, and a saturation current (or also referred to as basic current) in diode current, respectively.

$$V_{OC} = \frac{kT}{q}\ln\left(1 + \left|\frac{I_L}{I_{d0}}\right|\right)$$ [Formula 1]

In the photoelectric conversion devices having the structures shown in FIGS. 16A and 16B, the diffusion current due to holes, which is a component of the diode current, is large and thus it is an object to suppress the diffusion current due to holes to increase the open-circuit voltage.

Figure 25A:
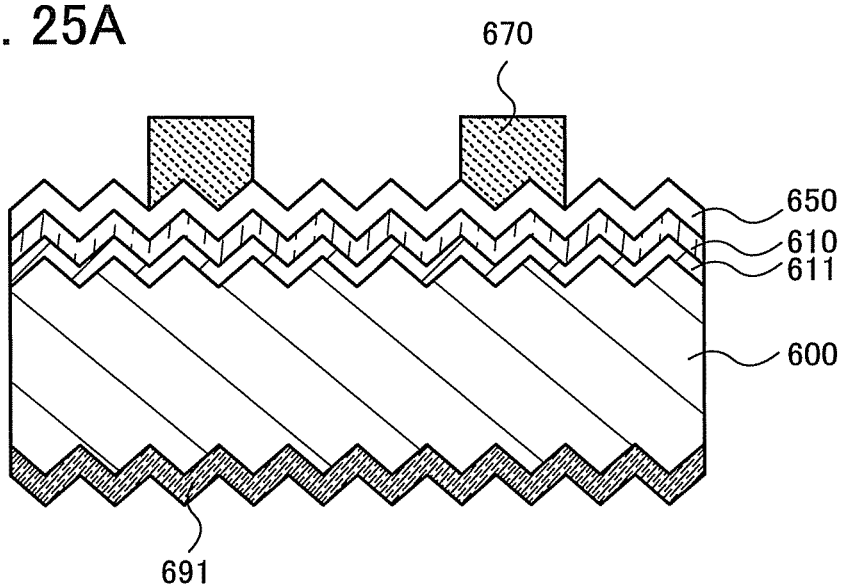
FIGS. 25A and 25B are cross-sectional views each showing a photoelectric conversion device.

FIG. 25A is a cross-sectional view of a photoelectric conversion device that is one embodiment of the present invention. The photoelectric conversion device includes an n-type silicon substrate 600, and further includes, over one surface of the silicon substrate 600, a silicon oxide layer 611, an oxide semiconductor layer 610 having p-type conductivity over the silicon oxide layer 611, a light-transmitting conductive film 650 on the oxide semiconductor layer 610, and a first electrode 670 on the light-transmitting conductive film 650. Furthermore, the photoelectric conversion device includes, over the other surface of the silicon substrate 600, a second electrode 691. Note that the first electrode 670 is a grid electrode, and a surface on the first electrode 670 side serves as a light-receiving surface. Note that the silicon oxide layer 611 is not necessarily provided.

The photoelectric conversion device shown in FIG. 25A does not have an impurity region which the photoelectric conversion devices in FIGS. 16A and 16B have as a BSF layer. The material of the second electrode 390 of the photoelectric conversion devices in FIGS. 16A and 16B is different from that of the second electrode 691 of the photoelectric conversion device in FIG. 25A. Except for the above, the photoelectric conversion device in FIG. 25A can be the same as either of the photoelectric conversion devices in FIGS. 16A and 16B.

A material having a lower work function than silicon can be used for the second electrode 691. Further, the work function of the second electrode 691 is preferably 4.6 eV or lower, more preferably 4.2 eV or lower. The second electrode preferably contains one or more conductor or semiconductor materials selected from Mg, MgO, MgAg, MgIn, AlLi, BaO, SrO, CaO, GdB, YB$_6$, LaB$_6$, Y, Hf, Nd, La, Ce, Sm, Ca and Gd. Alternatively, the second electrode 691 may have a structure in which the one or more conductor or semiconductor material is stacked with a low-resistance material such as Al or Ag. In addition, examples of the material with low work function include K, Rb, Sr, Ba, Eu, Lu, Th, U, and the like.

Figure 26:
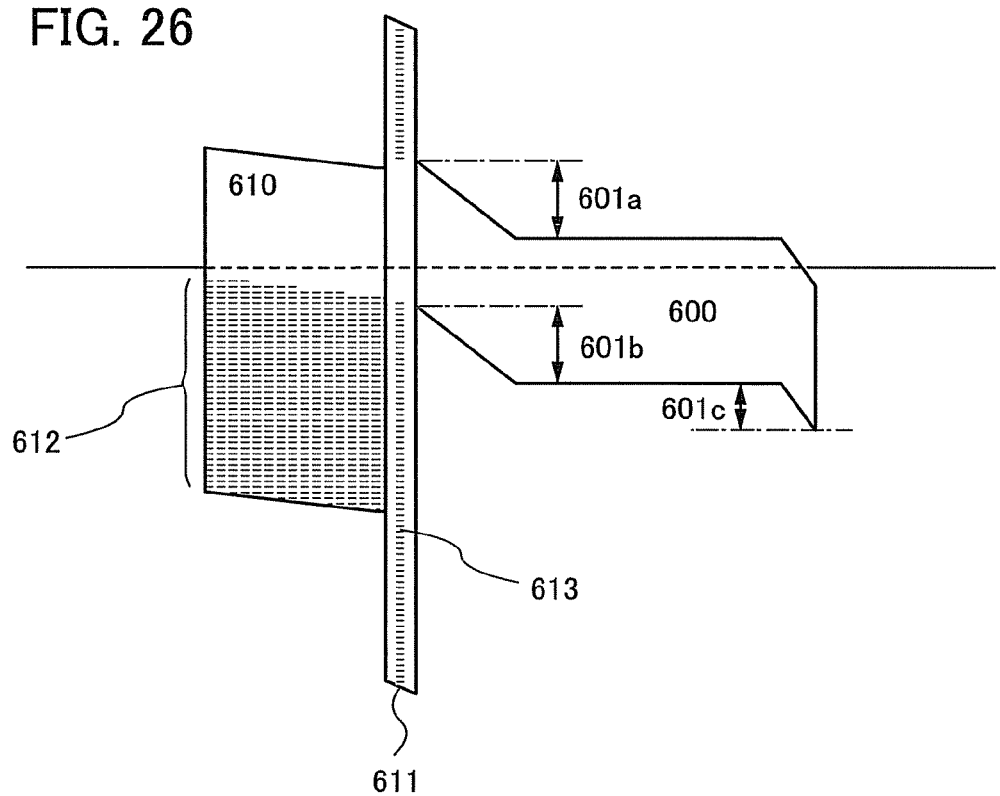
FIG. 26 is a view showing a band structure of a photoelectric conversion device.
Figure 27:
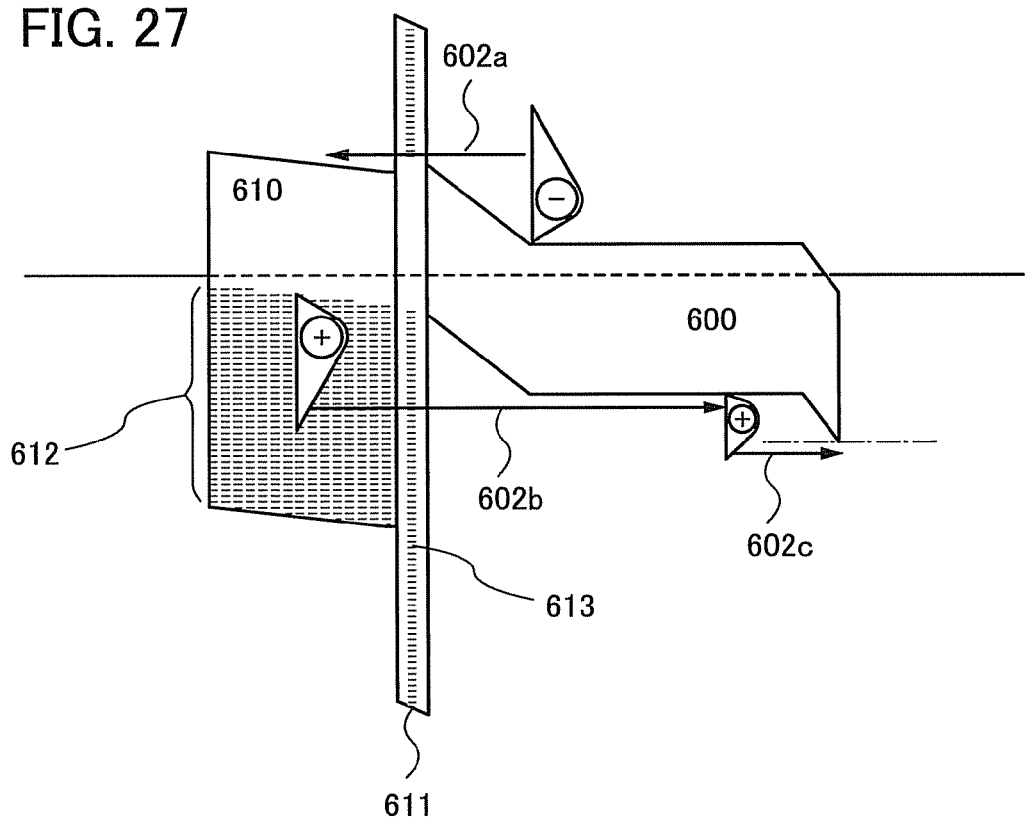
FIG. 27 is a view showing a band structure of a photoelectric conversion device.

By the use of such a material for the second electrode 691, the band structure shown in FIG. 26 can be obtained. Other than the potential barriers 601a and 601b formed at the interfaces with the silicon oxide layer 611, a potential barrier 601c for holes can be formed also at the interface with the second electrode 691. Thus, high potential barriers with respect to holes due to the potential barriers 601b and 601c can be obtained. Thus, the diffusion current 602b due to holes can be suppressed as shown in FIG. 27. That is, diode current corresponding to the sum of the thermal diffusion current 602a due to electrons and the diffusion current 602b due to holes can be suppressed, and a high open-circuit voltage can be obtained. Note that the potential barrier 601c for holes is a potential barrier formed by band bending in a direction where extraction of photocurrent flowing in the reverse direction to the diode current as a current in the first electrode 670 and the second electrode 691 is not hindered. Further, the energy levels 612 and 613 shown in FIG. 26 correspond to the energy levels 312 and 313 shown in FIG. 23.

Figure 33A:
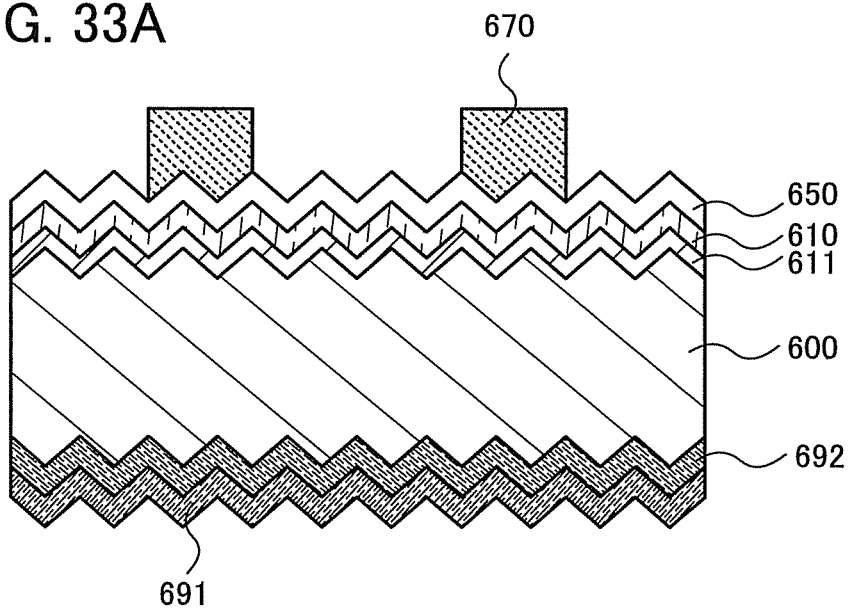
FIGS. 33A and 33B are cross-sectional views each showing a photoelectric conversion device.
Figure 33B:
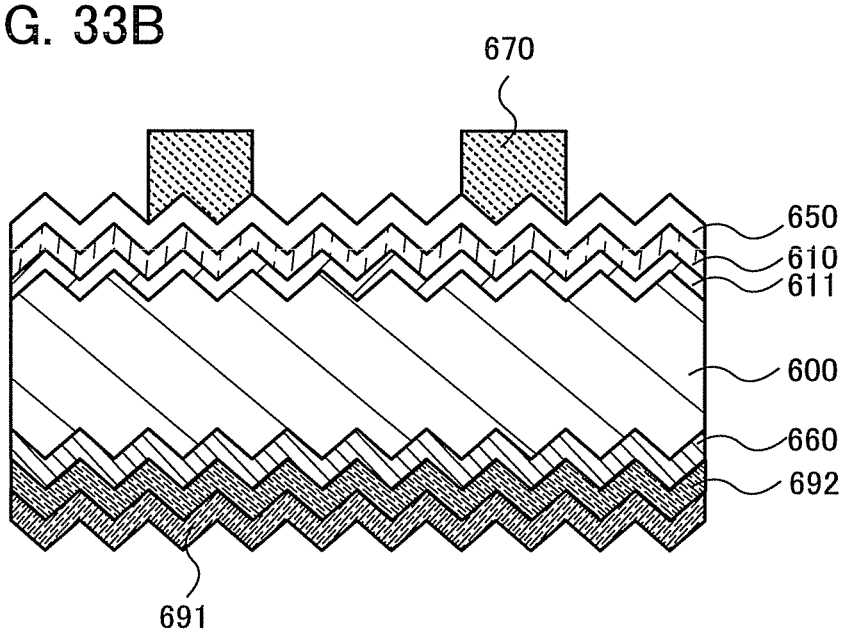

As shown in FIGS. 33A and 33B, a semiconductor region 692 that has a lower work function than silicon may be formed between the second electrode 691 and the silicon substrate 600. The work function of the semiconductor region 692 is preferably 4.6 eV or less, more preferably 4.2 eV or less. For example, the semiconductor region 692 can be formed using at least one of semiconductor materials selected from MgO, BaO, SrO, CaO, and the like. At this time, the second electrode 691 is preferably formed using a conductor of a low work function material as described above; however, the second electrode 691 is not necessarily formed using a low work function material and may be a low resistance metal such as Al or Ag.

The diffusion current ($I_{d,p}$) due to holes in a general diode like the photoelectric conversion devices in FIGS. 16A and 16B, is theoretically indicated by the following Formulae 2 and 3.

$$I_{d,p} = I_{d0,p}(\exp[qV/kT] - 1)$$ [Formula 2]

$$I_{d0,p2} = qA\frac{D_p}{L_p}p_{n0}\frac{\exp(W_n/L_p) + \exp(-W_n/L_p)}{\exp(W_n/L_p) - \exp(-W_n/L_p)}$$ [Formula 3]

Further, the diffusion current due to holes in the photoelectric conversion device shown in FIG. 25A is indicated by Formula 4.

$$I_{d0,p1} = \qquad\qquad\qquad\qquad\qquad\text{[Formula 4]}$$
$$qA\frac{D_p}{L_p}p_{n0}\frac{\exp((W_n - L_B)/L_p) - \exp(-(W_n - L_B)/L_p)}{\exp((W_n - L_B)/L_p) + \exp(-(W_n - L_B)/L_p)} -$$
$$\frac{2\{I_{n \to m}/(\exp[qV/kT] - 1)\}}{\exp((W_n - L_B)/L_p) + \exp(-(W_n - L_B)/L_p)}$$

Here, $I_{d,p}$ is a diffusion current due to holes; $i_{d0,p}$ is a saturation current in the diffusion current due to holes; q is an elementary charge; A is an area; $D_p$ is a hole diffusion coefficient; $L_p$ is a hole diffusion length; $P_{n0}$ is a hole density in an n-type silicon substrate in equilibration time; $W_n$ is a thickness of the n-type silicon substrate; $L_B$ is a back surface band bending width; $I_{n \to m}$ is a hole current passing through the valence band barrier at the back surface of the silicon substrate; V is a potential difference between the oxide semiconductor layer and the silicon substrate; k is a Boltzmann's constant; and T is a temperature.

The Formula 4 can be derived by solving a current continuity equation on the basis of a boundary condition in which the hole current 602c (see FIG. 27) crossing the hole barrier of the valence band on the back surface side of the silicon substrate is set to $I_{n \to m}$.

It is not easy to obtain a correct solution of the $I_{n \to m}$ that is the hole current 602c in the Formula 4; however, an approximate value can be obtained. The $I_{n \to m}$ can be considered as the sum of amounts of changes of thermally released current $I_{n \to m}^{Thermonic}$ due to holes that are minority carrier of the n-type silicon substrate and tunnel-current $I_{n \to m}^{Tunnel}$ which flows through the potential barrier of the valence band due to the back surface band bending each from the state of equilibrium.

$$I_{n \to m} = (I_{n \to m}^{Thermonic}(P_n(x), V_B) - I_{n \to m}^{Thermonic}(P_{n0}, 0))|_{x=W_n-L_B} + \quad \text{[Formula 5]}$$
$$(I_{n \to m}^{Tunnel}(P_n(x), V_B) - I_{n \to m}^{Tunnel}(P_{n0}, 0))|_{x=W_n-L_B}$$

The thermally released current $I_{n \to m}^{Thermonic}$ ($P_n$, $V_B$) due to holes is obtained in such a manner that hole distribution in the vicinity of the back surface of the silicon substrate is obtained by multiplying Maxwell-Bolzman rate distribution and a hole rate and then the obtained value is integrated by a rate higher than a hole rate where holes can cross the hole barrier due to the back surface band bending, which is represented by Formula 6.

$$I_{n \to m}^{Thermonic}(P_n, V_B) = qAp_n(kT/2\pi m_h^*)^{1/2}\exp[-q(\phi_{n-m}-V_B)/kT] \quad \text{[Formula 6]}$$

The tunneling current $I_{n \to m}^{Tunnel}$ ($P_n$, $V_B$) due to holes which flows through the potential barrier of the valence band due to the back surface band bending can be obtained by multiplying thermal emission current due to holes by the probability that the holes flows through the potential barrier of the valence band and integrating the formula, which is represented by Formula 7. It is difficult to obtain analytic tunneling probability of the potential barrier of the valence band that is bent by the back surface band bending; however, Formula 7 that is an approximate solution of the tunneling probability can be obtained by calculation using Wentzel-Kramers-Brillouin approximation while bending of the band is considered as a triangular potential approximated by a linear function.

$$I_{n \to m}^{Tunnel}(P_n, V_B) = \frac{qAp_n}{(2\pi m_h^* kT)^{1/2}} \exp\left[-\frac{4}{3}\frac{L_B\sqrt{2m_h^*}}{\hbar q(\phi_{n-m}-V_B)}\right] \times \left[\frac{1}{kT}+\frac{3}{2}\{q(\phi_{n-m}-V_B)\}^{1/2}\right]^{-1} \quad \text{[Formula 7]}$$

Here, $I_{n \to m}^{Thermonic}$ ($P_n$, $V_B$) is a thermally released current due to holes which pass through the valence band barrier when the hole carrier density and the potential are $P_n$ and $V_B$, respectively; $I_{n \to m}^{Tunnel}$ ($P_n$, $V_B$) is a hole current that flows through the valence band barrier when the hole carrier density and the potential are $P_n$ and $V_B$, respectively; $m_h^*$ is hole effective mass of the silicon substrate; $V_B$ is a potential difference between the silicon substrate and the second electrode; $\phi_{n-m}$ is a difference in work functions between the silicon substrate and the second electrode; and x is a position in a film-thickness direction of the silicon substrate.

Note that the second term of the right side of Formula 4, which is described above, is a term to decrease $I_{d0,p1}$ and a magnitude relation of the Formula 8 is established; thus, it can be said that the first term of the right side of the Formula 4 exhibits a smaller current value than $I_{d0,p1}$ in Formula 3.

$$\frac{\exp(W_n/L_p)+\exp(-W_n/L_p)}{\exp(W_n/L_p)-\exp(-W_n/L_p)} \geq \quad \text{[Formula 8]}$$
$$\frac{\exp(W_n/L_p)-\exp(-W_n/L_p)}{\exp(W_n/L_p)+\exp(-W_n/L_p)}$$

Thus, the relation of $I_{d0,p1} \leq I_{d0,p2}$ where the saturation current value in Formula 4 is smaller than that in Formula 3 can be established. Thus, by the use of the photoelectric conversion devices of embodiments of the present invention in FIGS. 25A and 25B, the diffusion current due to holes can be suppressed than in the cases of using the photoelectric conversion devices in FIGS. 16A and 16B. Further, as seen from Formula 1, the open-circuit voltage can be improved.

In the photoelectric conversion device of one embodiment of the present invention, the open-circuit voltage can be improved by suppression of the diffusion current due to holes and generation of voltage not only at the light-receiving surface but also at the other surface.

Figure 25B:
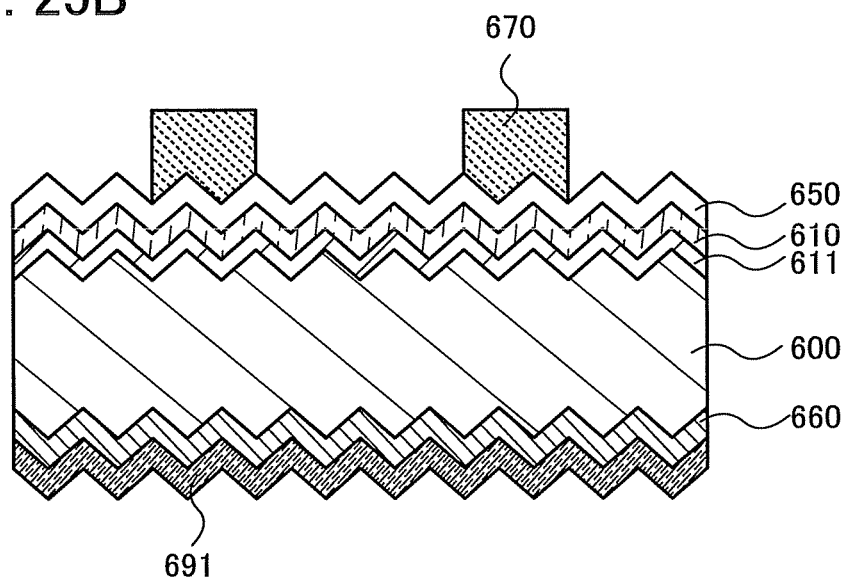

Further, the photoelectric conversion device of one embodiment of the present invention may have a structure shown in FIG. 25B. The photoelectric conversion device in FIG. 25B has a structure in which an impurity semiconductor region 660 is added to the structure of the photoelectric conversion device in FIG. 25A. By the addition of the impurity semiconductor region 660, the band bending width can be enlarged and potential barrier 601c for holes can be enhanced, so that the diffusion current 602b due to holes can be easily controlled.

Note that the impurity semiconductor region 660 may be a region with a lower carrier concentration than the silicon substrate 600. The impurity semiconductor region 660 can be formed by addition of an impurity imparting the conductivity type opposite to the silicon substrate 600, for example. Alternatively, the impurity semiconductor region 660 can be formed by formation of a silicon film having a lower carrier concentration than the silicon substrate 600. It is desirable that the thickness of the impurity semiconductor region 660 be thinner than the width of the depletion layer due to band bending. It is preferable that band bending occur over all the width of the impurity semiconductor region 660 because extraction of photocurrent is not hindered.

Note that the impurity semiconductor region 660 may be a back surface field (BSF) layer, which has the same conductivity type as the silicon substrate 600 and has a higher carrier concentration than the silicon substrate 600. By the provision of the BSF layer, an n-n$^+$ junction or a p-p$^+$ junction is formed. Accordingly, a potential barrier due to band bending can be formed. In addition, a potential barrier due to band bending caused by the second electrode 691 formed of a material with a low work function is obtained and recombination of minority carriers in the vicinity of the second electrode 691 can be obtained, so that the diffusion current due to holes can be suppressed.

Figure 28A:
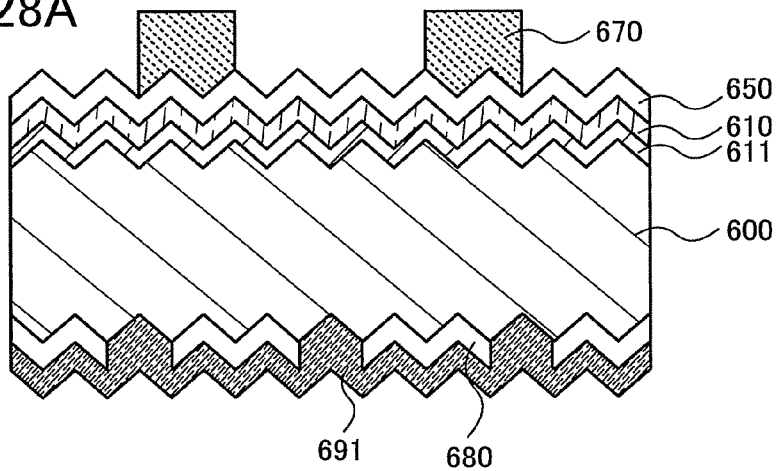
FIGS. 28A to 28C are cross-sectional views each showing a photoelectric conversion device.
Figure 28B:
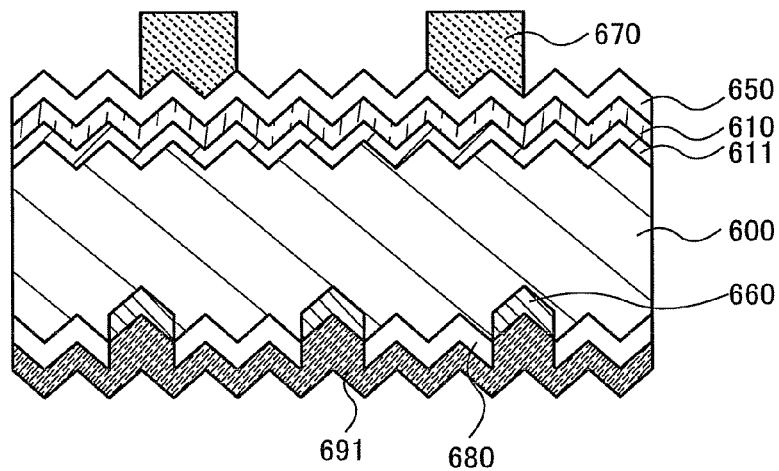

Further, the photoelectric conversion device of one embodiment of the present invention may have any structures shown in FIGS. 28A, 28B and, 28C. The photoelectric conversion device shown in FIGS. 28A, 28B and, 28C each have the silicon substrate 600 having n-type conductivity, and further includes, over one surface of the silicon substrate 600, the oxide semiconductor layer 610 having p-type conductivity, the light-transmitting conductive film 650 over the oxide semiconductor layer 610, and the first electrode 670 over the light-transmitting conductive film 650. Furthermore, the photoelectric conversion device includes, over the other surface of the silicon substrate 600, the passivation layer 680, and the second electrode in contact with the silicon substrate 600.

The passivation layer 680 can be formed of an insulating film such as a silicon oxide film, a silicon nitride film, a silicon nitride oxide ($SiN_xO_y$ (x>y>0)) film, a silicon oxynitride ($SiO_xN_y$ (x>y>0)) film, or an aluminum oxide film. Provision of the passivation layer 680 enables recombination of minority carriers on the back surface of the silicon substrate 600 to be reduced, so that output voltage of the photoelectric conversion device in power generation can be improved. Further, the use of a film formed of a material having a lower refractive index than the silicon substrate as the passivation layer 680, reflectance at the back surface of the silicon substrate can be increased. Thus, open-circuit voltage of the photoelectric conversion device as described above can be improved, and further output current in power generation can also be improved.

Figure 28C:
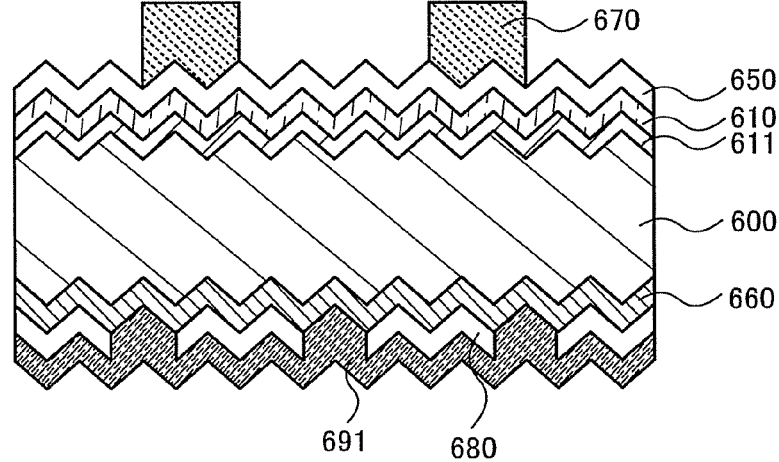
Figure 29A:
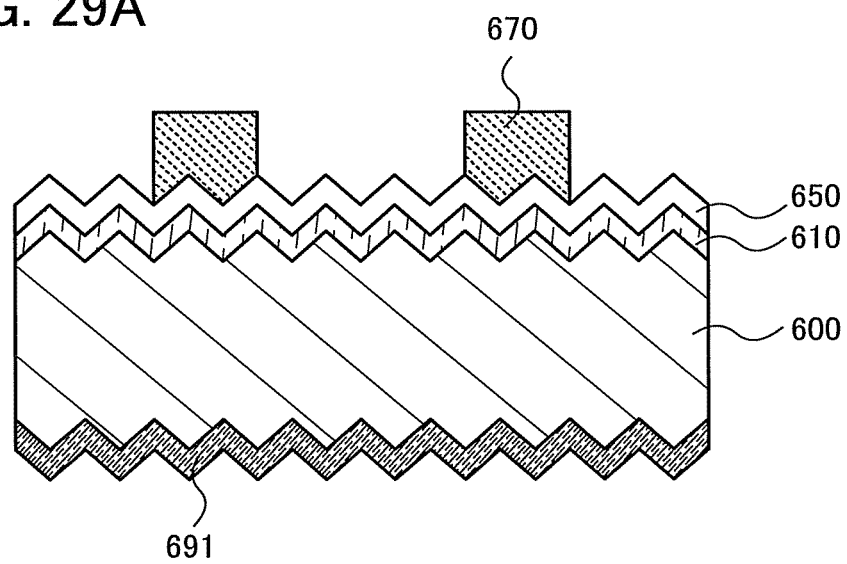
FIGS. 29A and 29B are cross-sectional views each showing a photoelectric conversion device.
Figure 29B:
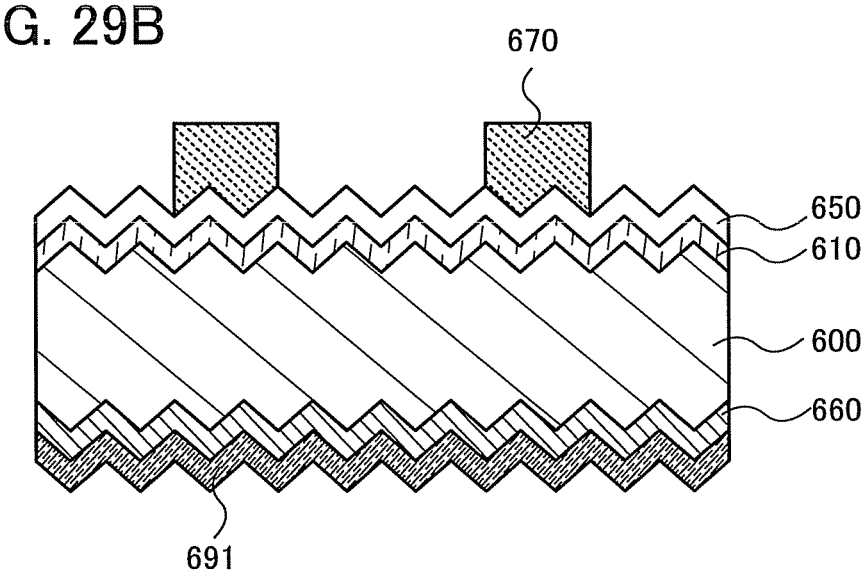
Figure 30A:
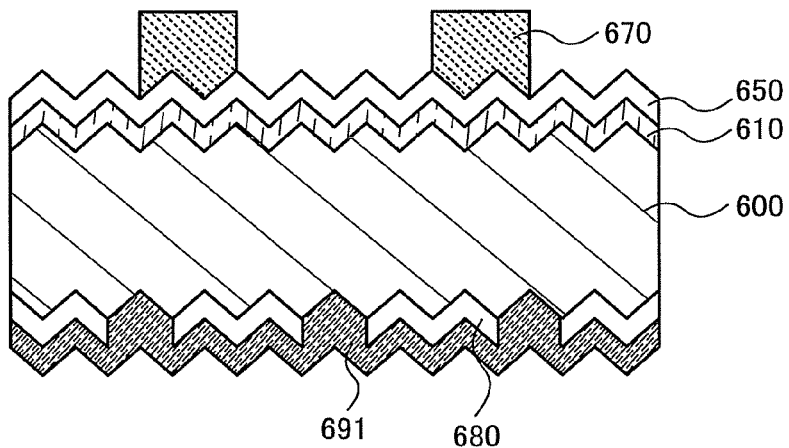
FIGS. 30A to 30C are cross-sectional views each showing a photoelectric conversion device.
Figure 30B:
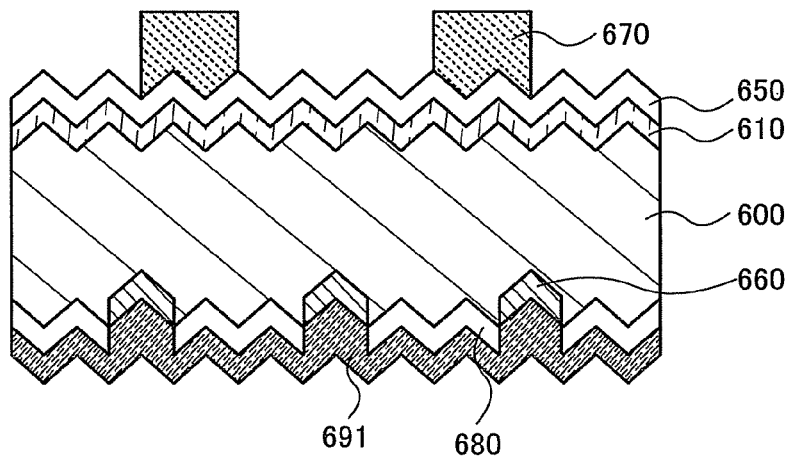
Figure 30C:
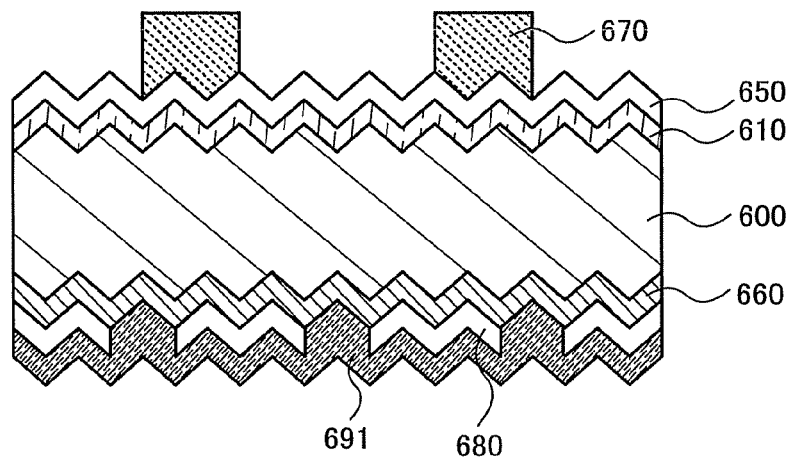

The photoelectric conversion device shown in FIG. 28A has a structure in which the silicon substrate 600 is in contact with the second electrode 691 in the openings in the passivation layer 680. Further, the photoelectric conversion device shown in FIG. 28B has a structure in which the impurity semiconductor region 660 is provided only in the vicinity of the openings in the passivation layer 680, and the impurity semiconductor region 660 is in contact with the second electrode 691 in the openings. In the photoelectric conversion device with the structure shown in FIG. 28B, as in the case of the photoelectric conversion device shown in FIG. 25B, the diffusion current 602b due to holes can be easily controlled by the provision of the impurity semiconductor region 660. Further, the photoelectric conversion device shown in FIG. 28C has a structure in which the impurity semiconductor region 660 is provided for the other surface of the silicon substrate 600, which is opposite to the light-receiving surface and the impurity semiconductor region 660 is in contact with the second electrode 691 in the openings. In the photoelectric conversion device with the structure shown in FIG. 28C, as in the case of the photoelectric conversion device in FIG. 25C, band bending is obtained in the silicon substrate 600 and the impurity semiconductor region 660 with passivation layer 680 interposed therebetween, whereby the diffusion current 602b due to holes can be suppressed.

In each of the photoelectric conversion devices having the structures shown in FIG. 25A and FIG. 28A, the conductivity type of the silicon substrate 600 is not necessarily n-type and may be i-type. The carrier concentration of the silicon substrate itself of the photoelectric conversion layer is made low, so that potential barrier for holes on the back surface of the silicon substrate and band bending width can be easily obtained although the potential barrier for electrons on the surface of the silicon substrate is lowered. Further, with the use of an i-type silicon substrate, a diffusion length can be increased because the carrier concentration is extremely low. Accordingly, overall diode current including thermal release current due to electrons and the diffusion current due to holes can be reduced, and voltage can be generated by photovoltaic power both at the junction between the oxide semiconductor layer 610 and the silicon substrate 600 and the junction between the silicon substrate 600 and the second electrode 691.

A plurality of oxides is mixed to the oxide semiconductor layer 610, whereby the conductivity type can be changed. For example, molybdenum oxide is formed to have a mixed composition including molybdenum trioxide ($MoO_3$) and molybdenum oxide ($MoO_y$, ($2<y<3$)) having an intermediate composition between molybdenum dioxide and molybdenum trioxide, so that p-type conductivity can be provided. The mixed composition contains $MoO_y$ ($2<y<3$) at 4% or more, so that a p-type semiconductor with a high carrier concentration can be obtained. Note that the term "p-type conductivity" herein means that the Fermi level is closer to the valence band than to the conduction band, holes that are p-type carriers can be transferred, and current-voltage (I-V) characteristics of an element connected to a semiconductor material having n-type conductivity exhibit rectifying properties by band bending due to the difference in work functions caused when the material having p-type conductivity is bonded to a semiconductor material having n-type conductivity.

Examples of the above-described molybdenum oxide ($MoO_y$, ($2<y<3$)) having an intermediate composition between molybdenum dioxide and molybdenum trioxide include $Mo_2O_5$, $Mo_3O_8$, $Mo_8O_{23}$, $Mo_9O_{26}$, $Mo_4O_{11}$, $Mo_{17}O_{47}$, $Mo_5O_{14}$, and the one which has an intermediate composition between $MoO_2$ and $MoO_3$ due to a deficiency of a part of oxygen atoms in $MoO_3$. These can be formed by reduction of a part of $MoO_3$ that is used as a raw material.

Further, the molybdenum oxide film has a high passivation effect and can reduce defects on a surface of silicon, which can improve the lifetime of carriers.

Further, as shown in FIGS. 29A and 29B and FIGS. 30A, 30B, and 30C, the photoelectric conversion device of one embodiment of the present invention does not necessarily have the silicon oxide layer 611. When the silicon oxide layer 611 is not formed and surface recombination at the interface between the silicon substrate 600 and the oxide semiconductor layer 610 is suppressed, voltage drop by the resistance of the silicon oxide layer 611 can be reduced and output can be improved.

As for the method for manufacturing the photoelectric conversion device shown in FIG. 25A, the methods for manufacturing the photoelectric conversion devices shown in FIGS. 16A and 16B described in Embodiment 4 can be referred to. Note that the second electrode 691 formed over the other surface of the silicon substrate 600 preferably contains at least one of Mg, MgO, MgAg, MgIn, AlLi, BaO, SrO, CaO, GdB, $YB_6$, $LaB_6$, Y, Hf, Nd, La, Ce, Sm, Ca, and Gd. The second electrode 691 formed using any one of the materials can be formed by a sputtering method, an evaporation method, or the like. Further, the second electrode 691 may have a structure in which the above material and a low-resistant material such as Al and Ag or a conductive resin such as a silver paste are stacked.

In order to form the photoelectric conversion device having the structure shown in FIG. 33A, the semiconductor region 692 is formed before the formation of the second electrode 691. The semiconductor region 692 can be formed using one or more of semiconductor materials selected from MgO, BaO, SrO, and CaO. At this time, the second electrode 691 is formed using one or more of conductors selected from Al, Ag, Mg, MgAg, MgIn, AlLi, GdB, $YB_6$, $LaB_6$, Y, Hf, Nd, La, Ce, Sm, Ca, and Gd.

In order to form the photoelectric conversion device having the structure shown in FIG. 33B, before the formation of the second electrode 691, an impurity imparting the conductivity type opposite to the silicon substrate 600 is diffused to the other surface of the silicon substrate 600 so that the impurity semiconductor region 660 is formed, and then the semiconductor region 692 is formed. For the impurity semiconductor region 660, for example, boron, aluminum, gallium, or the like is diffused. Alternatively, the impurity semiconductor region 660 may be formed in such a manner that n⁻-type or p⁻-type amorphous silicon film or microcrystalline silicon film is formed over the other surface of the silicon substrate 600 by a plasma CVD method or the like. Further, i-type amorphous silicon film or microcrystalline silicon film may be used instead of the impurity semiconductor region 660. The semiconductor region 692 can be formed using one or more of semiconductor materials selected from MgO, BaO, SrO, and CaO. At this time, the second electrode 691 can be formed using one or more of conductors selected from Al, Ag, Mg, MgAg, MgIn, AlLi, GdB, $YB_6$, $LaB_6$, Y, Hf, Nd, La, Ce, Sm, Ca, and Gd.

This embodiment can be freely combined with any of other embodiments.

Embodiment 8

The above-described oxide semiconductor materials are applicable to various semiconductor devices such as a transistor, a diode, a photoelectric conversion device, an electro-optical device, a light-emitting display device, a memory device, an imaging device, a semiconductor circuit, and an electronic device by making a bond with a metal, an i-type semiconductor material, or an n-type semiconductor material. For example, a p-channel type transistor can be formed by the use of the oxide semiconductor material to a channel region of the transistor. Further, a p-i junction device, a p-i-n junction device, a p-n junction device, and the like can be formed by the combination of the oxide semiconductor material with an i-type semiconductor layer and/or an n-type semiconductor layer. By the use of the oxide semiconductor material, photoelectric characteristics and/or electric characteristics which are different from those in the case of using a silicon-based semiconductor material can be formed. Thus, various advantages of a semiconductor device such as improved electric characteristics, improved reliability, and lower power consumption can be obtained. In this embodiment, the cases where the semiconductor device is applied to electronic devices are described with reference to FIGS. 31A to 31F. Specifically, in this embodiment, the cases where the semiconductor device is applied to an electronic device such as a computer, a mobile phone (this may be also called a cellular phone or a portable phone device), a personal digital assistant (PDA; including a portable game device and a sound player, etc.), a digital camera, a digital video camera, an electronic paper, and a television device (this can be also called a television or a television receiver) are described.

Figure 31A:
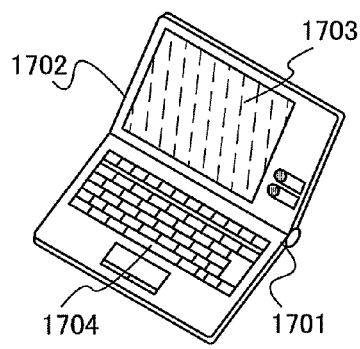
FIGS. 31A to 31F show electronic devices.

FIG. 31A is a laptop personal computer including a housing 1701, a housing 1702, a display portion 1703, a keyboard 1704, and the like. At least one of semiconductor devices provided in the housing 1701 and the housing 1702 is formed using the semiconductor device of one embodiment of the present invention.

Figure 31D:
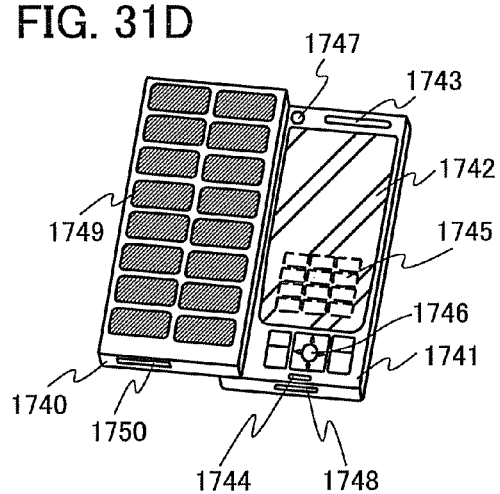
Figure 31B:
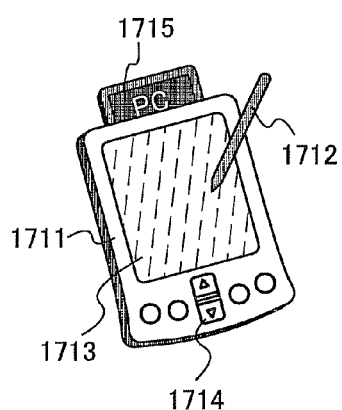

FIG. 31B illustrates a personal digital assistant (PDA) in which a main body 1711 is provided with a display portion 1713, an external interface 1715, operation buttons 1714, and the like. Further, a stylus 1712 for operation of the personal digital assistant, and the like are provided. A semiconductor device provided in the main body 1711 is formed using the semiconductor material of one embodiment of the present invention.

Figure 31E:
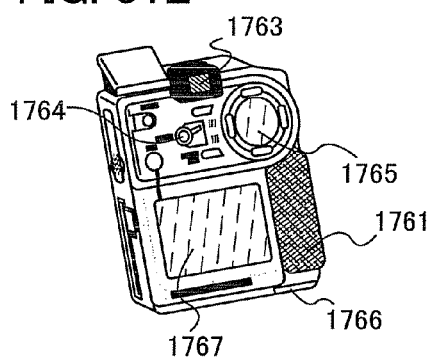
Figure 31C:
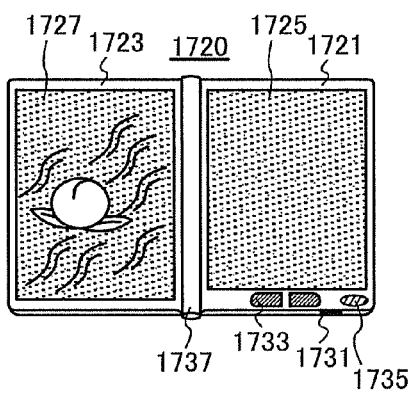

FIG. 31C is an e-book reader 1720 mounted with electronic paper, which includes two housings, a housing 1721 and a housing 1723. The housing 1721 and the housing 1723 are provided with a display portion 1725 and a display portion 1727, respectively. The housing 1721 is connected to the housing 1723 by a hinge 1737, so that the e-book reader can be opened and closed using the hinge 1737 as an axis. The housing 1721 is provided with a power switch 1731, an operation key 1733, a speaker 1735, and the like. At least one of semiconductor devices provided in the housing 1721 and the housing 1723 is formed using the semiconductor material of one embodiment of the present invention.

FIG. 31D is a mobile phone including two housings, a housing 1740 and a housing 1741. Further, the housings 1740 and 1741 in a state where they are developed as illustrated in FIG. 31D can shift by sliding to a state where one is lapped over the other; therefore, the size of the mobile phone can be reduced, which makes the mobile phone suitable for being carried. The housing 1741 includes a display panel 1742, a speaker 1743, a microphone 1744, a touch panel 1745, a pointing device 1746, a camera lens 1747, an external connection terminal 1748, and the like. The housing 1740 includes a solar cell 1749 for charging the mobile phone, an external memory slot 1750, and the like. In addition, an antenna is incorporated in the housing 1741. At least one of semiconductor devices provided in the housings 1740 and 1741 can be formed using the oxide semiconductor material of one embodiment of the present invention.

FIG. 31E is a digital camera including a main body 1761, a display portion 1767, an eyepiece 1763, an operation switch 1764, a display portion 1765, a battery 1766, and the like. At least one of semiconductor devices provided in the housing 1761 can be formed using an oxide semiconductor material of one embodiment of the present invention.

Figure 31F:
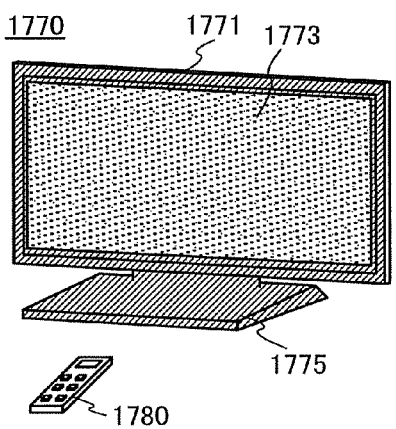

FIG. 31F is a television device including a housing 1771, a display portion 1773, a stand 1775, and the like. The television device can be operated by an operation switch of the housing 1771 or a remote controller 1780. At least one of semiconductor devices provided in the housing 1771 and the remote controller 1780 can be formed using an oxide semiconductor material of one embodiment of the present invention.

This embodiment can be implemented in appropriate combination with the structures described in the other embodiments.

Example 1

In this example, electric characteristics of a diode element which was formed using a molybdenum oxide film ($MoO_3$+$MoO_y$, ($2<y<3$)) of one embodiment of the present invention is described.

A diode was formed using the molybdenum oxide film containing $MoO_3$+$MoO_y$ ($2<y<3$) the detail of which is described in Embodiment 1, and electric characteristics were evaluated. The conductivity type of the molybdenum oxide film can be seen from current-voltage (I-V) characteristics of the diode formed by the connection with a silicon substrate which has different conductivity type and carrier concentration from the molybdenum oxide film.

The manufactured diode element includes a single crystal silicon substrate having one conductivity type, a molybdenum oxide film formed over one surface of the single crystal silicon substrate, an amorphous silicon film formed over the other surface of the single crystal silicon substrate and having the same conductivity as the single crystal silicon substrate, an aluminum electrode formed over the molybdenum oxide film, and an aluminum electrode formed over the amorphous silicon film.

For the single crystal silicon substrate, two kinds of substrates, an n-type single crystal silicon substrate to which phosphorus (P) was added as an impurity imparting n-type conductivity and a p-type single crystal silicon substrate to which boron (B) was added as an impurity imparting p-type conductivity were used.

The molybdenum oxide film was formed with a thickness of 50 nm by the method described in Embodiment 1.

The amorphous silicon film was formed by a plasma CVD method. In the case of using an n-type single crystal silicon substrate, n-type amorphous silicon is formed. In the case of using a p-type single crystal silicon substrate, p-type amorphous silicon was formed. The n-type amorphous silicon was formed by plasma-exciting a gas in which monosilane ($SiH_4$) and hydrogen-diluted phosphine ($PH_3$) were mixed. The p-type amorphous silicon was formed by plasma-exciting a gas in which monosilane (SiH$_4$) and hydrogen-diluted diborane gas (B$_2$H$_6$) were mixed. Note that the amorphous silicon film was formed so that schottky junction was not formed between the single crystal silicon and a metal electrode in the diode element to be formed and a carrier concentration was higher than the single crystal silicon to form an ohmic junction. Thus, a region in which an impurity having the same conductivity as the silicon substrate is thermally diffused to the single crystal silicon substrate may be provided in addition to the amorphous silicon film. Here, an amorphous silicon film having the same conductivity as the silicon film, which has a thickness of 10 nm, was used.

The aluminum electrode formed over the molybdenum oxide film and the aluminum electrode formed over the amorphous silicon film were formed by an evaporation method using resistance heating.

Through the above method, the diode was formed by the bond of the molybdenum oxide film and the single crystal silicon substrate. As the electric characteristics of the manufactured diode, I-V characteristics were measured by the application of voltage to the electrode on the molybdenum oxide side using the electrode on the single crystal silicon side as a ground.

Figure 4A:
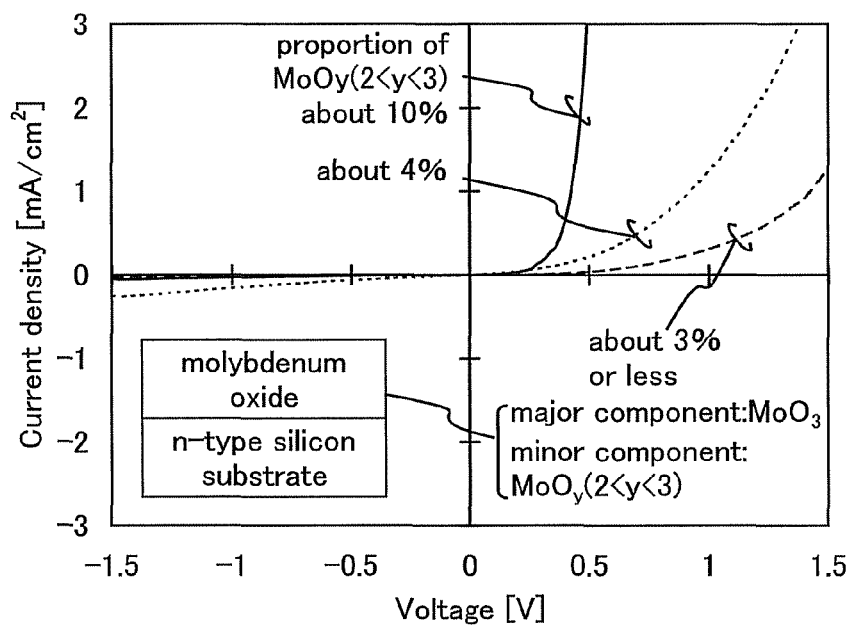
FIGS. 4A and 4B each show characteristics of a diode in which molybdenum oxide and a silicon substrate are bonded to each other.
Figure 4B:
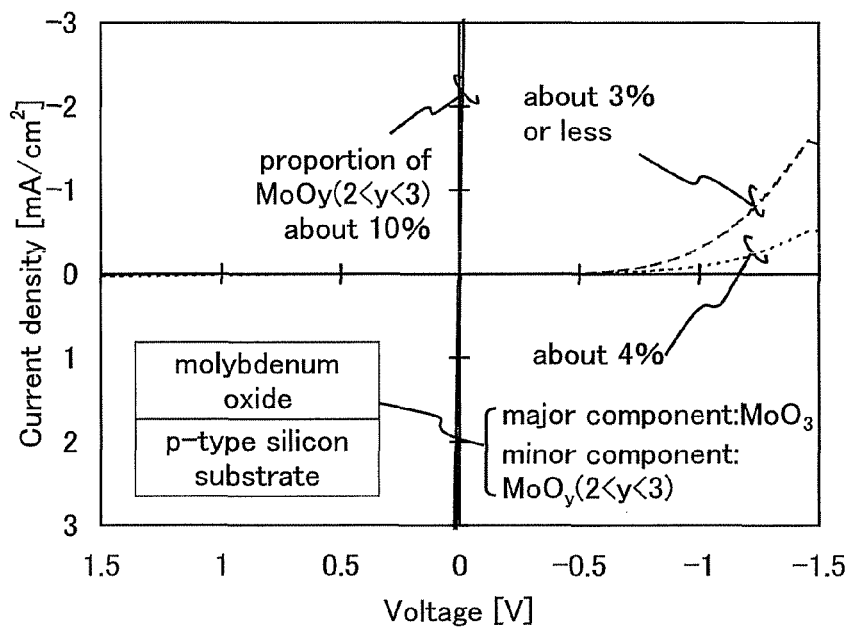

FIG. 4A shows I-V characteristics of an element in which a molybdenum oxide film is formed over an n-type silicon substrate. FIG. 4B shows I-V characteristics of an element in which a molybdenum oxide film is formed over a p-type silicon substrate. The molybdenum oxide film has a mixed composition containing MoO$_3$ and MoO$_y$ (2<y<3).

The elements using the molybdenum oxide films in each of which the proportion of MoO$_y$ (2<y<3) is about 3% or less exhibit rectifying properties both in FIGS. 4A and 4B. On the other hand, the elements using the molybdenum oxide films in each of which the proportion of MoO$_y$ (2<y<3) is about 4% or more exhibit rectifying properties in FIG. 4A and ohmic properties in FIG. 4B.

Thus, it can be said that in the case of using the molybdenum oxide film containing about 4% or more of MoO$_y$ (2<y<3), a p-n junction is formed in the case where the molybdenum oxide film is bonded to the n-type silicon substrate and a p-p junction is formed in the case where the molybdenum oxide film is bonded to the p-type silicon substrate.

The molybdenum oxide film in which the proportion of MoO$_y$ (2<y<3) is about 4% or more exhibits rectifying properties only in the case of being bonded to the n-type silicon substrate even in a heterojunction, so that it is turned out that the molybdenum oxide film is a film having p-type conductivity with highly concentrated carriers.

The molybdenum oxide in which the proportion of MoO$_y$ (2<y<3) is about 3% or less has a heterojunction with different band gaps; thus exhibiting rectifying properties both in the case of using an n-type silicon substrate and p-type silicon substrate. Thus, it is difficult to identify whether the Fermi level lies closer to the valence band side or the conduction band side. That is, in the molybdenum oxide in which the proportion of MoO$_y$ (2<y<3) is about 3% or less, the conductivity type is not specified and may be n-type, i-type, or p-type.

The above-described experiment shows that in the molybdenum oxide films formed using a mixed composition of MoO$_3$ and MoO$_y$ (2<y<3), the molybdenum oxide in which the proportion of MoO$_y$ (2<y<3) is about 4% or more is an oxide semiconductor material having p-type conductivity.

This example can be implemented in appropriate combination with the structures described in the above embodiments.

Example 2

In this example, experimental results of photoelectric conversion devices of embodiments of the present invention are described.

Electric characteristics of the photoelectric conversion devices in which the molybdenum oxide film, which is described in Embodiment 1, containing MoO$_3$ and MoO$_y$ (2<y<3) having an intermediate composition between molybdenum dioxide and molybdenum trioxide was used as an oxide semiconductor layer were evaluated.

The photoelectric conversion device was formed to have the structure shown in FIG. 19B in Embodiment 5. The molybdenum oxide film was used for the oxide semiconductor layer 410. The photoelectric conversion device that was formed so that the proportion of MoO$_y$ (2<y<3) was about 22% is Cell A, the photoelectric conversion device that was formed so that the proportion of MoO$_y$ (2<y<3) was about 10% is Cell B, and the photoelectric conversion device that was formed so that the proportion of MoO$_y$ (2<y<3) was about 3% is Cell C.

Note that in each of Cells A and B having the structure of the photoelectric conversion device of one embodiment of the present invention, the oxide semiconductor layer 410 was formed using molybdenum oxide formed by evaporation method described in Embodiment 1, and the silicon oxide layer 411 was formed using a mixture of a silicon dioxide film and a silicon film by a reaction caused at the interface between the silicon oxide layer 411 and the silicon substrate 400 when the deposition was performed. In Cell C, the oxide semiconductor layer 410 was formed using molybdenum oxide formed by a sputtering method, and the silicon oxide layer 411 was formed by a reaction caused at the interface between the silicon oxide layer 411 and the silicon substrate 400 when the deposition was performed.

In each of Cells A, B, and C, an n-type single crystal silicon substrate was used as the silicon substrate 400. In each of Cells A and C, the oxide semiconductor layer was formed so as to have a thickness of about 3 nm to 10 nm, and in Cell B, the oxide semiconductor layer was formed to have a thickness of about 47 nm to 50 nm. The silicon oxide layer 311 formed at the interface between the silicon substrate 400 and the oxide semiconductor layer 410 has a thickness of about 4 nm to 7 nm. Further, the cell areas of Cells A, B, and C were each 100 cm$^2$.

Figure 32:
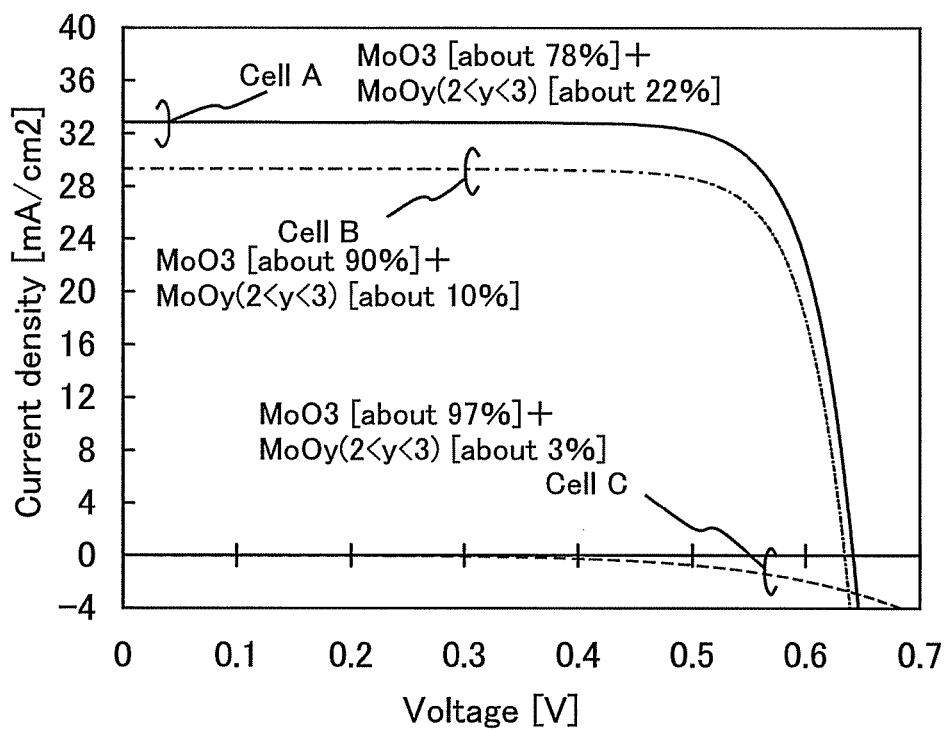
FIG. 32 shows comparison of the I-V characteristics among Cell A, Cell B, and Cell C.

FIG. 32 shows I-V characteristics of the manufactured Cells A, B, and C. Simulated solar radiation (a solar spectrum was AM 1.5 G, and irradiation intensity was 100 mW/cm$^2$) generated by a solar simulator was used for the measurement under an environment temperature of 25° C. Short-circuit current densities (Jsc) of Cells A, B, and C are 32.8 mA/cm$^2$, 29.4 mA/cm$^2$, and 0.01 mA/cm$^2$, respectively. Open-circuit voltages (Voc) of Cells A, B, and C are 0.642 V, 0.635 V, and 0.028 V, respectively. That is, Cells A and B show high electric characteristics; specifically, Cell A shows the highest electric characteristics.

From the above results, each of Cells A and B is an oxide semiconductor layer having preferable p-type conductivity. Further, in Cells A and B, holes that are p-type conductive carriers can be transferred into the oxide semiconductor layer; thus, holes excited by photo-absorption can be collected at the electrode on the oxide semiconductor layer side. Therefore, in Cells A and B each having the structure of the photoelectric conversion device of one embodiment of the present invention, a high short-circuit current density (Jsc) can be obtained.

This example can be implemented in appropriate combination with the structures described in the above embodiments.

This application is based on Japanese Patent Application serial No. 2012-032659 filed with the Japan Patent Office on Feb. 17, 2012, Japanese Patent Application serial No. 2012-032644 filed with the Japan Patent Office on Feb. 17, 2012, and Japanese Patent Application serial No. 2012-092002 filed with the Japan Patent Office on Apr. 13, 2012, the entire contents of which are hereby incorporated by reference.

What is claimed is:

1. A semiconductor material comprising:
   molybdenum trioxide; and
   molybdenum oxide ($MoO_y$ ($2<y<3$)) having an intermediate composition between molybdenum dioxide and molybdenum trioxide,
   wherein the semiconductor material has p-type conductivity.

2. The semiconductor material according to claim 1, wherein the proportion of the molybdenum oxide having an intermediate composition between molybdenum dioxide and molybdenum trioxide is 4% or more.

3. A semiconductor device comprising:
   a silicon substrate;
   an oxide semiconductor layer over one surface of the silicon substrate;
   a first electrode over the oxide semiconductor layer;
   an impurity region on the other surface of the silicon substrate; and
   a second electrode on the impurity region,
   wherein the oxide semiconductor layer comprises molybdenum oxide ($MoO_y$ ($2<y<3$)) having an intermediate composition between molybdenum dioxide and molybdenum trioxide, and
   wherein the silicon substrate has n-type conductivity and the oxide semiconductor layer has p-type conductivity.

4. The semiconductor device according to claim 3, wherein the proportion of the molybdenum oxide having an intermediate composition between molybdenum dioxide and molybdenum trioxide is 4% or more.

5. The semiconductor device according to claim 3, further comprising a light-transmitting conductive film over the oxide semiconductor layer.

6. The semiconductor device according to claim 3, wherein the impurity region has n-type conductivity with a higher carrier concentration than that in the silicon substrate.

7. The semiconductor device according to claim 3, further comprising an insulating layer between the silicon substrate and the second electrode,
   wherein the insulating layer has an opening overlapping with the impurity region, and
   wherein the impurity region is in contact with the second electrode through the opening.

8. The semiconductor device according to claim 3, wherein the silicon substrate has a texture structure provided with unevenness.

9. The semiconductor device according to claim 3, wherein the second electrode comprises a material having a lower work function than that in the silicon substrate.

10. The semiconductor device according to claim 9, wherein the second electrode comprises the material having a work function of 4.2 eV or lower.

11. The semiconductor device according to claim 9, wherein the second electrode comprises at least one of materials selected from Mg, MgO, MgAg, MgIn, AlLi, BaO, SrO, CaO, GdB, $YB_6$, $LaB_6$, Y, Hf, Nd, La, Ce, Sm, Ca and Gd.

12. A semiconductor device comprising:
    a silicon substrate;
    a first silicon semiconductor layer over one surface of the silicon substrate;
    an oxide semiconductor layer over the first silicon semiconductor layer;
    a first electrode over the oxide semiconductor layer;
    a second silicon semiconductor layer on the other surface of the silicon substrate;
    a third silicon semiconductor layer on the other surface of the silicon substrate, with the second silicon semiconductor layer therebetween; and
    a second electrode on the third silicon semiconductor layer,
    wherein the oxide semiconductor layer comprises molybdenum oxide ($MoO_y$ ($2<y<3$)) having an intermediate composition between molybdenum dioxide and molybdenum trioxide, and
    wherein the silicon substrate has n-type conductivity and the oxide semiconductor layer has p-type conductivity.

13. The semiconductor device according to claim 12, wherein the proportion of the molybdenum oxide having an intermediate composition between molybdenum dioxide and molybdenum trioxide is 4% or more.

14. The semiconductor device according to claim 12, further comprising a light-transmitting conductive film over the oxide semiconductor layer.

15. The semiconductor device according to claim 12, wherein the silicon substrate has a texture structure provided with unevenness.

16. The semiconductor device according to claim 12, wherein the second electrode comprises a material having a lower work function than that in the silicon substrate.

* * * * *